(12) United States Patent
Choi

(10) Patent No.: US 11,637,122 B2
(45) Date of Patent: *Apr. 25, 2023

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/925,712

(22) Filed: Jul. 10, 2020

(65) Prior Publication Data

US 2020/0343261 A1 Oct. 29, 2020

Related U.S. Application Data

(63) Continuation-in-part of application No. 16/220,564, filed on Dec. 14, 2018, now Pat. No. 10,770,475.

(30) Foreign Application Priority Data

May 10, 2018 (KR) ........................ 10-2018-0053866

(51) Int. Cl.
*H01L 27/115* (2017.01)
*H01L 27/11582* (2017.01)
*H01L 27/11565* (2017.01)
*H01L 27/1157* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ......... H01L 27/11582; H01L 27/11556; H01L 27/115
See application file for complete search history.

(56) References Cited

U.S. PATENT DOCUMENTS

| 10,770,475 B2* | 9/2020 | Choi ................ H01L 27/11565 |
| 2011/0205796 A1* | 8/2011 | Kim .................... G11C 29/846 365/185.09 |
| 2014/0042519 A1 | 2/2014 | Lee |
| 2015/0129954 A1 | 5/2015 | Kim et al. |

(Continued)

FOREIGN PATENT DOCUMENTS

| CN | 1591880 A | 3/2005 |
| CN | 103594473 A | 2/2014 |

(Continued)

*Primary Examiner* — Michele Fan
(74) *Attorney, Agent, or Firm* — William Park & Associates Ltd.

(57) ABSTRACT

A semiconductor device includes a first gate stack structure and a second gate stack structure, which face each other; channel patterns extending in a first direction to penetrate the first gate stack structure and the second gate stack structure; memory patterns extending along outer walls of the channel patterns; and a source contact structure disposed between the first gate stack structure and the second gate stack structure, wherein the source contact structure includes a vertical part extending in the first direction and horizontal protrusion parts protruding toward a sidewall of the first gate stack structure and a sidewall of the second gate stack structure from both sides of the vertical part.

4 Claims, 49 Drawing Sheets

(56) References Cited

U.S. PATENT DOCUMENTS

| | | |
|---|---|---|
| 2015/0221666 A1 | 8/2015 | Lee |
| 2016/0329340 A1 | 11/2016 | Hwang et al. |
| 2017/0047340 A1* | 2/2017 | Huo .................... H01L 29/1037 |
| 2017/0062462 A1* | 3/2017 | Lee .................. H01L 27/11556 |
| 2017/0250193 A1 | 8/2017 | Huo |
| 2017/0309635 A1 | 10/2017 | Kim et al. |
| 2018/0358376 A1* | 12/2018 | Hwang ............. H01L 27/11573 |
| 2019/0164990 A1* | 5/2019 | Kanamori ............... H01L 29/36 |
| 2019/0371807 A1 | 12/2019 | Nishikawa et al. |

FOREIGN PATENT DOCUMENTS

| | | |
|---|---|---|
| CN | 107305895 A | 10/2017 |
| KR | 1020170036878 A | 4/2017 |
| KR | 1020180098922 A | 9/2018 |
| KR | 1020190115754 A | 10/2019 |

* cited by examiner

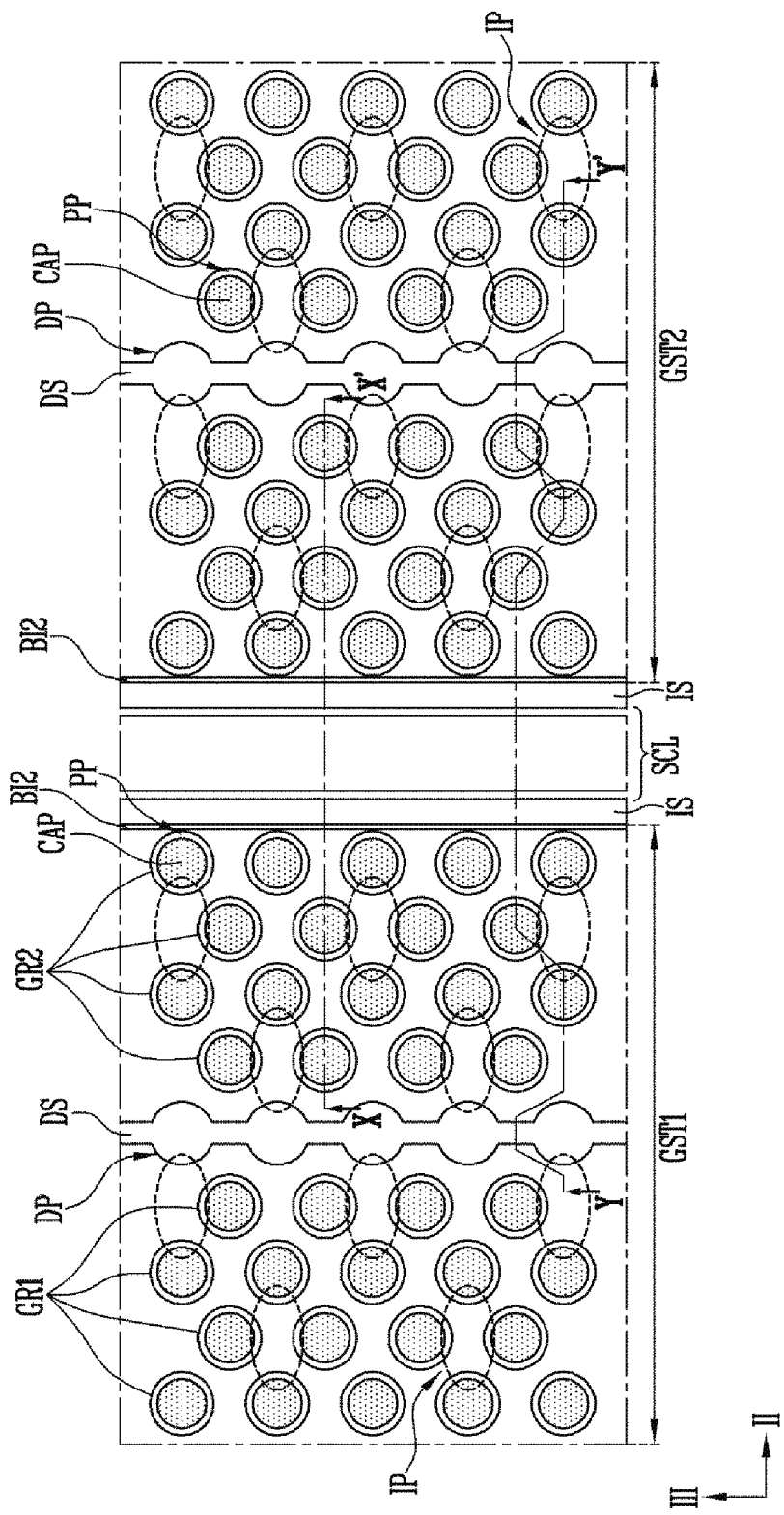

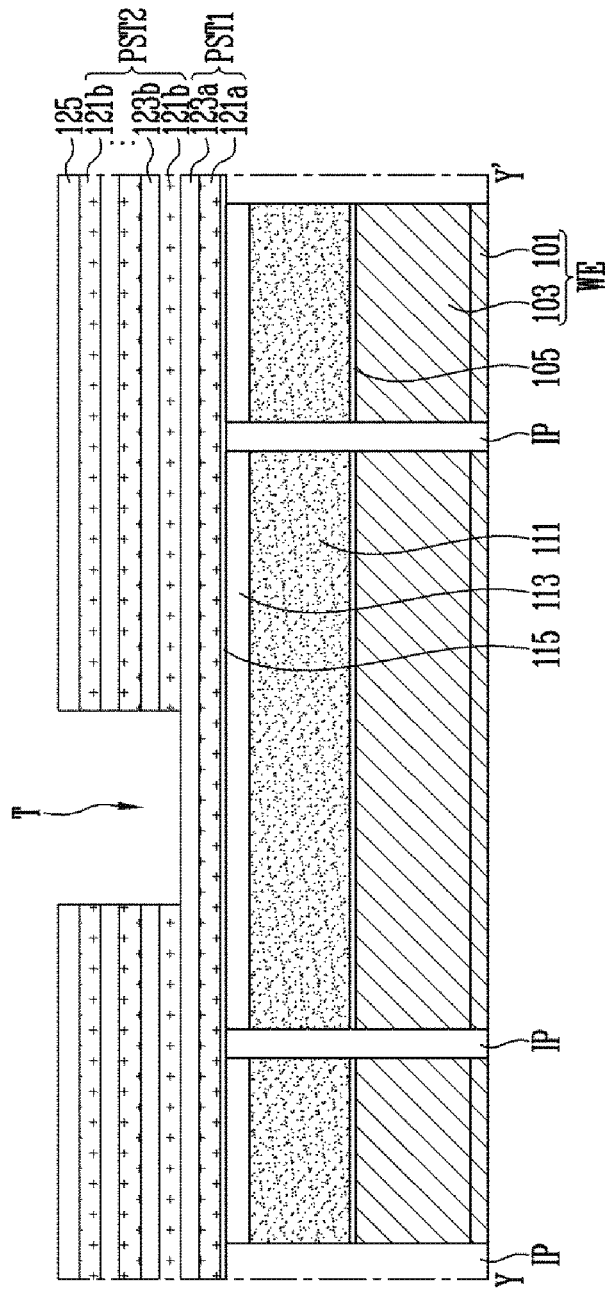

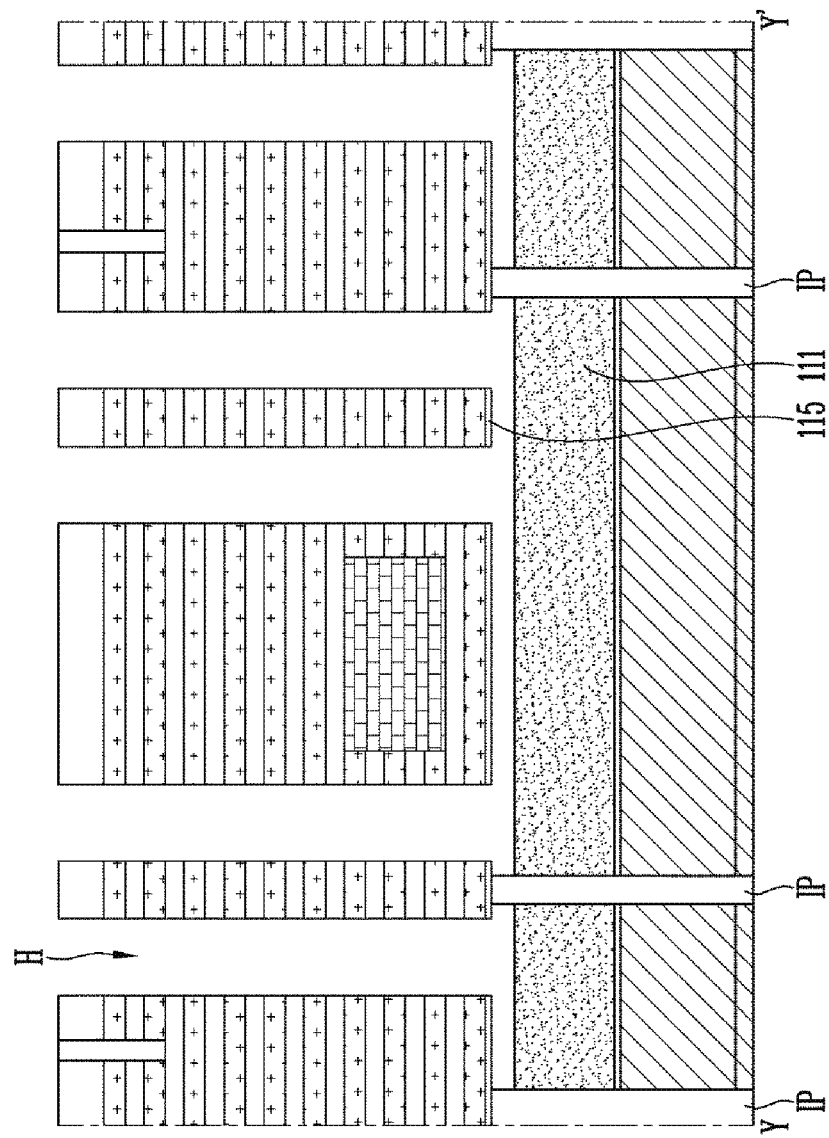

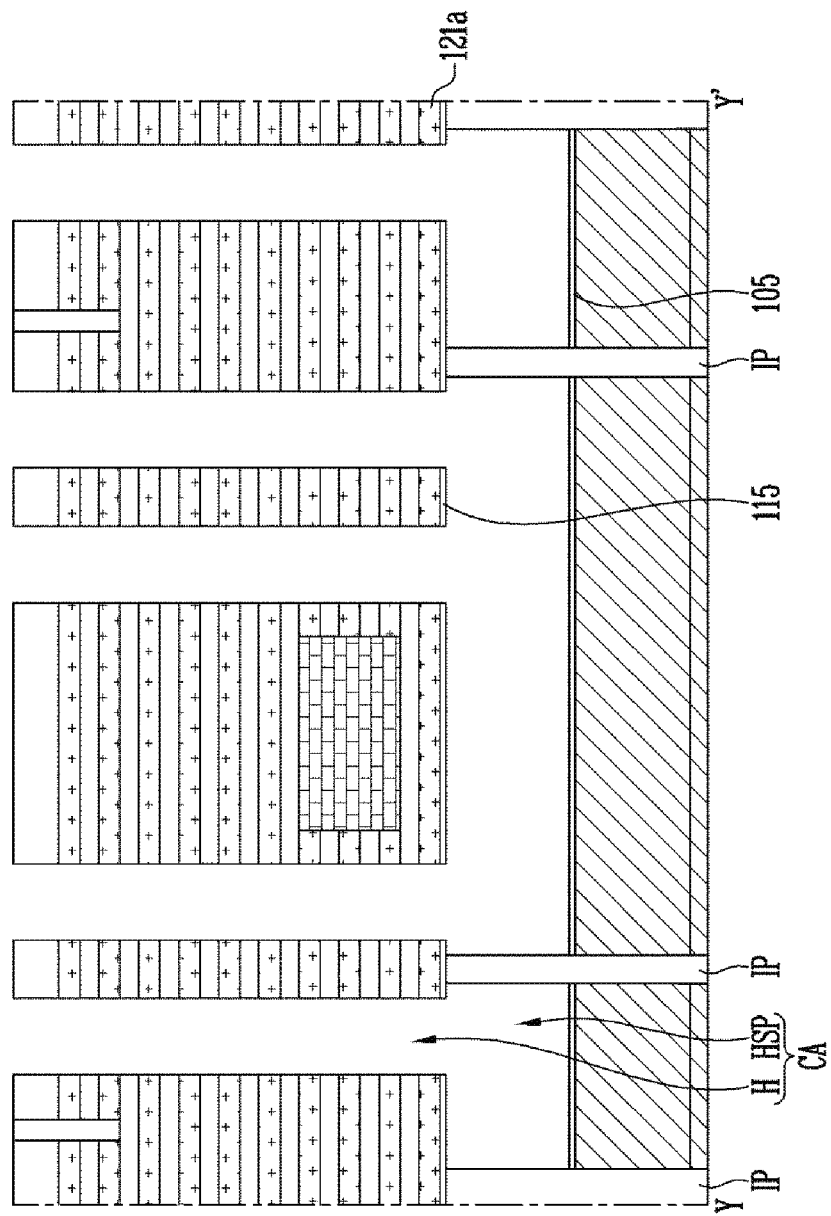

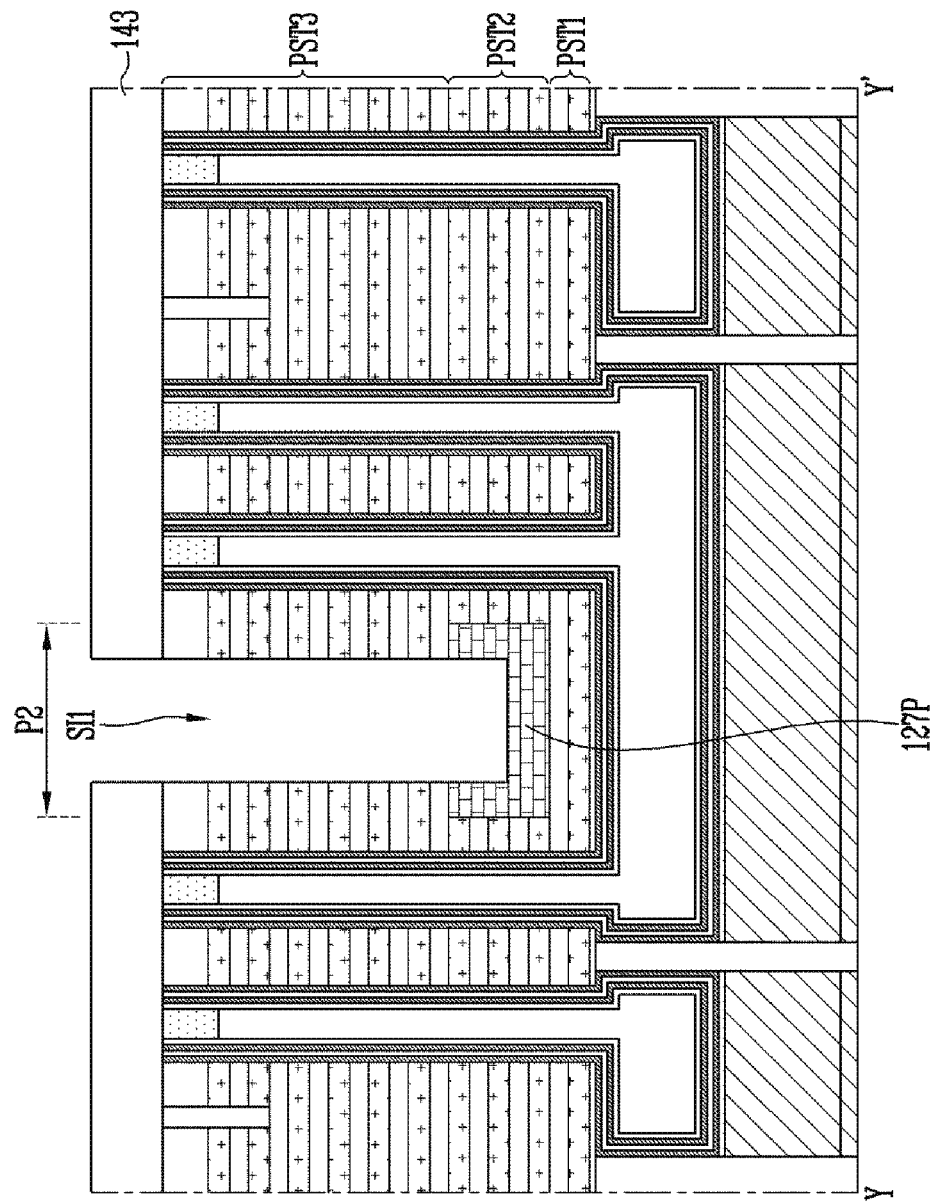

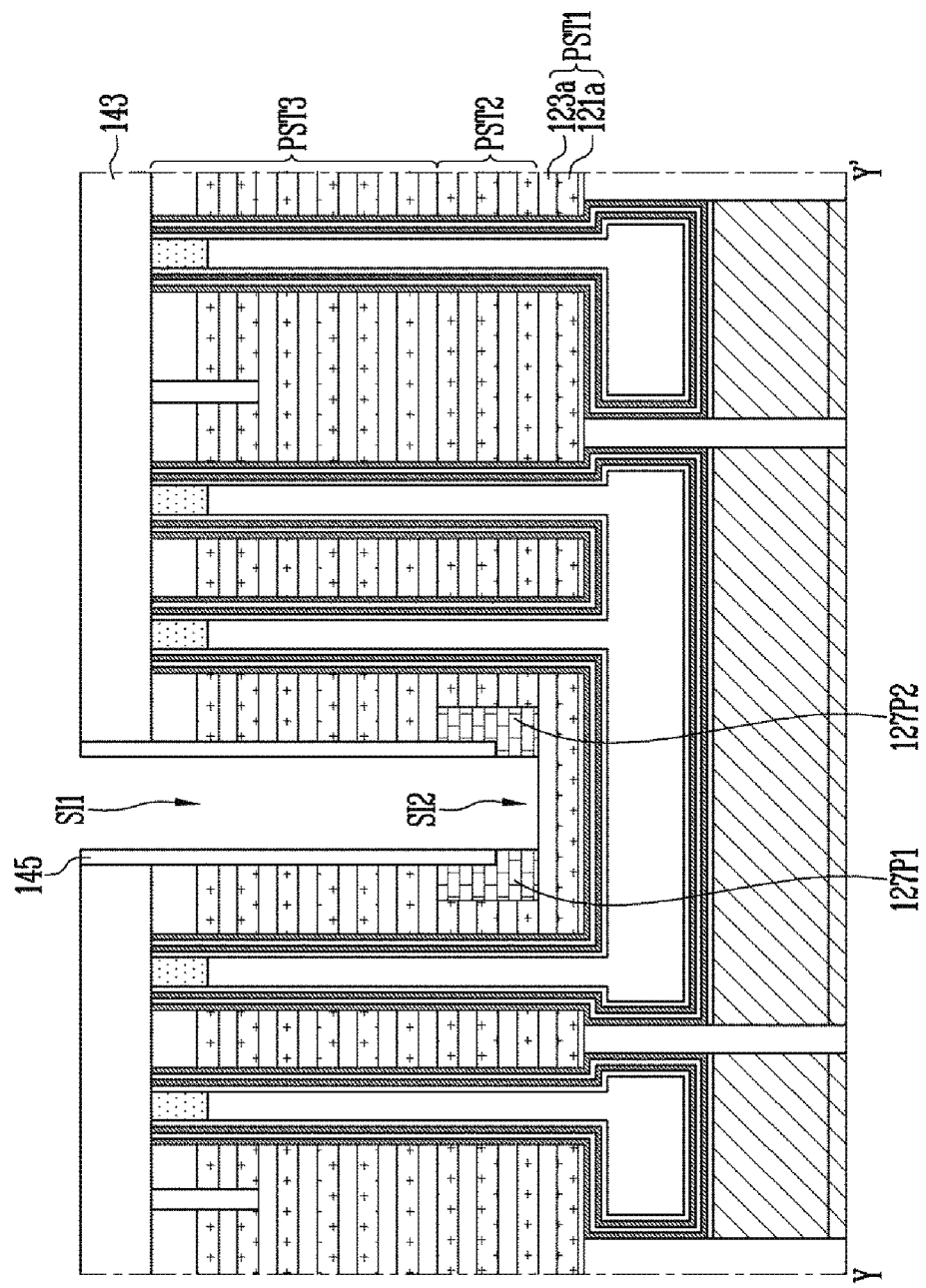

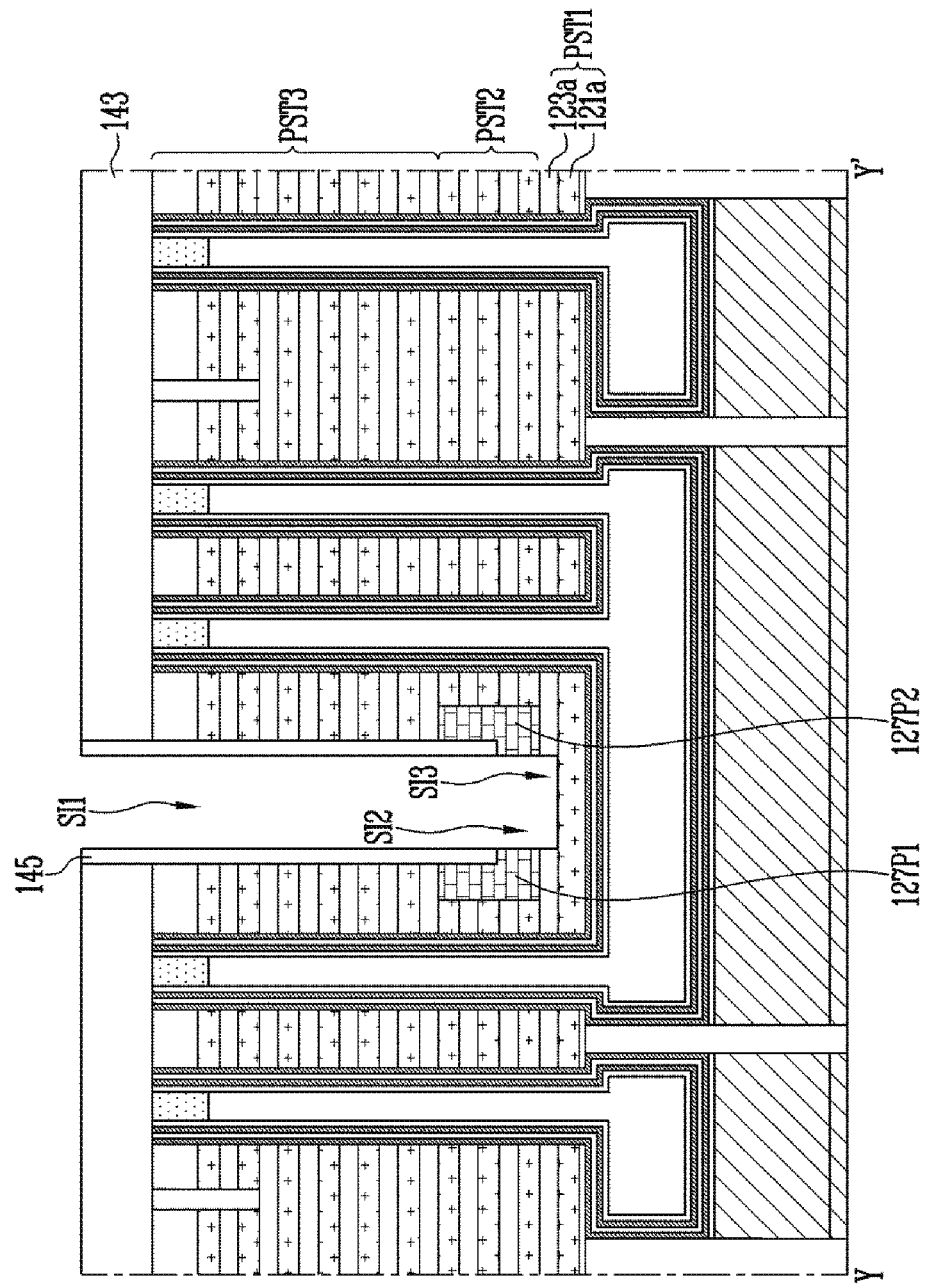

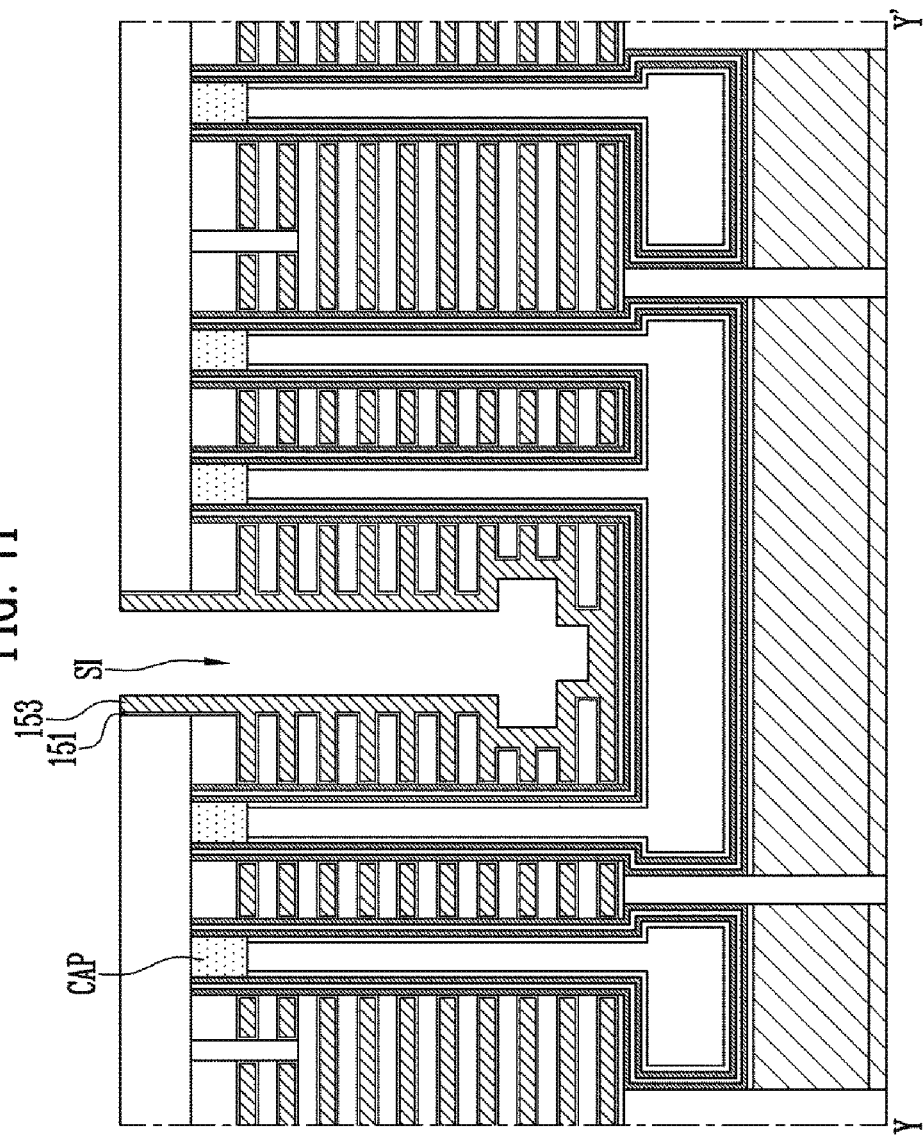

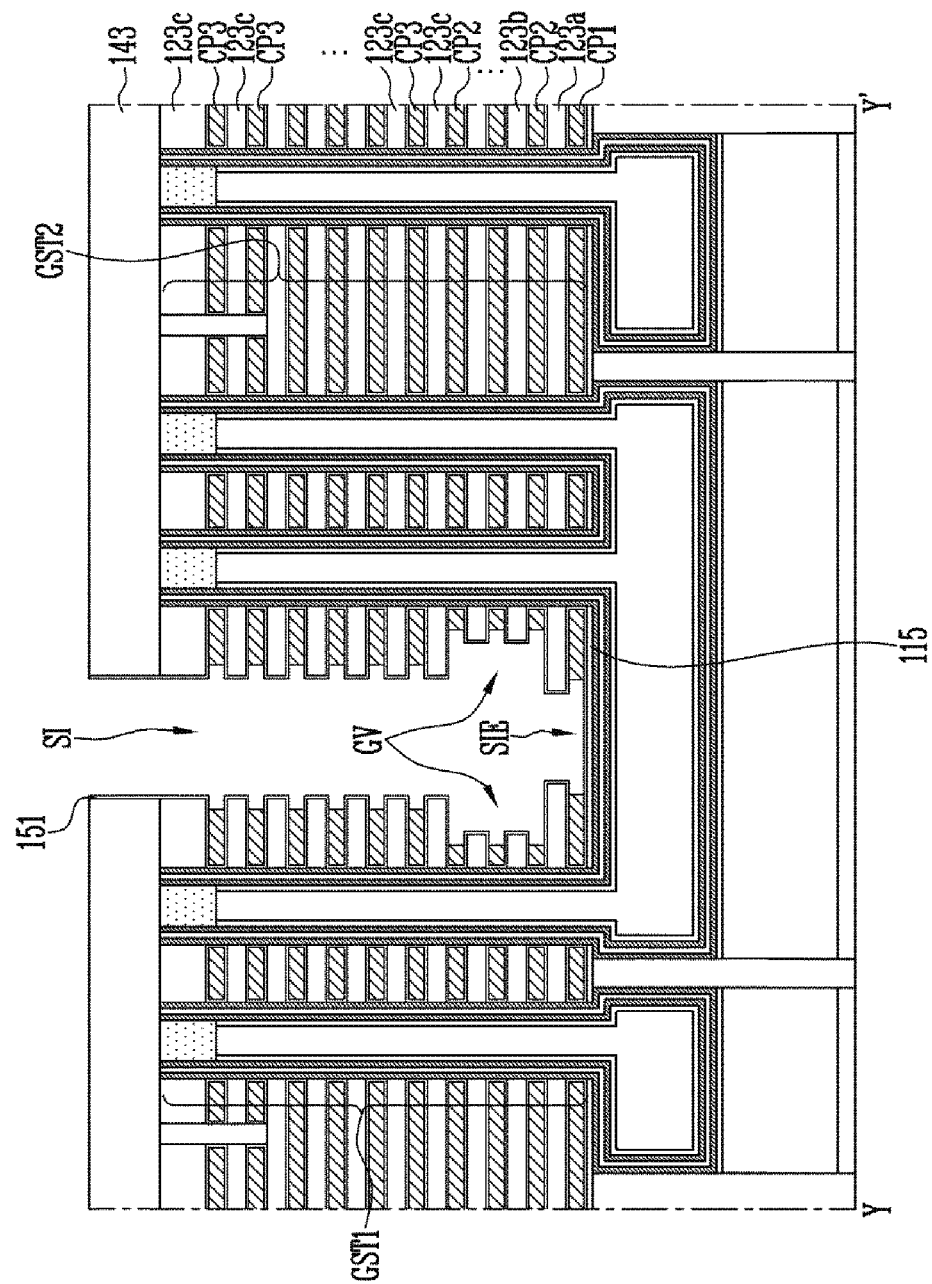

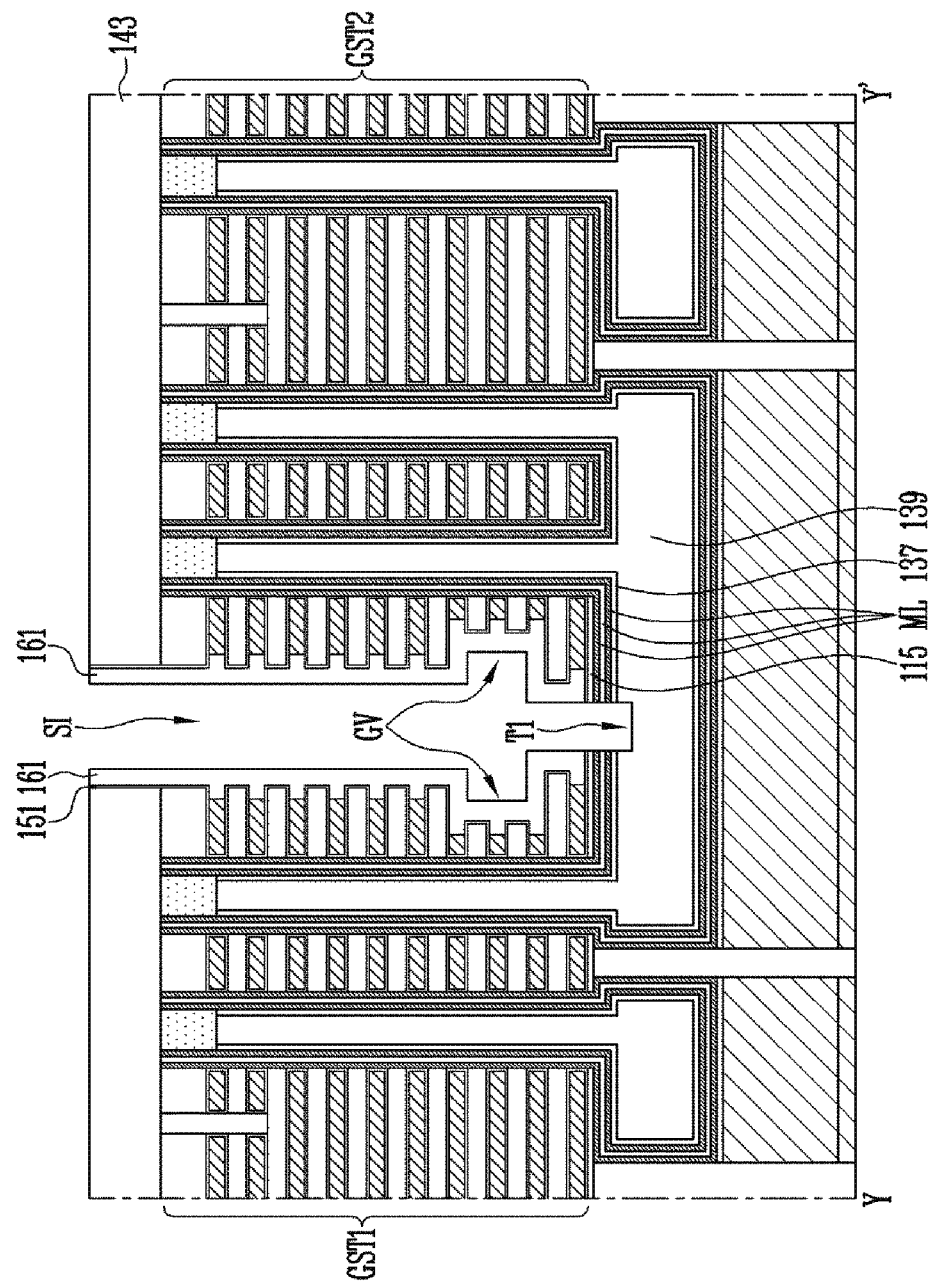

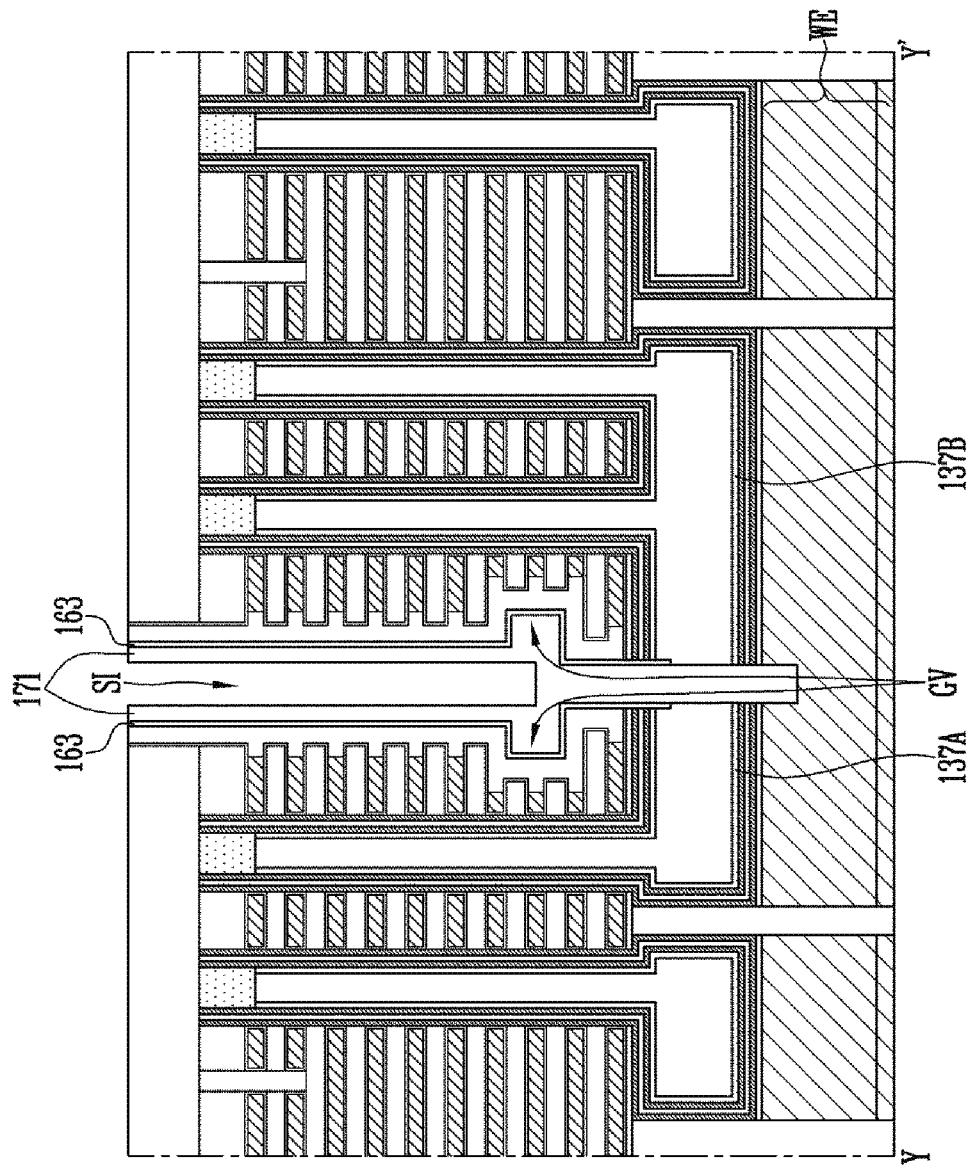

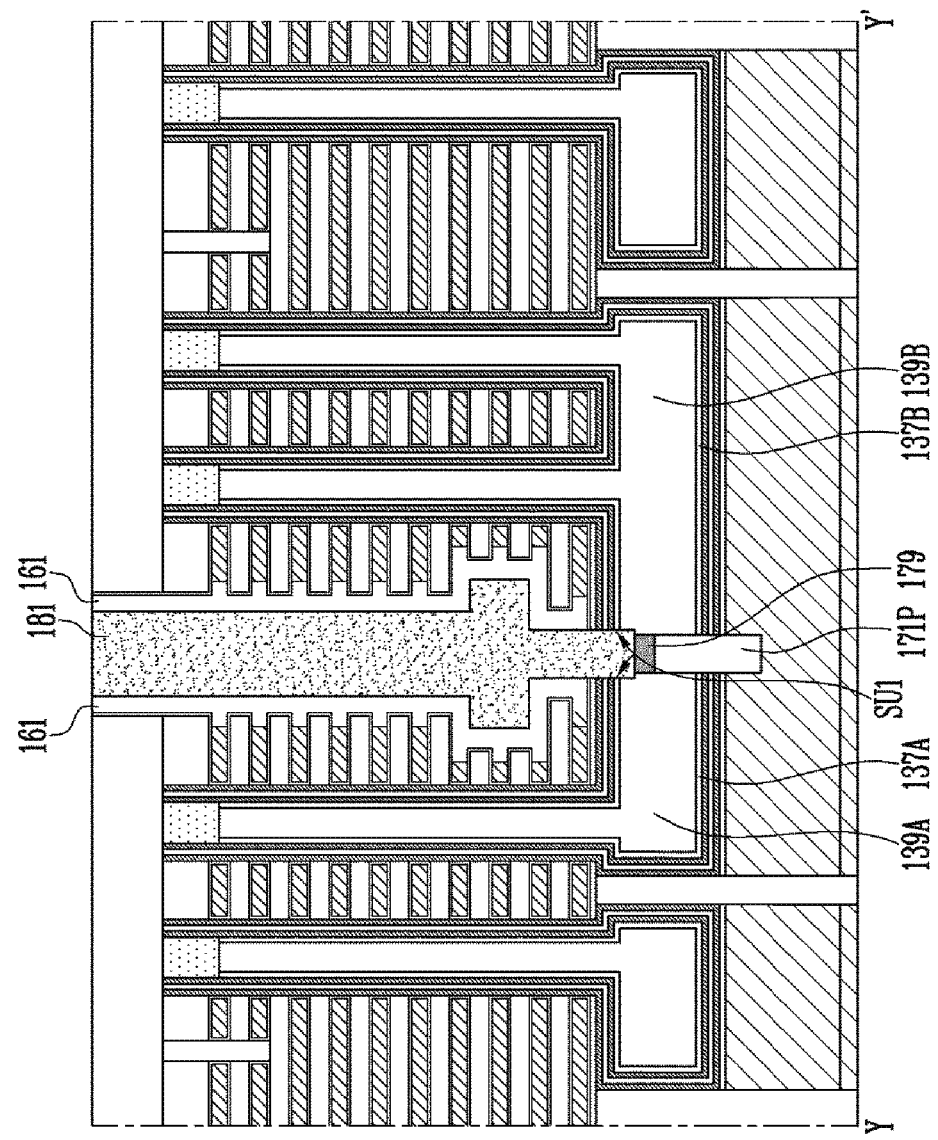

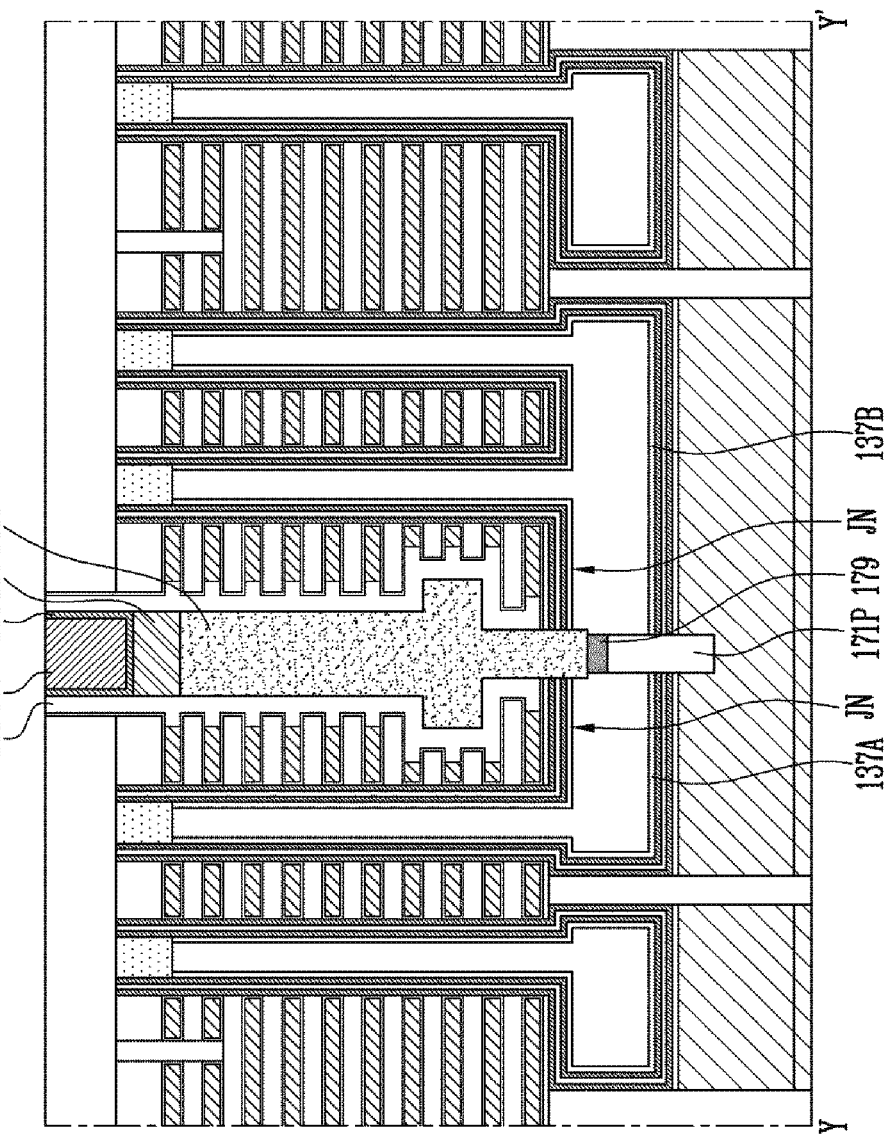

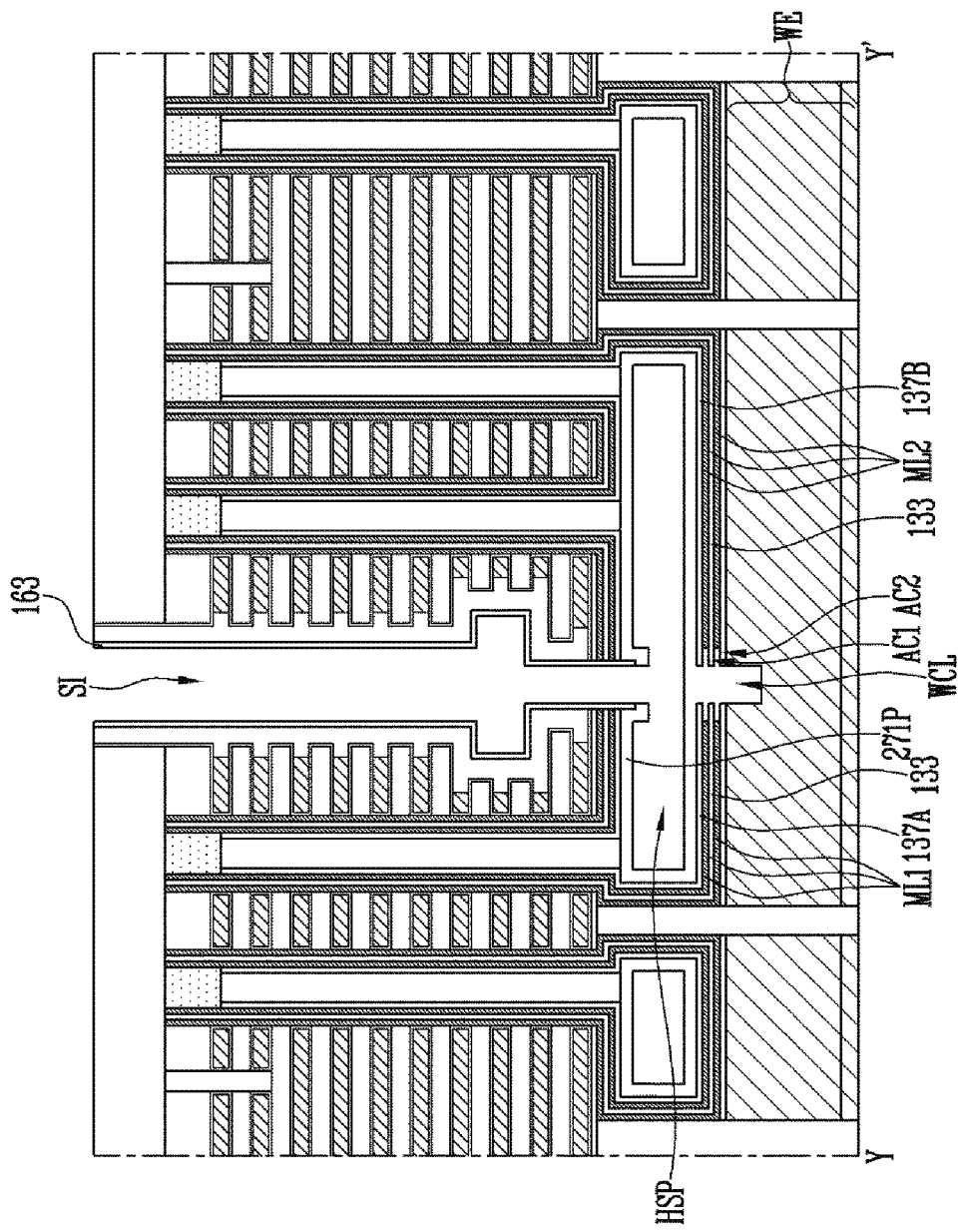

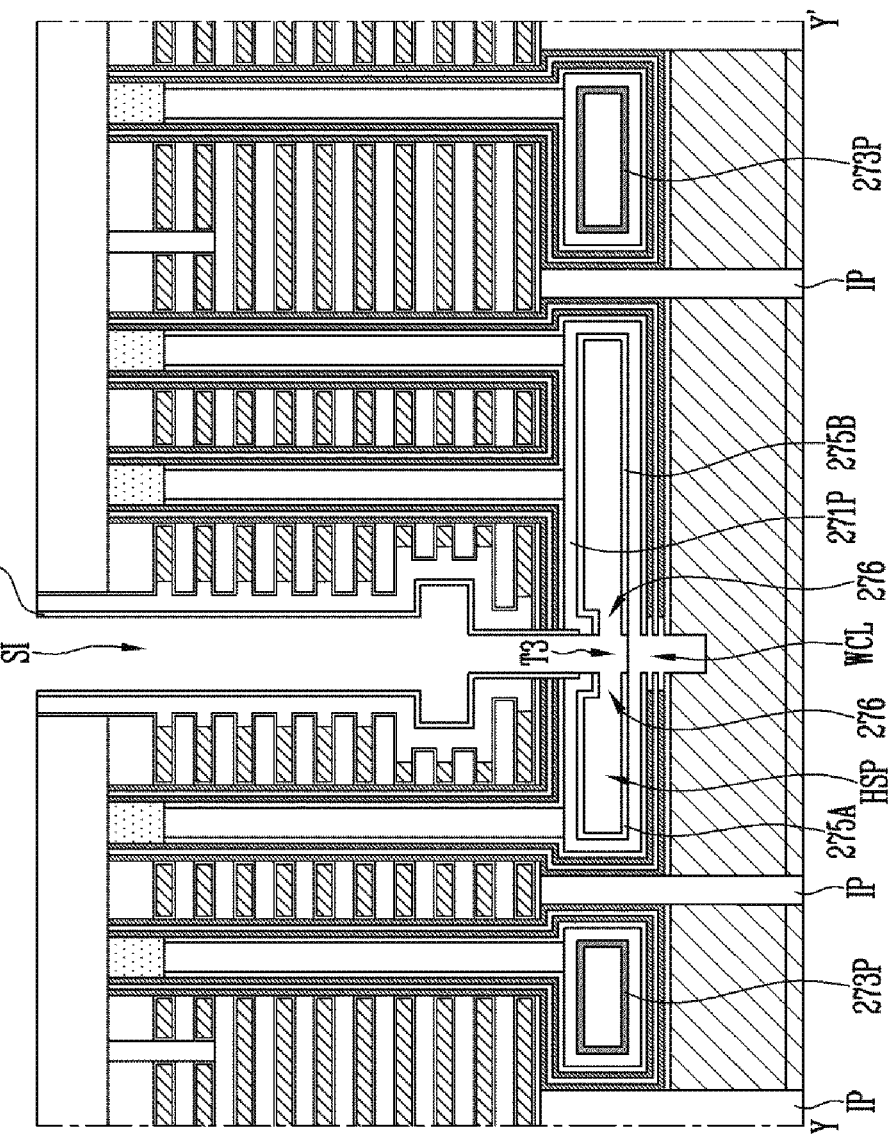

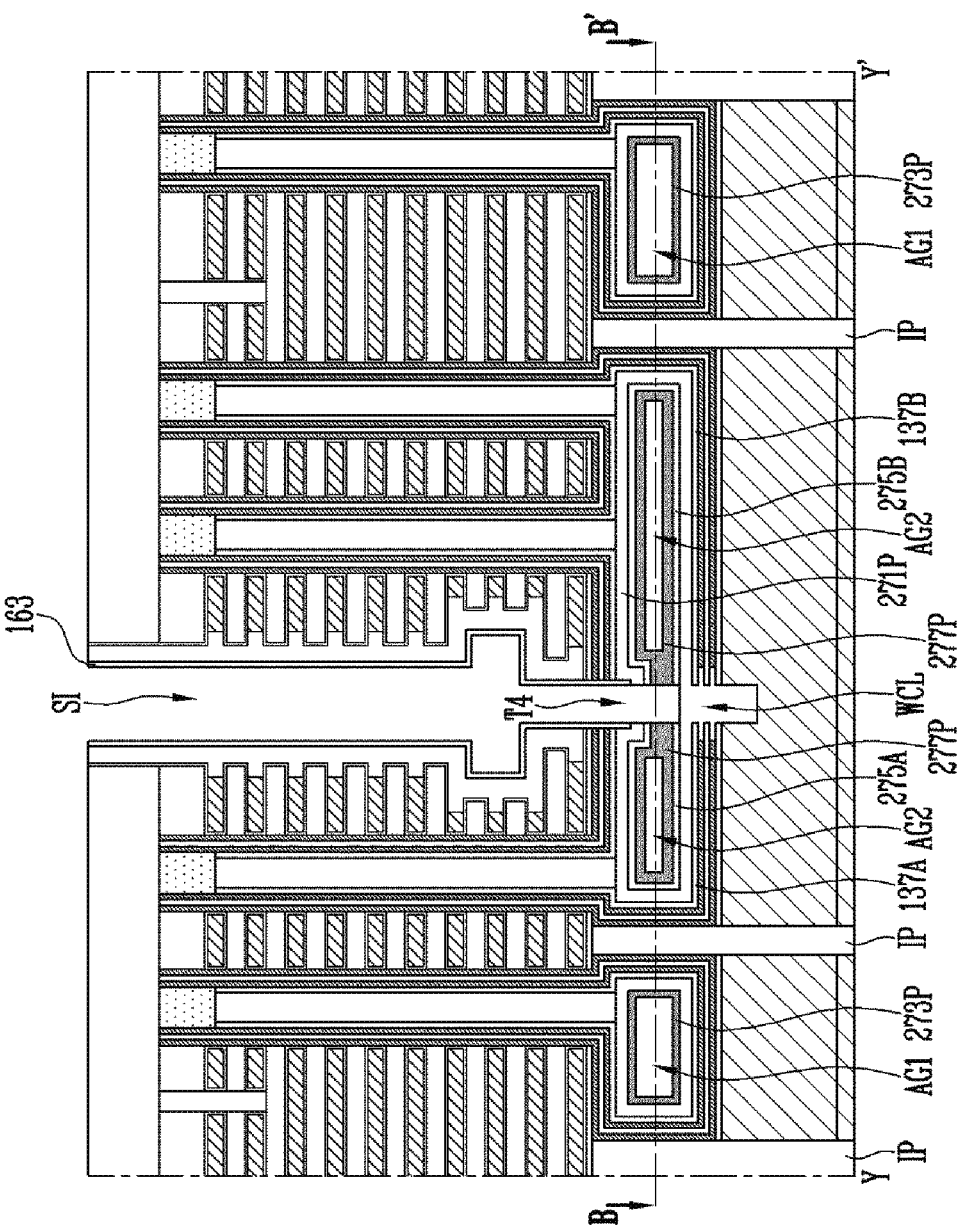

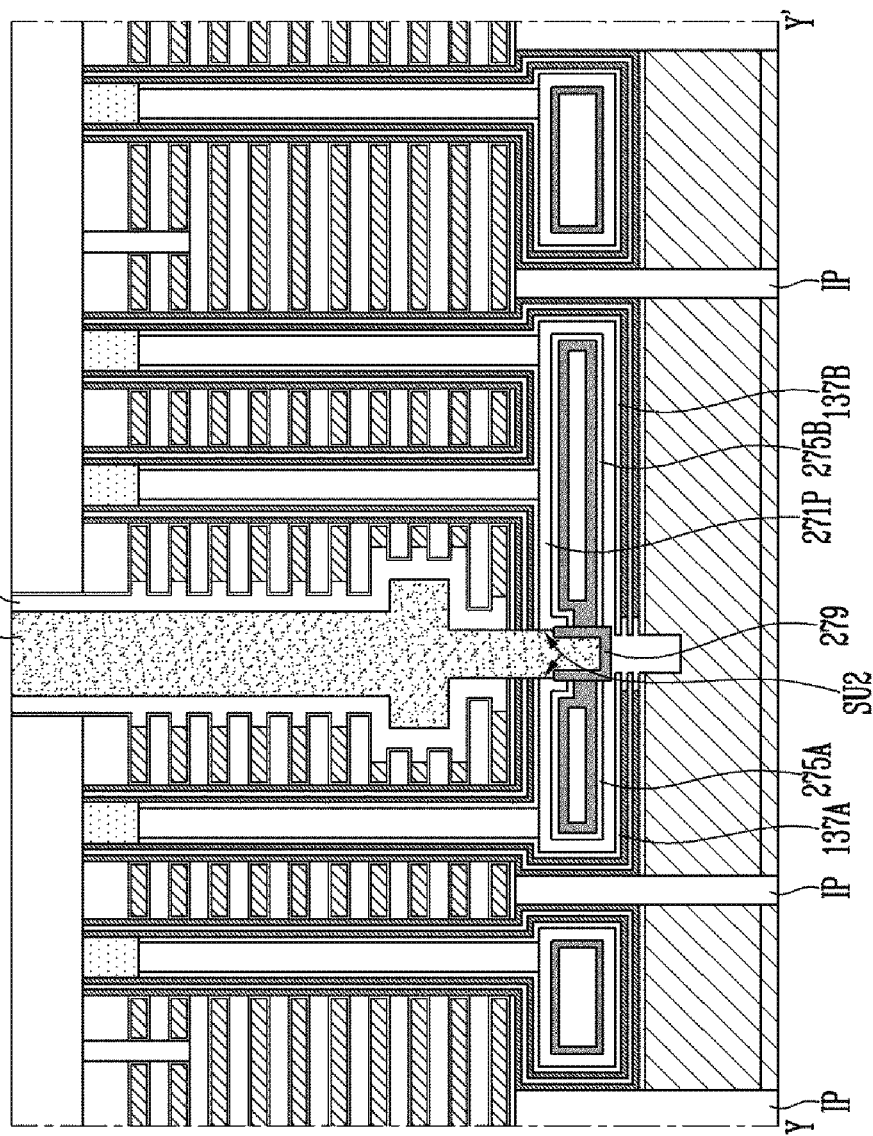

SEMICONDUCTOR DEVICE AND MANUFACTURING METHOD OF SEMICONDUCTOR DEVICE

CROSS-REFERENCE TO RELATED APPLICATION

This application is a continuation-in-part application of the prior application Ser. No. 16/220,564, filed on Dec. 14, 2018 which claims priority under 35 U.S.C. § 119(a) to Korean patent application number 10-2018-0053866 filed on May 10, 2018 in the Korean Intellectual Property Office, the entire disclosure of which is incorporated herein by reference.

BACKGROUND

1. Technical Field

The present disclosure may generally relate to a semiconductor device and a manufacturing method of a semiconductor device, and more particularly, to a three-dimensional semiconductor device and a manufacturing method of a three-dimensional semiconductor device.

2. Related Art

A semiconductor device includes a plurality of memory cells capable of storing data. For improving the degree of integration for the semiconductor device, various techniques for reducing the area occupied by the memory cells have been developed. In order to reduce the area occupied by memory cells, each of the memory cells may be finely patterned. However, there is a limitation to how finely the memory cells can be patterned. In order to overcome this limitation, various techniques for three-dimensionally arranging memory cells in a limited area have been developed.

SUMMARY

In accordance with an embodiment, a semiconductor device includes a first gate stack structure and a second gate stack structure, which face each other; channel patterns extending in a first direction to penetrate the first gate stack structure and the second gate stack structure; memory patterns extending along outer walls of the channel patterns; and a source contact structure disposed between the first gate stack structure and the second gate stack structure, wherein the source contact structure includes a vertical part extending in the first direction and horizontal protrusion parts protruding toward a sidewall of the first gate stack structure and a sidewall of the second gate stack structure from both sides of the vertical part.

In accordance with an embodiment, a semiconductor device includes a doped structure; a gate stack structure comprising a first stack structure, a second stack structure, and a third stack structure, which are continuously stacked in a first direction over the doped structure, the gate stack structure comprising a groove formed in a sidewall of the gate stack structure, wherein the groove is defined between the first stack structure and the third stack structure, and wherein the first stack structure and the third stack structure protrude farther than the second stack structure in a second direction perpendicular to the first direction; a channel pattern penetrating the gate stack structure; and a memory pattern extending along an outer wall of the channel pattern.

In accordance with an embodiment, a semiconductor device includes a source structure including a dopant; a gate stack structure comprising a first stack structure, a second stack structure, and a third stack structure, which are continuously stacked in a first direction over the source structure, the gate stack structure comprising a groove formed in a sidewall of the gate stack structure, wherein the groove is defined between the first stack structure and the third stack structure, and wherein the first stack structure and the third stack structure protrude farther than the second stack structure in a second direction perpendicular to the first direction; a channel pattern penetrating the gate stack structure, the channel pattern extending into the source structure; a first memory pattern between the channel pattern and the gate stack structure; and a second memory pattern between the channel pattern and the source structure, wherein the source structure is in contact with a sidewall of the channel pattern between the first memory pattern and the second memory pattern.

BRIEF DESCRIPTION OF THE DRAWINGS

Example embodiments are described herein with reference to the accompanying drawings. The drawings represent a limited number of possible embodiments. Therefore, the provided drawings and descriptions should not be construed as precluding other possible embodiments consistent with the presented claims. Presented embodiments are described to convey the present teachings to those of skill in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout the drawings.

FIG. 3 shows a plan view illustrating a layout of the semiconductor device according to the first embodiment of the present disclosure.

FIGS. 5A to 5D, 6A to 6D, 7A to 7G, 8A to 8E, 9A, and 9B show sectional views illustrating a manufacturing method of the semiconductor device according to the first embodiment of the present disclosure.

FIGS. 10A, 10B, 11A, 11B, 12A, 12B, 13A, 13B, 14A, 14B, and 15A to 15C show views illustrating a manufacturing method of a semiconductor device according to a second embodiment of the present disclosure.

DETAILED DESCRIPTION

Figure 1:
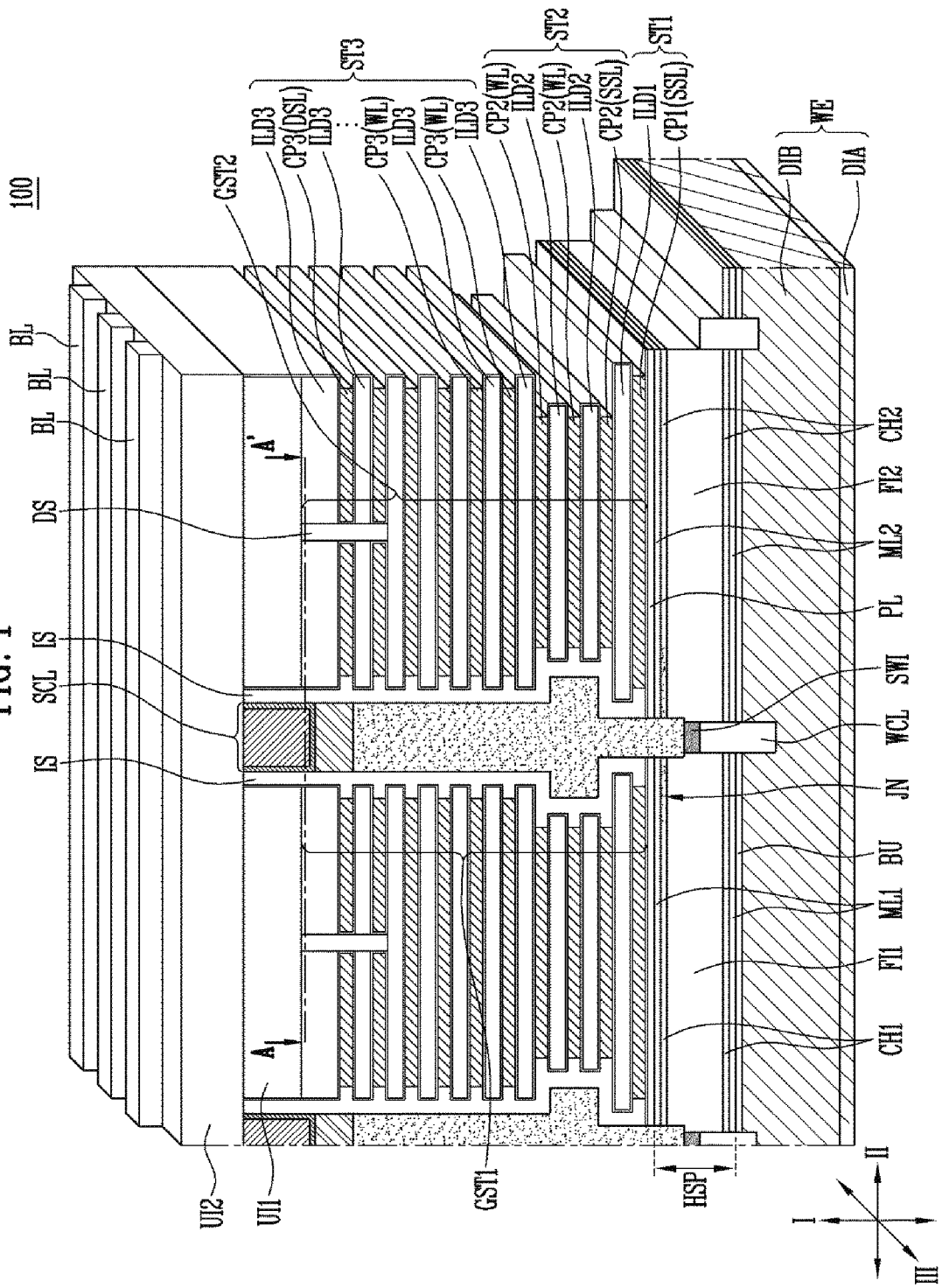
FIG. 1 shows a perspective view illustrating a semiconductor device according to a first embodiment of the present disclosure.

The technical spirit of the present disclosure may be changed in various ways and may be implemented by different embodiments having various aspects. The present disclosure is described by a limited number of possible embodiments so that those of skill in the art can understand and practice the present teachings.

Although the terms "first" and/or "second" are used herein to describe various elements, these elements should not be limited by these terms. The terms are only used to distinguish one element from another element, the terms are not meant to imply a quantity or order of elements. For instance, a first element and a second element can be referred to as the second element and the first element, respectively, without departing from the teachings of the present disclosure.

When one element is referred to as being "coupled" or "connected" to another element, the one element can be directly coupled or connected to the other element or intervening elements may be present between the "coupled" or "connected" elements. In contrast, when an element is referred to as being "directly coupled" or "directly connected" to another element, there are no intervening elements present between the "directly coupled" or "directly connected" elements. Other expressions that explain a relationship between elements, such as "between," "directly between," "adjacent to," or "directly adjacent to," should be construed in a similar way.

Terminology used herein is for the purpose of describing particular embodiments and is not intended to be limiting with respect to those embodiments. In the present disclosure, singular forms are intended to include the plural forms as well, unless the context clearly indicates otherwise. It will be further understood that the terms "comprise," "include," "have," etc., when used in this specification, specify the presence of stated features, numbers, steps, operations, elements, components, and/or combinations thereof but do not preclude the presence or addition of one or more additional features, numbers, steps, operations, elements, components, and/or combinations thereof.

In the drawings, the size and relative sizes of layers and areas may be exaggerated for clarity. The drawings are not drawn to scale. In the description of the present disclosure, a number of obvious configurations in light of this disclosure are omitted from the detailed description but not precluded from the present teachings.

Presented embodiments relate to a semiconductor device and a manufacturing method of the semiconductor device, which can improve the degree of integration for memory cells of the semiconductor device, enhance the operational reliability of the semiconductor device, and aid in the stability of manufacturing processes for the semiconductor device.

FIG. 1 shows a perspective view illustrating a semiconductor device 100 according to a first embodiment of the present disclosure. For convenience of description, not all components are illustrated.

Referring to FIG. 1, the semiconductor device 100 may include a well structure WE including a well dopant, gate stack structures GST1 and GST2 spaced apart from the well structure WE in a first direction I, spacer insulating patterns IS disposed on sidewalls of the gate stack structures GST1 and GST2, a source contact structure SCL formed between adjacent spacer insulating patterns IS, a well contact structure WCL that is aligned under the source contact structure SCL and is connected to the well structure WE, an inter-well-source insulating layer SWI insulating between the well contact structure WCL and the source contact structure SCL, channel patterns CH1 and CH2 electrically connected to the source contact structure SCL and the well structure WE, and memory patterns ML1 and ML2 respectively surrounding outer walls of the channel patterns CH1 and CH2.

The well structure WE may be a doped structure. In an embodiment, the well structure WE may include a doped semiconductor layer including a well dopant. The well dopant may be a p-type dopant. The well dopant may be dispersed at a high concentration when becoming distant from the gate stack structures GST1 and GST2 in the well structure WE. For example, the well structure WE may be formed in a structure in which a first doped semiconductor layer D1A including the well dopant at a first concentration and a second doped semiconductor layer D1B including the well dopant at a second concentration are stacked. The first concentration is higher than the second concentration. Each of the first doped semiconductor layer D1A and the second doped semiconductor layer D1B may be a doped silicon layer. Although not shown in the drawings, a substrate including a driving circuit may be disposed under the well structure WE. The well structure WE may be disposed to overlap with the driving circuit.

The well structure WE may be covered with a buffer layer BU. The buffer layer BU may be formed to prevent the well dopant from diffusing toward the gate stack structures GST1 and GST2 from the well structure WE. The buffer layer BU may include an oxide layer.

The gate stack structures GST1 and GST2 are disposed over the well structure such that the gate stack structures GST1 and GST2 are spaced apart from the well structure WE. A space between the gate stack structures GST1 and GST2 and the well structure WE is defined as a horizontal space HSP. A gap of the horizontal space HSP is maintained by supports IP shown in FIGS. 2A and 3. The supports IP penetrate the well structure WE and protrude farther toward the gate stack structures GST1 and GST2 than the well structure WE. The structure and layout of the supports IP are described in more detail below with reference to FIGS. 2A and 3.

The gate stack structures GST1 and GST2 are disposed over the well structure WE to be spaced apart from each other in a second direction II. The second direction II may be a direction normally intersecting the first direction I. Although a case where two gate stack structures GST1 and GST2 are disposed is illustrated in the drawings, three or more gate stack structures may be spaced apart from each other along the second direction II. Each of the gate stack structures GST1 and GST2 includes a first stack structure ST1, a second stack structure ST2, and a third stack structure ST3, which are continuously stacked along the first direction I.

The first stack structure ST1 may include at least one pair of a first conductive pattern CP1 and a first interlayer insulating layer ILD1, which are alternately stacked in the first direction I. For example, the first stack structure ST1 may include a pair of a first conductive pattern CP1 and a first interlayer insulating layer ILD1. The first conductive pattern CP1 is disposed in the lowermost layer of the first stack structure ST1.

The second stack structure ST2 may include at least one second conductive pattern CP2 and at least one second interlayer insulating layer ILD2. For example, the second stack structure ST2 may include a plurality of second conductive patterns CP2 and a plurality of second interlayer insulating layers ILD2. The second conductive patterns CP2 and the second interlayer insulating layers ILD2 are alternately stacked in the first direction I. The number of stacked second conductive patterns CP2 and second interlayer insulating layers ILD2, which constitute the second stack structure ST2, may vary with embodiment depending on the thickness of an etch stop pattern used in a manufacturing process for the semiconductor device 100.

The third stack structure ST3 may include at least one third conductive pattern CP3 and at least one third interlayer insulating layer ILD3. For example, the third stack structure ST3 may include a plurality of third conductive patterns CP3 and a plurality of third interlayer insulating layers ILD3. The third conductive patterns CP3 and the third interlayer insulating layers ILD3 are alternately stacked in the first direction I. The number of stacked third conductive patterns CP3 and third interlayer insulating layers ILD3, which constitute the third stack structure ST3, may vary with embodiment depending on the stacking number of memory cells and select transistors, which constitute the semiconductor device 100. The uppermost layer among the third interlayer insulating layers ILD3 is disposed in the uppermost layer of the third stack structure ST3. At least the uppermost layer among the third conductive patterns CP3 may be penetrated by a select line separating structure DS.

The first to third conductive patterns CP1 to CP3 may be formed of the same conductive material. The first to third conductive patterns CP1 to CP3 may include at least one of a doped silicon layer, a metal layer, and a metal silicide layer. For example, the first to third conductive patterns CP1 to CP3 may include tungsten having a low resistance.

The first to third conductive patterns CP1 to CP3 are used as gate lines SSL, WL, and DSL. The gate lines SSL, WL, and DSL may include a source select line SSL, word lines WL, and a drain select line DSL. The source select line SSL is connected to a gate electrode of a source select transistor, the word lines WL are connected to gate electrodes of memory cells, and the drain select line DSL is connected to a gate electrode of a drain select transistor.

A first conductive pattern CP1 in the lowermost layer adjacent to the well structure WE among the first and second conductive patterns CP1 and CP2 may be used as the source select line SSL. Alternatively, each of two or more patterns continuously disposed in the upper direction (+I direction) from the lowermost layer adjacent to the well structure WE among the first and second conductive patterns CP1 and CP2 may be used as the source select line SSL. For example, a pattern in the lowermost layer among the second conductive patterns CP2 may be used as the source select line SSL.

A pattern in the uppermost layer disposed most distant from the well structure WE among the third conductive patterns CP3 may be used as the drain select line DSL. Alternatively, each of two or more patterns continuously disposed in the lower direction (−I direction) from the uppermost pattern among the third conductive patterns CP3 may be used as the drain select line DSL. For example, each of the uppermost patterns among the third conductive patterns CP3 and a pattern disposed under the uppermost pattern among the third conductive patterns CP3 may be used as the drain select line DSL.

The other conductive patterns CP2 and CP3 disposed between the drain select line DSL and the source select line SSL are used as word lines WL.

The select line separating structure DS may extend along the first direction I to penetrate the third conductive patterns CP3 used as the drain select lines DSL. The select line separating structure DS is formed of an insulating material. The depth of the select line separating structure DS may be controlled so as not to penetrate the word lines WL and the source select line SSL.

The first to third interlayer insulating layers ILD1 to ILD3 may be formed of an insulating material such as oxide layers.

A bottom surface of each of the gate stack structures GST1 and GST2 may be protected by a protective layer PL. The protective layer PL extends along the bottom surface of each of the gate stack structures GST1 and GST2, and may be formed of an oxide layer.

The gate stack structures GST1 and GST2 may be covered with upper insulating layers UI1 and UI2. The upper insulating layers may include a first upper insulating layer UI1 and a second upper insulating layer UI2 disposed on the first upper insulating layer UI1. Each of the first upper insulating layer UI1 and the second upper insulating layer UI2 may be formed of an insulating material such as an oxide layer.

Figure 2A:
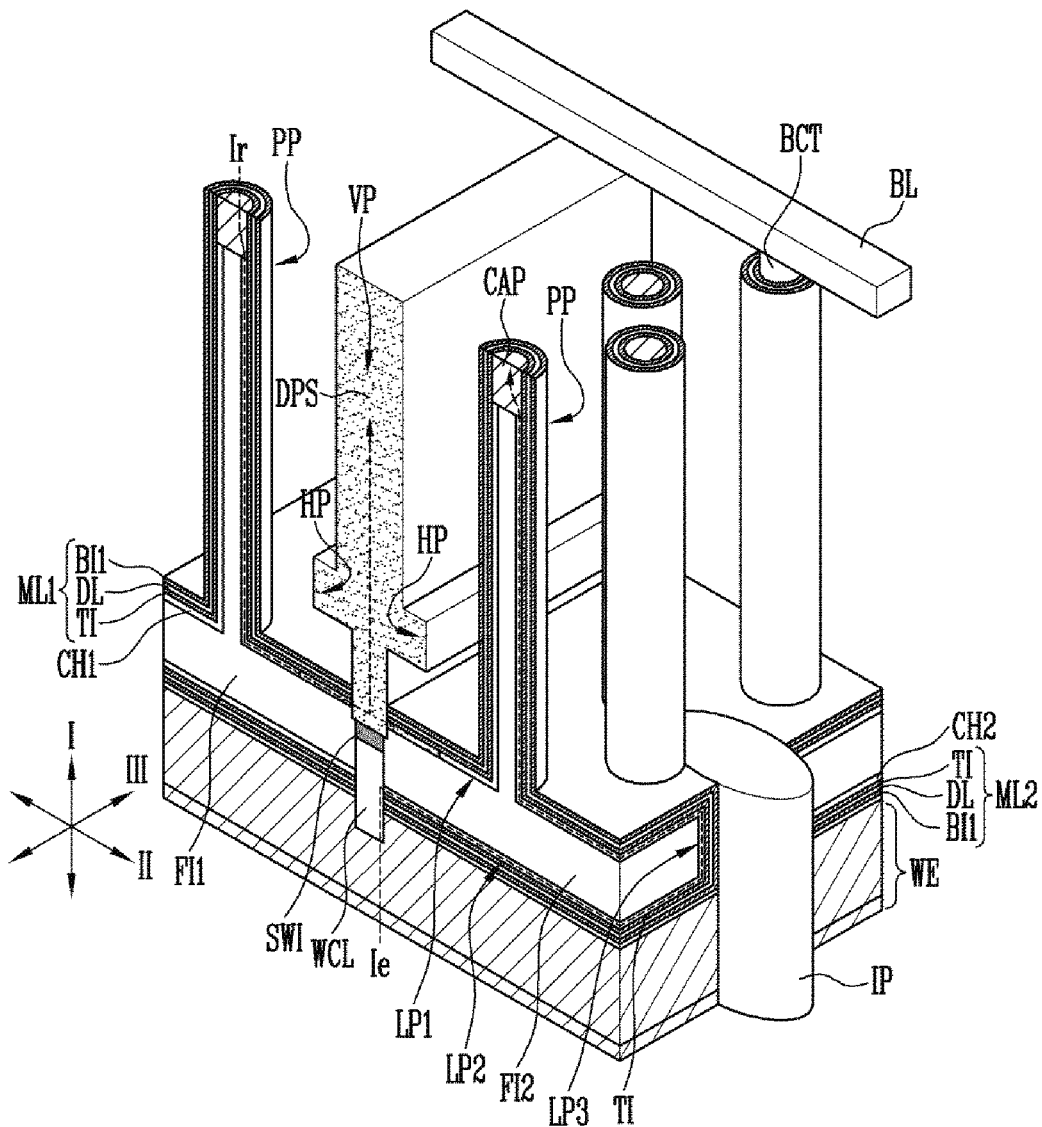
FIG. 2A shows a perspective view illustrating a current flow in a channel pattern.

A plurality of bit lines BL may be disposed on the second upper insulating layer UI2. Each of the bit lines BL for transferring an electrical signal may extend in a horizontal direction vertically intersecting the first direction I. For example, each of the bit lines BL may extend along the second direction II. The layout of the bit lines BL may vary depending on design. As shown in FIG. 2A, each of the bit lines BL is connected to a pillar part PP corresponding thereto. The pillar part PP is surrounded by a gate stack structure corresponding thereto among the gate stack structures GST1 and GST2. The pillar part PP is described in detail below with reference to FIG. 2A. The bit lines BL are electrically insulated from the source contact structure SCL by the second upper insulating layer UI2.

The spacer insulating patterns IS are formed on both sidewalls of each of the gate stack structures GST1 and GST2. The spacer insulating patterns IS insulate between the source contact structure SCL and the gate stack structures GST1 and GST2. The spacer insulating patterns IS may be formed of oxide layers.

The source contact structure SCL is formed between adjacent gate stack structures to fill in a space between spacer insulating patterns IS adjacent to each other. For example, the source contact structure SCL may be disposed between a first gate stack structure GST1 and a second gate stack structure GST1, which are opposite to each other. The source contact structure SCL is formed of a conductive material to transfer an electrical signal. The source contact structure SCL may include a source dopant. The source dopant is a dopant of a conductivity type different from that of the well dopant, and may be, for example, an n-type dopant. The source contact structure SCL may protrude farther toward the well structure WE than the gate stack structures GST1 and GST2. The source contact structure SCL extends between end portions of channel patterns CH1 and CH2 adjacent to each other. The end portions of the channel patterns CH1 and CH2 adjacent to each other are in direct contact with both sidewalls of the source contact structure SCL.

The spacer insulating patterns IS and the source contact structure SCL penetrate the first upper insulating layer UI1, and may extend toward the second upper insulating layer UI2.

The well contact structure WCL is in direct contact with the well structure WE and extends toward the source contact structure SCL. The well contact structure WCL has a sidewall in contact with a portion of each of the channel patterns CH1 and CH2. The well structure WE and the channel patterns CH1 and CH2 are electrically connected by the well contact structure WCL. The well contact structure WCL may be formed of a conductive layer. For example, the well contact structure WCL may be formed of a semiconductor layer such as a silicon layer. The well contact structure WCL may include the well dopant diffused from the well structure WE.

The inter-well-source insulating layer SWI is disposed between the well contact structure WCL and the source contact structure SCL to insulate between the well contact structure WCL and the source contact structure SCL. The inter-well-source insulating layer SWI may be formed of an insulating material such as an oxide layer.

Each of the gate stack structures GST1 and GST2, the select line separating structure DS, the spacer insulating patterns IS, the source contact structure SCL, the inter-well-source insulating layer SWI, and the well contact structure WCL may extend along the horizontal direction. For example, each of the gate stack structures GST1 and GST2, the select line separating structure DS, the spacer insulating patterns IS, the source contact structure SCL, the inter-well-source insulating layer SWI, and the well contact structure WCL may extend in a third direction III intersecting the second direction II. The third direction III may normally intersect the first direction I.

Each of the channel patterns CH1 and CH2 and the memory patterns ML1 and ML2 may include first to third parts LP1 to LP3 as shown in FIG. 2A. The first part LP1 is a part extending along an upper surface of the horizontal space HSP adjacent to the gate stack structure GST1 or GST2 corresponding thereto, and the second part LP2 is a part extending to a lower surface of the horizontal space HSP adjacent to the well structure WE. The horizontal space HSP may be filled with insulating patterns FI1 and FI2. A corresponding insulating pattern FI1 or FI2 is disposed between the first part LP1 and the second part LP2, and the first part LP1 and the second part LP2 are spaced apart from each other by the corresponding insulating pattern FI1 or FI2. The third part LP3 is a part extending along a sidewall of each of the supports IP. The first part LP1 and the second part LP2 may be connected to each other by the third part LP3.

Each of the channel patterns CH1 and CH2, as shown in FIG. 1, may include a junction JN in which the source dopant is dispersed. The junction JN is defined in each of the channel patterns CH1 and CH2 adjacent to the source contact structure SCL.

FIG. 2A shows a perspective view illustrating a current flow in a channel pattern.

Referring to FIG. 2A, the semiconductor device 100 may include supports IP supporting the gate stack structures GST1 and GST2 shown in FIG. 1 to maintain the gap of the horizontal space HSP shown in FIG. 1. Although FIG. 2A illustrates one support IP, a plurality of supports IP may maintain the gap of the horizontal space HSP shown in FIG. 1. An example of the arrangement structure of the plurality of supports is described later with reference to FIG. 3. The supports IP penetrate the well structure WE and may extend in the first direction I to protrude farther in the upper direction than the well structure WE. The gate stack structures GST1 and GST2 shown in FIG. 1 are disposed on the supports IP.

Each of the channel patterns CH1 and CH2 and the memory patterns ML1 and ML2 may include pillar parts PP and first to third parts LP1 to LP3.

The pillar parts PP are parts penetrating the gate stack structures GST1 and GST2 shown in FIG. 1, and extend along the first direction I. An example of the arrangement structure of the pillar parts PP is described later with reference to FIG. 3.

The first part LP1 of each of the channel patterns CH1 and CH2 and the memory patterns ML1 and ML2 is adjacent to one corresponding thereto among the gate stack structures GST1 and GST2 shown in FIG. 1, and extends along the horizontal direction. The second part LP2 of each of the channel patterns CH1 and CH2 and the memory patterns ML1 and ML2 is disposed under the first part LP1, and is disposed adjacent to the well structure WE. A corresponding insulating pattern FI1 or FI2 is disposed between the first part LP1 and the second part LP2, which are opposite to each other. The second part LP2 extends along the horizontal direction. The third part LP3 of each of the channel patterns CH1 and CH2 and the memory patterns ML1 and ML2 extends along a sidewall of the supports IP, which corresponds thereto, and connects the first part LP1 and the second part LP2.

The first part LP1 extends from the pillar parts PP to connect the pillar parts PP to each other. The third part LP3 is disposed between a corresponding insulating pattern FI1 or FI2 and the supports IP, and extends toward the second part LP2 from the first part LP1.

According to the above-described structure, each of the channel patterns CH1 and CH2 is formed as an integrated pattern including the first to third parts LP1 to LP3. Each of the pillar parts PP may be connected to a bit line BL corresponding thereto via a bit line contact plug BCT. Although FIG. 2A illustrates one bit line BL, the semiconductor device 100 may include a plurality of bit lines, and the layout of the bit lines may be variously designed. The bit line contact plug BCT penetrates the upper insulating layers UI1 and UI2 shown in FIG. 1.

Each of the memory patterns ML1 and ML2, which includes a plurality of pillar parts PP and first to third parts LP1 to LP3, may include a tunnel insulating layer TI, a data storage layer DL, and a first blocking insulating layer BI1. Each of the tunnel insulating layer TI, the data storage layer DL, and the first blocking insulating layer BI1 are included in the plurality of pillar parts PP and the first to third parts LP1 to LP3.

The tunnel insulating layer TI surrounds each of the channel patterns CH1 and CH2. The first blocking insulating layer BI1 surrounds each of the channel patterns CH1 and CH2 with the tunnel insulating layer TI interposed therebetween. The data storage layer DL is disposed between the tunnel insulating layer TI and the first blocking insulating layer BI1. The data storage layer DL may store data changed using Fowler-Nordheim tunneling caused by a difference in voltage between the channel patterns CH1 and CH2 and the word line WL shown in FIG. 1. To this end, the data storage layer DL may be formed of various materials. For example, the data storage layer DL may be formed of a nitride layer in which charges can be trapped. In addition, the data storage layer DL may include silicon, a phase change material, nanodots, and the like. The first blocking insulating layer BI1 may include an oxide layer capable of blocking charges. The tunnel insulating layer TI may include a silicon oxide layer.

The insulating patterns FI1 and FI2 penetrate the gate stack structures GST1 and GST2 shown in FIG. 1 and extend to the inside of the horizontal space HSP shown in FIG. 1. A portion of each of the insulating patterns FI1 and FI2 is surrounded by pillar parts PP corresponding thereto. The insulating patterns FI1 and FI2 may be formed with a height lower than that of the pillar parts PP. Capping patterns CAP surrounded by the pillar parts PP may be disposed on the insulating patterns FI1 and FI2. Each of the capping patterns CAP may be used as a drain junction.

Figure 2B:
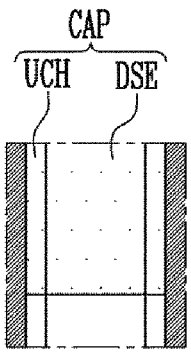
FIG. 2B shows an enlarged sectional view illustrating a capping pattern shown in FIG. 2A.

FIG. 2B shows an enlarged sectional view illustrating the capping pattern shown in FIG. 2A.

The capping pattern CAP may include a doped semiconductor layer DSE. The capping pattern CAP may further include an upper end UCH corresponding to an upper portion of each of the pillar parts PP of the channel patterns CH1 and CH2 shown in FIG. 2A. The doped semiconductor layer DSE is surrounded by the upper end UCH. The upper end UCH and the doped semiconductor layer DSE, which constitute the capping pattern CAP, include a drain dopant. The drain dopant may be a dopant of the same conductivity type as the source dopant, and may be, for example, an n-type dopant. The doped semiconductor layer DSE may be a doped silicon layer doped with an n-type dopant.

Referring back to FIG. 2A, the source contact structure SCL shown in FIG. 1 may include a doped semiconductor pattern DSP in contact with the channel patterns CH1 and CH2. The doped semiconductor pattern DSP may include a vertical part VP extending along the first direction I and horizontal protrusion parts HP protruding from both sides of the vertical part VP. The horizontal protrusion parts HP are parts protruding toward the gate stack structures GST1 and GST2 shown in FIG. 1. The vertical part VP may extend in parallel to the supports IP and may have a surface facing the supports IP. The doped semiconductor pattern DSP may be formed of a semiconductor layer including a source dopant. For example, the doped semiconductor pattern DPS may be formed of a doped silicon layer doped with an n-type dopant.

According to the above-described structure, a first current flow path Ir may be established during a read operation of the semiconductor device 100. The first current flow path Ir is formed in a selected channel pattern (e.g., CH1). In a read operation, the bit line BL may be precharged to a predetermined level. Also, in the read operation, a turn-on voltage may be applied to the drain select line DSL and the source select line SSL, which are shown in FIG. 1. Under this voltage application condition, when a voltage level applied to the word lines WL of the first gate stack structure GST shown in FIG. 1 is higher than threshold voltages of memory cells connected to the word lines WL, a channel may be formed in the selected channel pattern CH1, and a precharge level of the bit line BL may be discharged through a ground (not shown) electrically connected to the doped semiconductor pattern DPS.

A second current flow path Ie may be established during an erase operation of the semiconductor device 100. The second current flow path Ie is formed in a channel pattern (e.g., CH2) connected between the bit line BL and the well structure WE.

The inter-well-source insulating layer SWI disposed between the doped semiconductor pattern DSP and the well contact structure WCL can reduce leakage current between the doped semiconductor pattern DPS and the well contact structure WCL during an operation of the semiconductor device 100.

In the embodiment described above, the well contact structure WCL may extend in parallel to the support IP and may have a surface facing the support IP.

FIG. 3 shows a plan view illustrating a layout of the semiconductor device 100 according to a first embodiment of the present disclosure. More specifically, FIG. 3 illustrates a top-down plan view taken from above a plane defined in the I-II directions by the horizontal line A-A' shown in FIG. 1.

Referring to FIG. 3, each of the pillar parts PP described with reference to FIG. 2A may be formed to surround the capping pattern CAP.

The pillar parts PP penetrating each of the gate stack structures GST1 and GST2 may be divided into a first group GR1 and a second group GR2, which are disposed with the select line separating structure DS interposed therebetween. In order to improve the arrangement density of memory strings, the pillar parts PP of the first group GR1 and the pillar parts PP of the second group GR2 may be arranged in a zigzag pattern, as shown.

The gate stack structures GST1 and GST2 are opposite to each other in the second direction II with the source contact structure SCL interposed therebetween, and may be insulated from the source contact structure SCL by the spacer insulating patterns IS.

The semiconductor device 100 may further include a second blocking insulating layer BI2. The second blocking insulating layer BI2 may extend between each of the gate stack structures GST1 and GST2 and each of the spacer insulating patterns IS.

The supports IP are disposed under the gate stack structures GST1 and GST2. The supports IP may be disposed between the pillar parts PP not to overlap with the pillar parts PP. Alternatively, the supports IP may overlap with portions of the pillar parts PP.

The supports IP may be disposed between the pillar parts PP adjacent to each other. The supports IP may be arranged in a zigzag pattern. The layout of the supports IP is not limited to the example shown in FIG. 3 and may be different for different embodiments.

The number of columns configured with the pillar parts PP of the first group GR1 penetrating each of the gate stack structures GST1 and GST2 and the number of columns configured with the pillar parts PP of the second group GR2 penetrating each of the gate stack structures GST1 and GST2 may be different for different embodiments.

The select line separating structure DS may overlap with dummy plugs DR The dummy plugs DP may be arranged in a line along the direction of the select line separating structure DS. The dummy plugs DP may be formed using the same process for forming the pillar parts PP.

Figure 4:
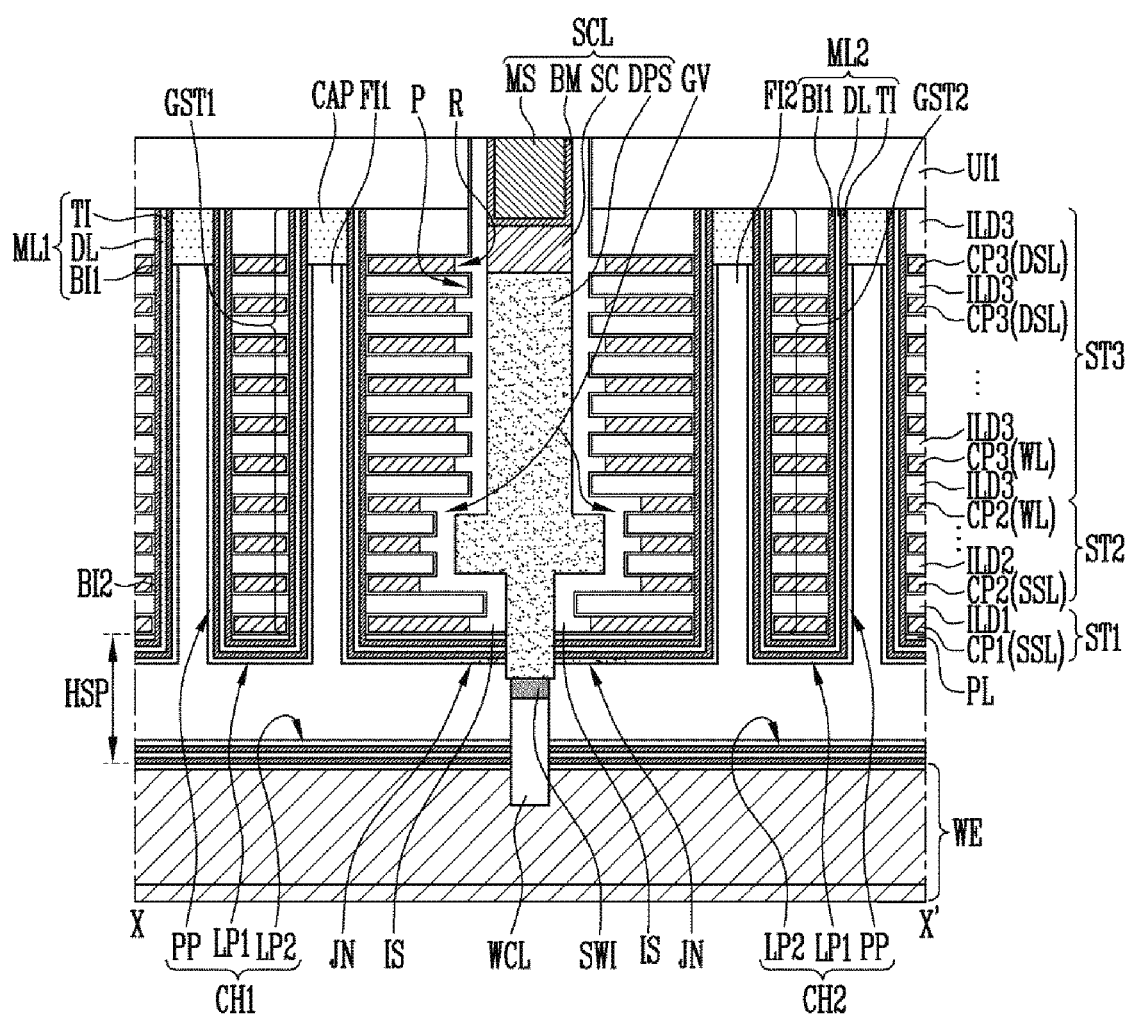
FIG. 4 shows a sectional view of the semiconductor device taken along a line X-X' shown in FIG. 3.

FIG. 4 shows a sectional view of the semiconductor device 100 taken in the I-II plane along line X-X' shown in FIG. 3. FIG. 4 shows a sectional view obtained by cutting in the vertical direction, so as not to intersect the supports IP, the gate stack structures GST1 and GST2 and illustrates a section of the channel patterns CH1 and CH2.

Referring to FIG. 4, the first to third stack structures ST1 to ST3 included in each of the gate stack structures GST1 and GST2 are patterned in a structure in which a groove GV is defined in the sidewall of each of the gate stack structures GST1 and GST2. For example, the first stack structure ST1 and the third stack structure ST3 protrude farther in the second direction II of FIG. 1 than the second stack structure ST2. Accordingly, the groove GV is defined between the first stack structure ST1 and the third structure ST3.

The first and third conductive patterns CP1 and CP3 may protrude farther toward the spacer insulating patterns IS than the second conductive patterns CP2. The first and third interlayer insulating layers ILD1 and ILD3 may protrude farther toward the spacer insulating patterns IS than the second interlayer insulating layers ILD2. The second interlayer insulating layers ILD2 may protrude farther toward the spacer insulating patterns IS than the second conductive patterns CP2. The third interlayer insulating layers ILD3 may protrude farther toward the spacer insulating patterns IS than the third conductive patterns CP3. Accordingly, recesses R may be defined between protrusions P of the first to third interlayer insulating layers ILD1 to ILD3 of the first to third stack structures ST1 to ST3.

Each of the spacer insulating patterns IS may be formed to fill in the recesses R. A central region of the groove GV is filled with a doped semiconductor pattern DPS disposed between the spacer insulating patterns IS.

The doped semiconductor pattern DPS may constitute the source contact structure SCL. The source contact structure SCL may further include the doped semiconductor pattern DPS, a metal silicide layer SC, a metal layer MS, and a metal barrier layer BM.

The doped semiconductor pattern DPS is disposed between the gate stack structures GST1 and GST2 adjacent to each other, and extends along the first direction I shown in FIG. 1. The horizontal protrusion part HP of the doped semiconductor pattern DPS, which is described with reference to FIG. 2A, is a part that protrudes toward the groove GV and completely fills in the central region of the groove GV. The doped semiconductor pattern DPS may extend toward the well structure WE to be in contact with the first part LP1 of each of the channel patterns CH1 and CH2. The doped semiconductor pattern DPS may extend toward the well structure WE to be in contact with sidewalls of the insulating patterns FI1 and FI2 filling in the horizontal space HSP.

The metal layer MS penetrates the first upper insulating layer UI1 and may be aligned on the doped semiconductor pattern DPS. The metal silicide layer SC is aligned between the metal layer MS and the doped semiconductor pattern DPS. The metal barrier layer BM extends along an interface between the metal silicide layer SC and the metal layer MS and an interface between the spacer insulating patterns IS and the metal layer MS. The metal silicide layer SC and the metal layer MS have a resistance lower than that of the doped semiconductor pattern DPS, and may decrease the resistance of the source contact structure SCL. The metal silicide layer SC may include tungsten silicide, nickel silicide, and the like. The metal layer MS may include tungsten and the like. The metal barrier layer BM prevents diffusion of metal, and may include a titanium nitride layer, a tungsten nitride layer, a tantalum nitride layer, and the like.

The first parts LP1 of the channel patterns CH1 and CH2 extend onto the bottom surfaces of the gate stack structures GST1 and GST2 from the pillar parts PP. Each of the first parts LP1 extends onto a lower surface of a spacer insulating pattern IS corresponding thereto, and protrudes farther in the second direction II of FIG. 1 than the first stack structure ST1 to be in contact with the doped semiconductor pattern DPS. Each of the first parts LP1 has a source contact surface in contact with the doped semiconductor pattern DPS. A source dopant in the doped semiconductor pattern DPS is diffused into the first parts LP1 of the channel patterns CH1 and CH2 from the source contact surface. The junction JN that is a diffusion region of the source dopant is defined in each of the first parts LP1 of the channel patterns CH1 and CH2.

The second parts LP2 extending from the third parts LP3 of the channel patterns CH1 and CH2 described with reference to FIG. 2A are disposed on the well structure WE. Each of the second parts LP2 of the channel patterns CH1 and CH2 extends towards the well contact structure WCL to be in contact with the well contact structure WCL.

The memory patterns ML1 and ML2 extend along the outer walls of the channel patterns CH1 and CH2, respectively. Each of the memory patterns ML1 and ML2 and the channel patterns CH1 and CH2 extends along the upper surface of the well structure WE, the sidewall of the support IP shown in FIG. 2A, and the bottom surface of any one of the gate stack structures GST1 and GST2. A surface of the horizontal space HSP may be defined along the upper surface of the well structure WE, the sidewall of the support IP shown in FIG. 2A, and the bottom surface of each of the gate stack structures GST1 and GST2.

Each of the insulating patterns FI1 and FI2 has a sidewall in contact with the doped semiconductor pattern DPS, the well contact structure WCL, and the inter-well-source insulating layer SWI.

The second blocking insulating layer BI2 may be formed of an insulating material having a dielectric constant higher than that of the first blocking insulating layer BI1 of FIG. 2A included in each of the memory patterns ML1 and ML2. For example, the second blocking insulating layer BI2 may be formed of an aluminum oxide layer. The second blocking insulating layer BI2 may be formed on a sidewall of each of the first to third conductive patterns CP1 to CP3, which faces the pillar parts PP. The second blocking insulating layer BI2 may extend between the first to third conductive patterns CP1 to CP3 and the first to third interlayer insulating layers ILD1 to ILD3. The second blocking insulating layer BI2 may extend between the first conductive pattern CP1 and the protective layer PL, and extend between the spacer insulating patterns IS and the first to third interlayer insulating layers ILD1 to ILD3.

Although not shown in the drawing, a barrier layer for preventing direct contact between each of the first to third conductive patterns CP1 to CP3 and the second blocking insulating layer BI2 may be further formed between each of the first to third conductive patterns CP1 to CP3 and the second blocking insulating layer BI2. The barrier layer may include a titanium nitride layer, a tungsten nitride layer, a tantalum nitride layer, and the like.

According to the present disclosure, source select transistors may be defined at intersection portions of the pillar parts PP of the channel patterns CH1 and CH2 and the source select line SSL, memory cells may be defined at intersection portions of the pillar parts PP of the channel patterns CH1 and CH2 and the drain select line DSL, and drain select transistors may be defined at intersection portions of the pillar parts PP of the channel patterns CH1 and CH2 and the drain select line DSL. The memory cells are arranged along the pillar parts PP of each of the channel patterns CH1 and CH2, and are three-dimensionally arranged along the first to third directions I to III, thereby constituting a three-dimensional semiconductor device 100.

According to an embodiment of the present disclosure, any etch stop pattern does not remain between the source select line SSL and the junction JN, and the source select line SSL and the junction JN are disposed close to each other. Accordingly, in the present disclosure, the turn-on current of the source select transistor can be increased.

Further, in the present disclosure, current loss due to remaining of an etch stop pattern is improved, so that cell current in the channel patterns CH1 and CH2 can be increased. Accordingly, the operational reliability of the semiconductor device 100 can be enhanced.

According to an embodiment of the present disclosure, the well contact structure WCL can be easily formed by the groove GV formed in the sidewall of each of the gate stack structures GST1 and GST2, so that the level of difficulty of manufacturing processes of the semiconductor device 100 can be lowered.

According to an embodiment of the present disclosure, each of the channel patterns CH1 and CH2 includes the first part LP1 electrically connected to the well structure WE including the well dopant through the well contact structure WCL and the second part LP2 electrically connected to the source contact structure SCL including the source dopant. The source contact structure SCL and the well contact structure WCL are structurally separated from each other by the inter-well-source insulating layer SWI. Thus, the flow of current in a program operation and a read operation can be controlled to face the source contact structure SCL, and holes can be supplied through the well structure WE in an erase operation. Accordingly, operation characteristics of the semiconductor device 100 can be enhanced.

The inter-well-source insulating layer SWI disposed between the doped semiconductor pattern DPS of the source contact structure and the well contact structure WCL can reduce leakage current between the junction JN and the well structure WE. Accordingly, the operational reliability of the semiconductor device 100 can be enhanced.

FIGS. 5A to 5D, 6A to 6D, 7A to 7G, 8A to 8E, 9A, and 9B show sectional views illustrating a manufacturing method of the semiconductor device 100 according to the first embodiment of the present disclosure. In particular, FIGS. 5A to 5D, 6A to 6D, 7A to 7G, 8A to 8E, 9A, and 9B show manufacturing process sectional views of the semiconductor device 100 taken along line Y-Y' shown in FIG. 3.

FIGS. 5A to 5D show sectional views illustrating a process of forming a well structure, a process of forming supports, and processes of forming first to third stack structures.

Although not shown in the drawings, before the well structure is formed, driving transistors constituting a driving circuit for driving the semiconductor device 100 may be formed on a substrate (not shown). The well structure may be formed on the substrate including the driving transistors.

Referring to FIG. 5A, a well structure WE including a well dopant is formed on a substrate (not shown). The process of forming the well structure WE may include a process of forming a first doped semiconductor layer 101 including the well dopant at a first concentration and a process of forming a second doped semiconductor layer 103 including the well dopant at a second concentration lower than the first concentration. The second doped semiconductor layer 103 is formed on the first doped semiconductor layer 101. Each of the first doped semiconductor layer 101 and the second doped semiconductor layer 103 may be a doped silicon layer. The process of forming the second doped semiconductor layer 103 may include a process of forming an undoped silicon layer on the first doped semiconductor layer 101 and a process of diffusing the well dopant in the first doped semiconductor layer 101 into the undoped silicon layer through a heat treatment process.

Subsequently, a buffer layer 105 may be further formed on the well structure WE. The buffer layer 105 may be formed to prevent the well dopant from being diffused from the well structure WE. The buffer layer 105 may be formed of a material different from that of a first lower sacrificial layer 111 formed in a subsequent process. For example, the buffer layer 105 may be formed of an oxide layer.

After this, the first lower sacrificial layer 111 and a second lower sacrificial layer 113 are sequentially stacked on the buffer layer 105. The first lower sacrificial layer 111 and the second lower sacrificial layer 113 may be formed of a material having an etch rate different from those of first and second material layers 121a and 123a of a first stack structure PST1 to be formed in a subsequent process. The first lower sacrificial layer 111 and the second lower sacrificial layer 113 may be formed of materials different from each other. For example, the first lower sacrificial layer 111 may be formed of a silicon layer, and the second lower sacrificial layer 113 may include a metal. For one embodiment, the second lower sacrificial layer 113 may be formed of tungsten or titanium nitride (TiN).

Subsequently, supports IP may be formed, which penetrate the second lower sacrificial layer 113, the first lower sacrificial layer 111, the buffer layer 105, and the well structure WE. The supports IP are arranged to be spaced apart from each other. The process of forming the supports IP may include a process of forming a mask pattern, using a photolithography process, a process of forming through-holes by etching the second lower sacrificial layer 113, the first lower sacrificial layer 111, the buffer layer 105, and the well structure WE through an etching process using the mask pattern as an etch barrier, a process of filling the through-holes with an insulating material, a process of planarizing a surface of the insulating material, and a process of removing the remaining mask pattern.

An oxide layer may be used as the insulating material for the supports IP. The well structure WE may be patterned in a desired pattern, using the photolithography process for forming the supports IP. Accordingly, manufacturing processes of the semiconductor device 100 can be simplified.

The supports IP protrude farther in the upper direction than the well structure WE to further penetrate the second lower sacrificial layer 113 and the first lower sacrificial layer 111, which are disposed on the well structure WE.

After this, a protective layer 115 may be further formed. The protective layer 115 is formed of a material different from those of the first lower sacrificial layer 111 and the second lower sacrificial layer 113, and may be formed of an oxide layer.

Subsequently, the first stack structure PST1 is formed on the protective layer 115. The first stack structure PST1 may include at least one pair of first and second material layers 121a and 123a that are alternately stacked. The first material layer 121a may be formed of an insulating material for sacrificial layers, and the second material layer 123a may be formed of an insulating material for interlayer insulating layers. For example, the first material layers 121a may be formed of a silicon nitride layer, and the second material layers 123a may be formed of a silicon oxide layer. The first material layer 121a is disposed in the lowermost layer of the first stack structure PST1.

After this, a second stack structure PST2 is formed by alternately stacking first material layers 121b and second material layers 123b on the first stack structure PST1. The first material layers 121b of the second stack structure PST2 are the same as the first material layer 121a of the first stack structure PST1, and the second material layers 123b of the second stack structure PST2 are the same as the second material layer 123a of the first stack structure PST1. The lowermost and uppermost layers among the first material layers 121*b* are disposed in the lowermost and uppermost layers of the second stack structure PST2. The stacking number of first material layers 121*b* and second material layers 123*b*, which constitute the second stack structure PST2 may be variously changed such that the thickness of the second stack structure PST2 is equal to or larger than that of an etch stop pattern that serves as an etch stop layer.

Subsequently, a planarizing protective layer 125 formed of a material different from that of the first material layers 121*b* is formed on the second stack structure PST2.

Subsequently, a trench T exposing the first stack structure PST1 is formed by etching the planarizing protective layer 125 and the second stack structure PST2. The trench T may extend along the third direction shown in FIG. 1. A photography process may be used to form the trench T.

Figure 5B:
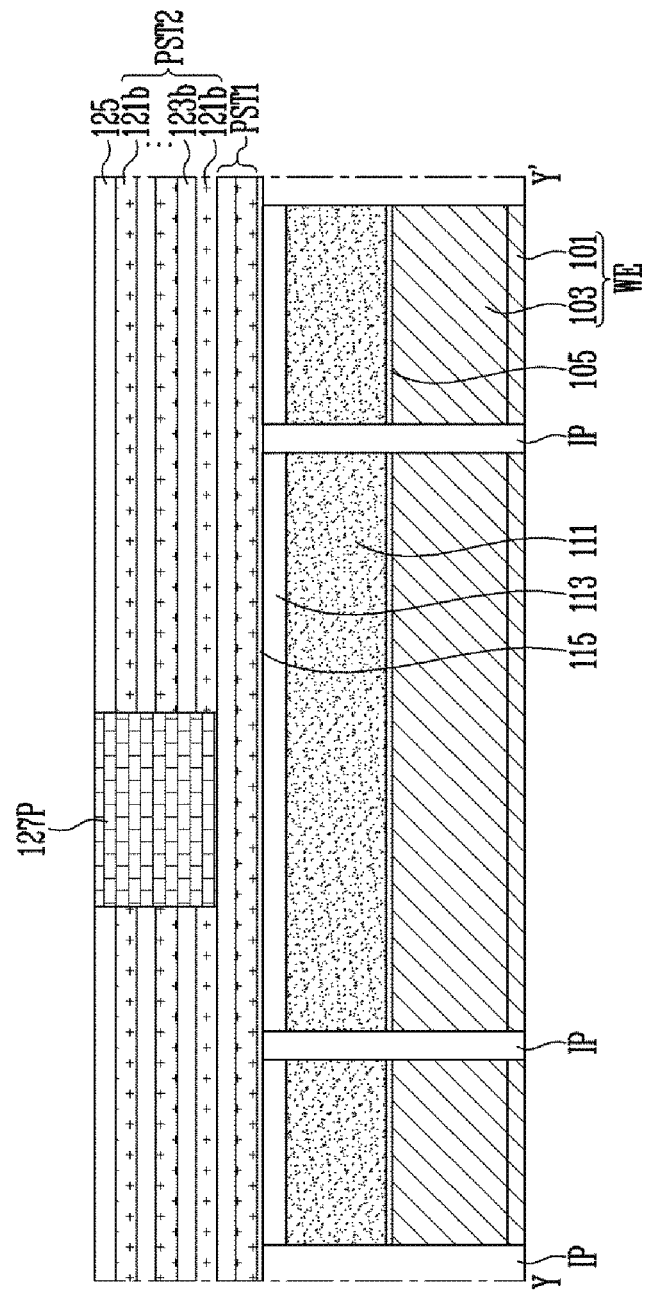

Referring to FIG. 5B, after an etch stop layer is formed such that the trench T shown in FIG. 5A is completely filled therewith, the etch stop layer is polished until the planarizing protective layer 125 is exposed. Accordingly, an etch stop pattern 127P is formed in only the trench T. The etch stop layer for the etch stop pattern 127P is formed of a material having an etch rate different from those of the material layers constituting the first and second stack structures PST1 and PST2 and material layers constituting a third stack structure PST3 to be formed in a subsequent process. For example, the etch stop layer for the etch stop pattern 127P may be formed of a silicon layer.

Figure 5C:
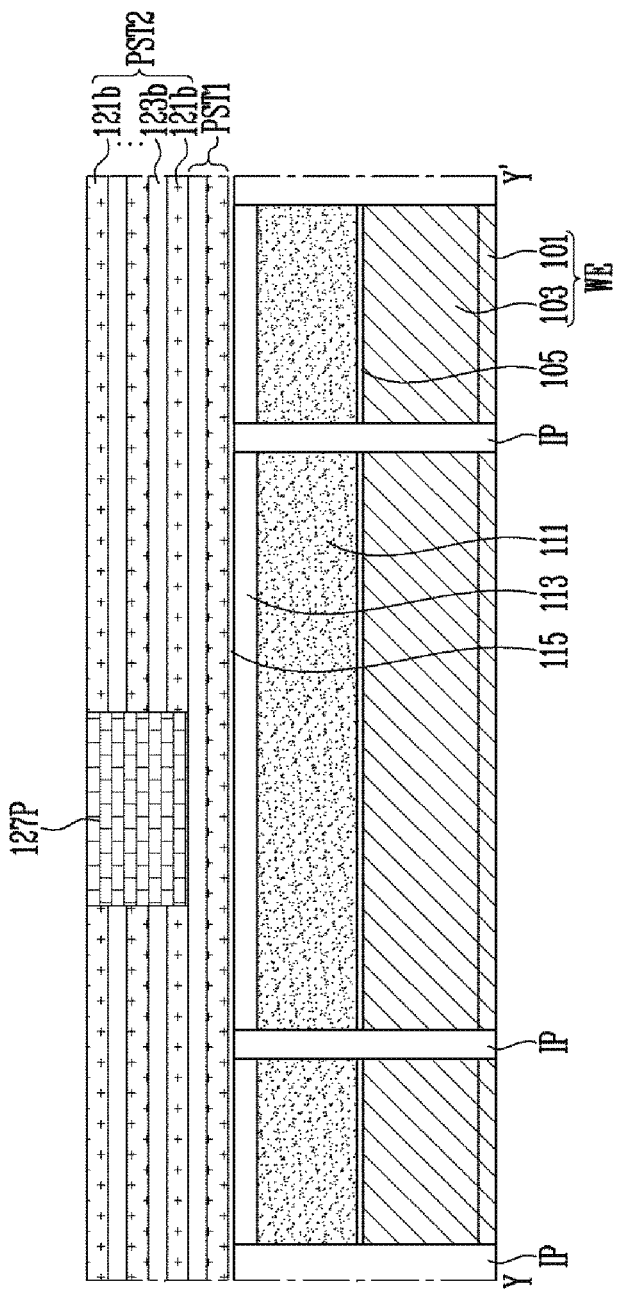

Referring to FIG. 5C, the planarizing protective layer 125 and the etch stop pattern 127, which are shown in FIG. 5B, may be polished such that the first material layer 121*b* disposed in the uppermost layer of the second stack structure PST2 is exposed. Accordingly, the second stack PST2 penetrated by the etch stop pattern 127P is formed. According to the present disclosure, the secondary polishing process is performed in a state in which the surface roughness of the etch stop layer is reduced through the primary polishing process, so that the uppermost layer of the second stack structure PST2 is exposed. As a result, a phenomenon can be minimized, in which the thickness of the first material layer 121*b* disposed in the uppermost layer of the second stack structure PST2 is lost due to the planarizing process for forming the etch stop pattern 127P.

Figure 5D:
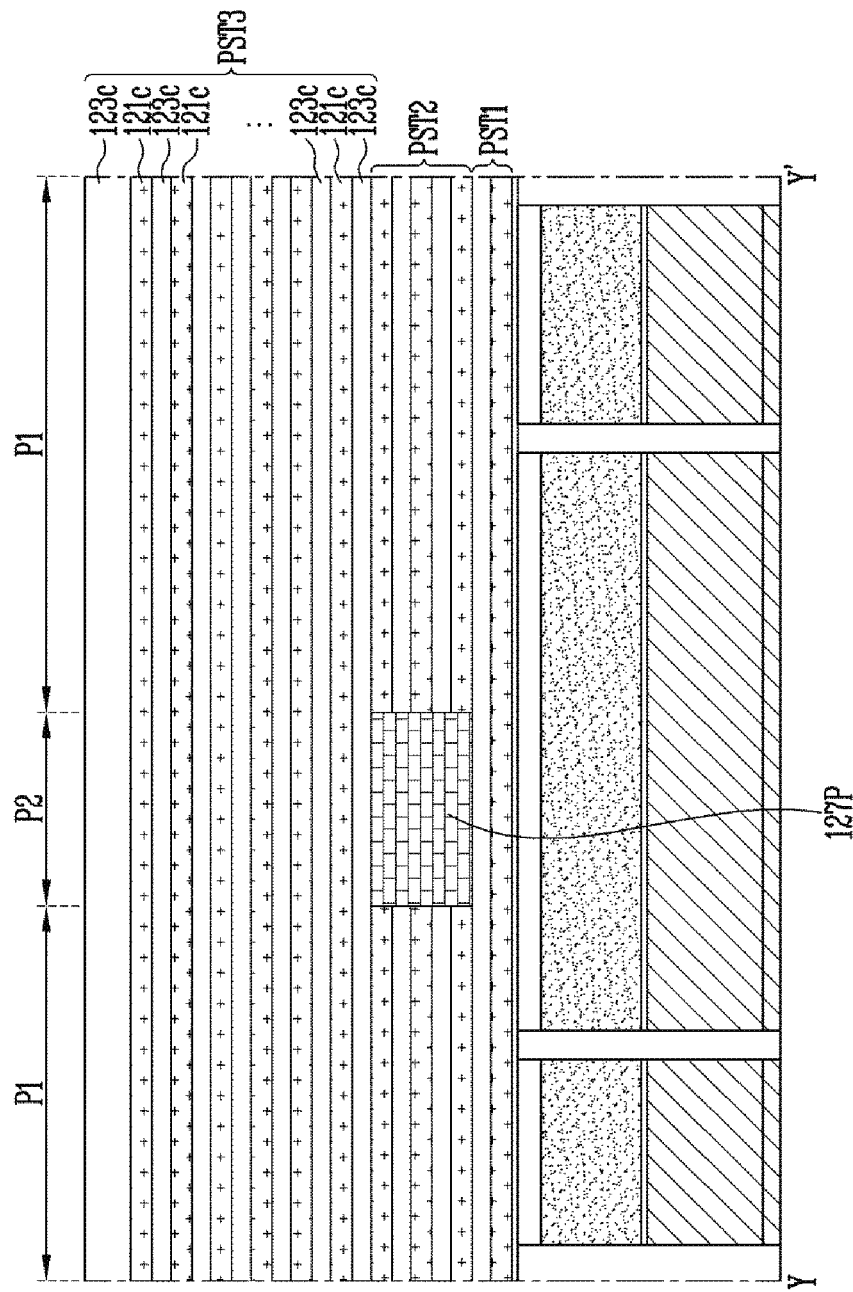

Referring to FIG. 5D, the third stack structure PST3 extending to cover the etch stop pattern 127P is formed on the second stack structure PST2. The third stack structure PST3 is formed on the second stack structure PST2 by alternately stacking first material layers 121*c* and second material layers 123*c*. The first material layers 121*c* of the third stack structure PST3 are the same as the first material layer 121*a* of the first stack structure PST1 described with reference to FIG. 5A, and the second material layers 123*c* of the third stack structure PST3 are the same as the second material layer 123*a* of the first stack structure PST1 described with reference to FIG. 5A. The lowermost and uppermost layers among the second material layers 123*c* may be disposed in the lowermost and uppermost layers of the third stack structure PST3. The stacking number of first material layers 121*c* and the second material layers 123*c*, which constitute the third stack structure PST3, may be variously changed. The second material layer 123*c* disposed in the uppermost layer of the third stack structure PST3 may be formed thicker than the second material layers on the bottom thereof, and be used as a mask.

The first to third stack structures PST1 to PST3 include first regions P1. The first regions P1 are defined as regions in which the first to third stack structures PST1 to PST3 all overlap with one another. Each of the first to third stack structures PST1 to PST3 further includes a second region P2 overlapping with the etch stop pattern 127P.

FIGS. 6A to 6D show sectional views illustrating a process of opening a channel region and a process of forming a memory layer and a channel layer in the channel region.

Figure 6A:
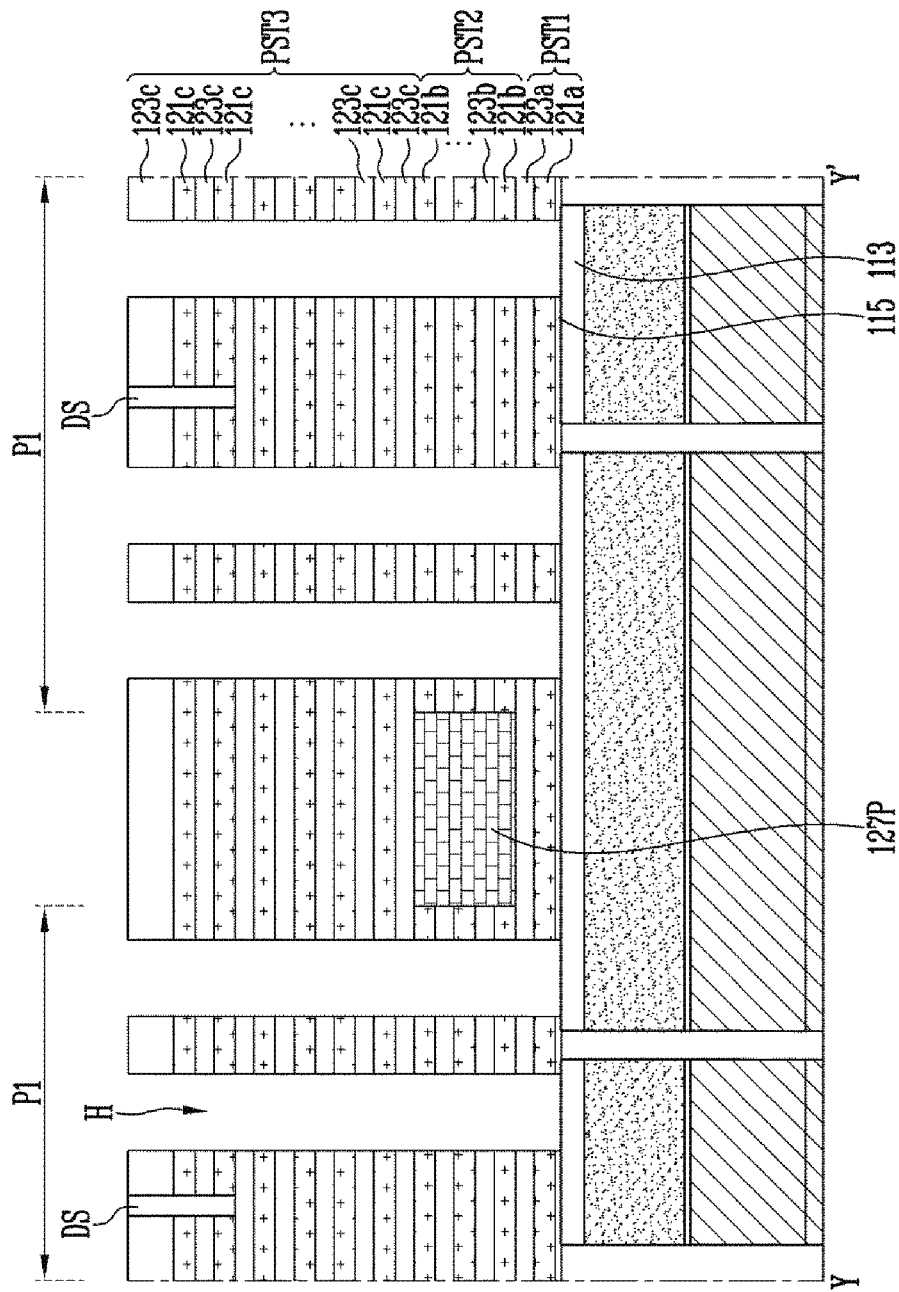

Referring to FIG. 6A, a portion of the third stack structure PST3 may be penetrated by a select line separating structure DS. The select line separating structure DS is formed to separate drain select lines, and the depth to which the select line separating structure DS is formed may be variously changed depending on designs. The select line separating structure DS may be omitted, for some embodiments.

Subsequently, holes H are formed, which penetrate the first regions P1 of the first to third stack structures PST1 to PST3 and the protective layer 115. The second lower sacrificial layer 113 may be exposed through bottom surfaces of the holes H. The first material layers 121*a*, 121*b*, and 121*c* and the second material layers 123*a*, 123*b*, and 123*c*, which are described with reference to FIGS. 5A to 5D, are etched so as to form the holes H. When the second lower sacrificial layer 113 includes a metal, the width of the bottom surface of each of the holes H can be widely ensured using a different in etch rate between the second lower sacrificial layer 113 and the first material layers 121*a*, 121*b*, and 121*c* and the second material layers 123*a*, 123*b*, and 123*c*.

Figure 6D:
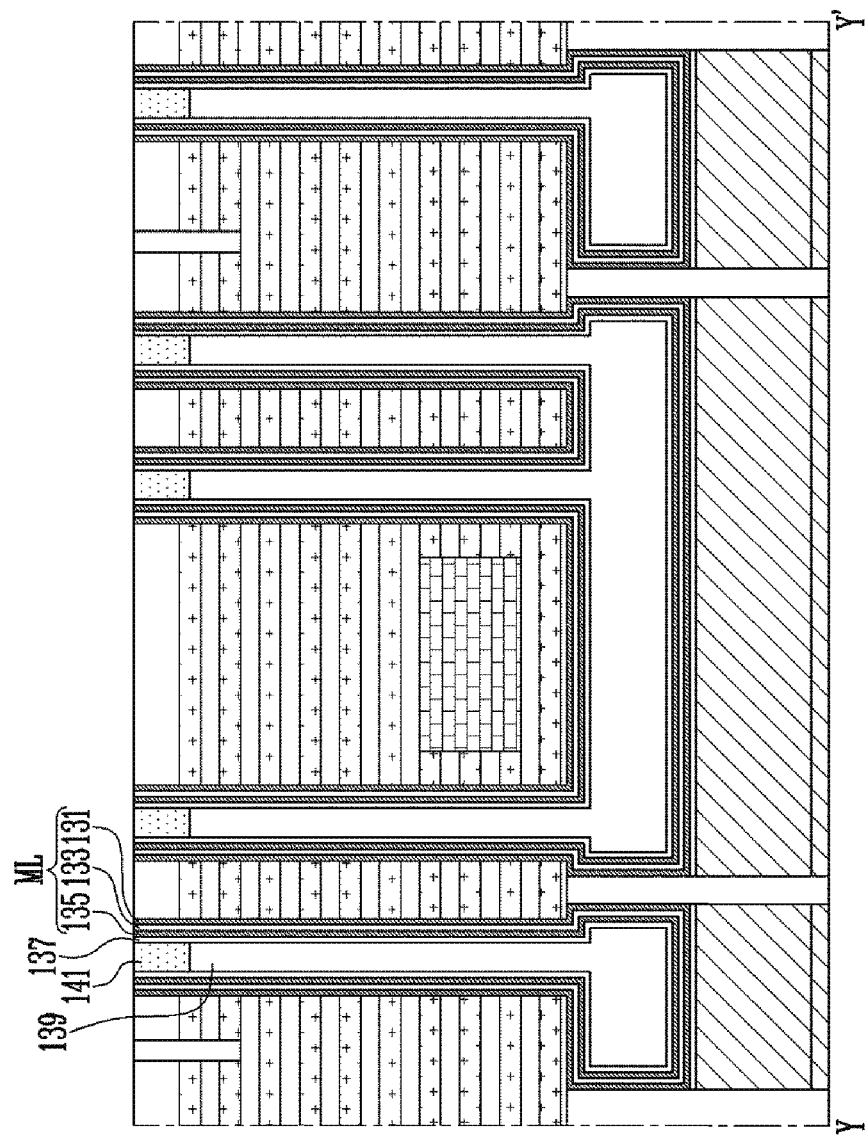

Referring to FIG. 6D, the second lower sacrificial layer 113 shown in FIG. 6A is selectively removed through the holes H. Accordingly, the first lower sacrificial layer 111 and the protective layer 115 are exposed.

Referring to FIG. 6C, the first lower sacrificial layer 111 shown in FIG. 6B is selectively removed through the holes H. Accordingly, a horizontal space HSP connected to the holes H is opened. The horizontal space HSP and the holes H are connected to each other to define a channel region CA. While the first lower sacrificial layer 111 is being removed, the first material layer 121*a* disposed in the lowermost layer may be protected without being lost by the protective layer 115. Gap of the horizontal space HSP may be maintained by the supports IP. A sidewall of each of the supports IP may be exposed by the horizontal space HSP.

Referring to FIG. 6D, a memory layer ML is formed on a surface of the channel region CA shown in FIG. 6C. The process of forming the memory layer ML may include a process of forming a first blocking insulating layer 131, a process of forming a data storage layer 133 on the first blocking insulating layer 131, and a process of forming a tunnel insulating layer 135 on the data storage layer 133. A material of each of the first blocking insulating layer 131, the data storage layer 133, and a tunnel insulating layer 135 is the same as described with reference to FIG. 2A. Each of the first blocking insulating layer 131, the data storage layer 133, and a tunnel insulating layer 135 is conformally formed along the surface of the channel region CA.

Subsequently, a channel layer 137 is formed on a surface of the memory layer ML. The channel layer 137 is conformally formed along the surface of the channel region CA shown in FIG. 6C. The channel layer 137 may be formed of a semiconductor layer. For example, the channel layer 137 may be formed by depositing a silicon layer. The channel layer 137 may be formed as an integrated layer without any interface.

After this, a central portion of the channel region CA, which is opened without being filled with the channel layer 137, is filled with an insulating layer 139. The insulating layer 139 is formed on the channel layer 137. The process of forming the insulating layer 139 may include a process of filling the channel region CA of FIG. 6C with a material layer having liquidity and a process of curing the material layer having liquidity. Polysilazane (PSZ) may be used as the material having liquidity.

A process of recessing a portion of the insulating layer 139 may be further performed such that the height of the insulating layer 139 is lower than that of the channel layer 137. A central region of the channel layer 137 exposed on the insulating layer 139 may be filled with a doped semiconductor layer 141. The doped semiconductor layer 141 may be formed of a doped silicon layer including a drain dopant of the same conductivity type as a source dopant. For example, the doped semiconductor layer 141 may include an n-type dopant.

FIGS. 7A to 7G show sectional views illustrating a process of forming a slit and a process of forming gate stack structures.

Referring to FIG. 7A, an upper insulating layer 143 is formed on the third stack structure PST3. The upper insulating layer 143 may be formed of an oxide layer, and serve as a mask.

Subsequently, the second region P2 of the third stack structure PST3 is etched from the upper insulating layer 143, using a photolithography process. Accordingly, a first slit SU penetrating the third stack structure PST3 is formed. The etch stop pattern 127P has an etching resistance with respect to an etching material for etching the third stack structure PST3. Accordingly, since it is difficult to remove the etch stop pattern 127P during the etching process for forming the first slit SI1, the depth of the first slit SU can be easily controlled such that the first slit SU completely penetrates the third stack structure PST3 and does not penetrate the etch stop pattern 127P. The first slit SU may extend to the inside of the etch stop pattern 127P. However, the etch stop pattern 127P defines a bottom surface of the first slit SI1, and may remain.

Referring to FIG. 7B, mask patterns 145 are formed on sidewalls of the first slit SI1, which face each other. The mask patterns 145 may be formed of the same material as the first material layer 121a of the first stack structure PST1. The process of forming the mask patterns 145 may include a process of conformally forming a mask layer along a surface of the first slit SI1 and a process of opening the bottom surface of the first slit SI1 by etching the mask layer through an etch-back process.

Subsequently, the uppermost layer 123a of the first stack structure PST1 is exposed by etching a portion of the etch stop pattern exposed between the mask patterns 145, and a second slit SI2 connected to the first slit SI1 is formed. The etch stop pattern may be separated into first and second side patterns 127P1 and 127P2 by being penetrated by the second slit SI2.

Referring to FIG. 7C, the lowermost layer 121a of the first stack structure PST1 is exposed by etching the first stack structure PST1 exposed between the mask patterns 145, and a third slit SI3 connected to the second slit SI2 is formed. A bottom surface of the third slit SI3 is defined by the first material layer 121a disposed in the lowermost layer of the first stack structure PST1.

The second material layer 123a of the first stack structure PST1, which is blocked by the mask patterns 145 and the first and second side patterns 127P1 and 127P2, may remain to protrude farther toward the third slit SI3 than the sidewall of the second stack structure PST2.

The first to third slits SI1 to SI3 formed by the processes described with reference to FIGS. 7A to 7C are connected to each other to constitute a slit. Hereinafter, the structure in which the first to third slits SI1 to SI3 are connected to each other is referred to as a slit SI.

Figure 7D:
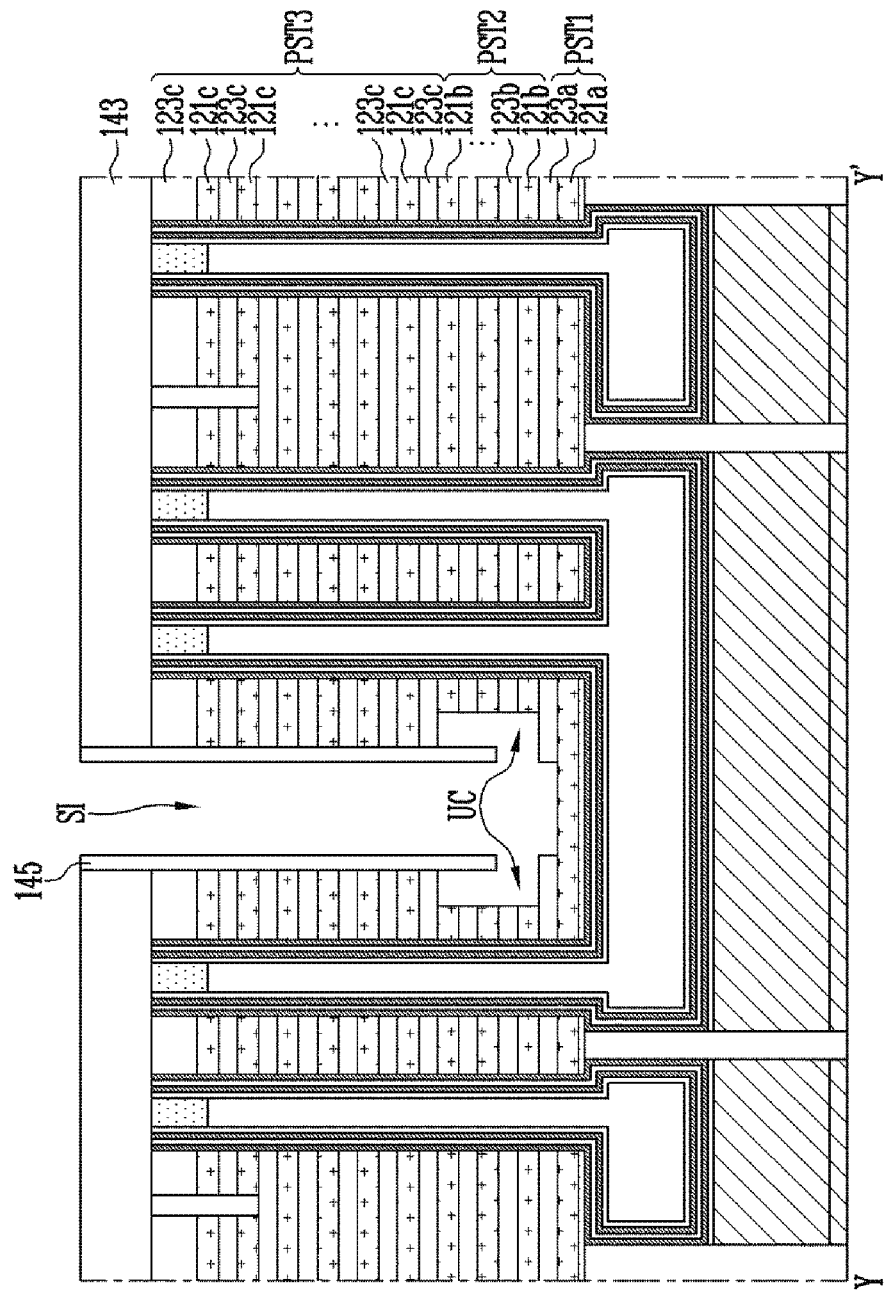

Referring to FIG. 7D, the first and second side patterns 127P1 and 127P2 shown in FIG. 7C are selectively removed. Accordingly, the sidewall of the second stack structure PST2 is exposed, and an undercut region UC is defined between the third stack structure PST3 and the first stack structure PST1.

Figure 7E:
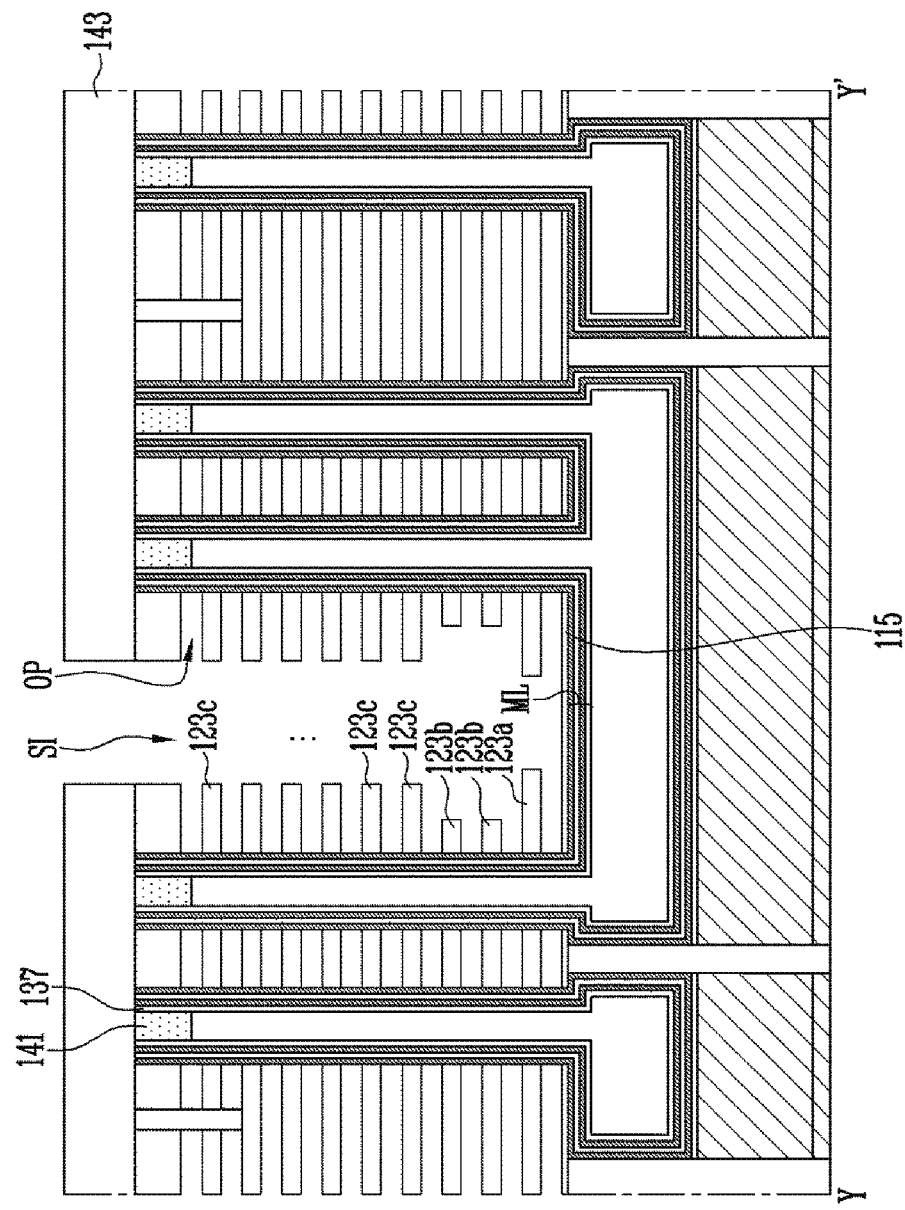

Referring to FIG. 7E, the first material layers 121a to 121c of the first to third stack structures PST1 to PST3 shown in FIG. 7D are removed. Openings OP are defined in regions in which the first material layers 121a to 121c of the first to third stack structures PST1 to PST3 are removed. Since the mask patterns 143 shown in FIG. 7D are formed of the same material as the first material layers 121a to 121c, the mask patterns 143 may be removed together with the first material layers 121a to 121c. When the first material layer 121a disposed in the lowermost layer of the first stack structure PST1 shown in FIG. 7D is removed, the protective layer 115 may be exposed. The protective layer 115 protects the memory layer ML disposed on the bottom thereof from the etching process.

The second material layer 123a disposed in the lowermost layer among the second material layers 123a, 123b, and 123c may protrude farther toward the slit SI than the second material layers 123b and 123c disposed above thereof.

Referring to FIG. 7F, a conductive layer 153 is filled in the opening regions OP shown in FIG. 7E. Before the conductive layer 153 is formed, a second blocking insulating layer 151 may be further formed conformally along surfaces of the opening regions OP and the slit SI. The second blocking insulating layer 151 may be formed of a high dielectric insulating layer. For example, the second blocking insulating layer 151 may include an aluminum oxide layer. The aluminum oxide layer may be deposited in an amorphous state and then crystallized through a heat treatment process. The n-type dopant in the doped semiconductor layer 141 shown in FIG. 7E is diffused into an upper end of the channel layer 137 in contact with the doped semiconductor layer 141 through the heat treatment process of crystallizing the second blocking insulating layer 151. As a result, a doping region is formed in the channel layer 137. Accordingly, a capping pattern CAP including the doped semiconductor layer 141 and the doping region of the channel layer 137 is defined. The capping pattern CAP may be used as a drain junction.

The conductive layer 153 may be formed of a low-resistance metal such as tungsten so as to achieve low-resistance wiring. The low-resistance metal for the conductive layer 153 is not limited to tungsten, and may be formed of various low-resistance metals.

Referring to FIG. 7G, the conductive layer 153 shown in FIG. 7F is etched through the slit SI such that the first to third conductive patterns CP1 to CP3 can be formed. The first to third conductive patterns CP1 to CP3 are patterned not to protrude farther toward the slit SI than the second material layers 123a to 123c used as first to third interlayer insulating layers. A slit extension part SIE may be connected to the slit SI under the slit SI through an etching process of the conductive layer. The slit extension part SIE completely penetrates the conductive layer, and exposes the second blocking insulating layer 151 on the protective layer 115.

According to the processes described in FIGS. 7D to 7G, sacrificial layers (i.e., the first material layers) of the first to third stack structures are replaced with conductive patterns. Accordingly, gate stack structures GST1 and GST2 may be formed, in which conductive patterns and interlayer insulating layers are alternately stacked. Each of the gate stack structures GST1 and GST2 may have a groove GV. The groove GV may be defined by the undercut region UC shown in FIG. 7D. The shape of a sidewall of each of the gate stack structures GST1 and GST2 having the grooves GV may include protrusions and recesses as described with reference to FIG. 4.

FIG. 8A to 8E show sectional views illustrating a process of forming spacer insulating patterns, a process of a well contact structure, and a process of forming an inter-well-source insulating layer.

Referring to FIG. 8A, spacer insulating patterns 161 are formed on sidewalls of the slit SI. The spacer insulating patterns 161 may be formed on sidewalls of the gate stack structures GST1 and GST2 to cover the first to third conductive patterns shown in FIG. 7G. The process of forming the spacer insulating patterns 161 may include a process of depositing an oxide layer and a process of etching the oxide layer through an etch-back process. The groove GV defined on the sidewall of each of the gate stack structures GST1 and GST2 is not completely filled with the spacer insulating patterns 161, and a central region of the groove GV may be opened.

Subsequently, the second blocking insulating layer 151, the protective layer 115, the memory layer ML, and the channel layer 137, which are exposed between the spacer insulating patterns 161, are sequentially etched. Accordingly, a first trench T1 is formed, which is connected to the slit SI and extends to the inside of the insulating layer 139.

Figure 8B:
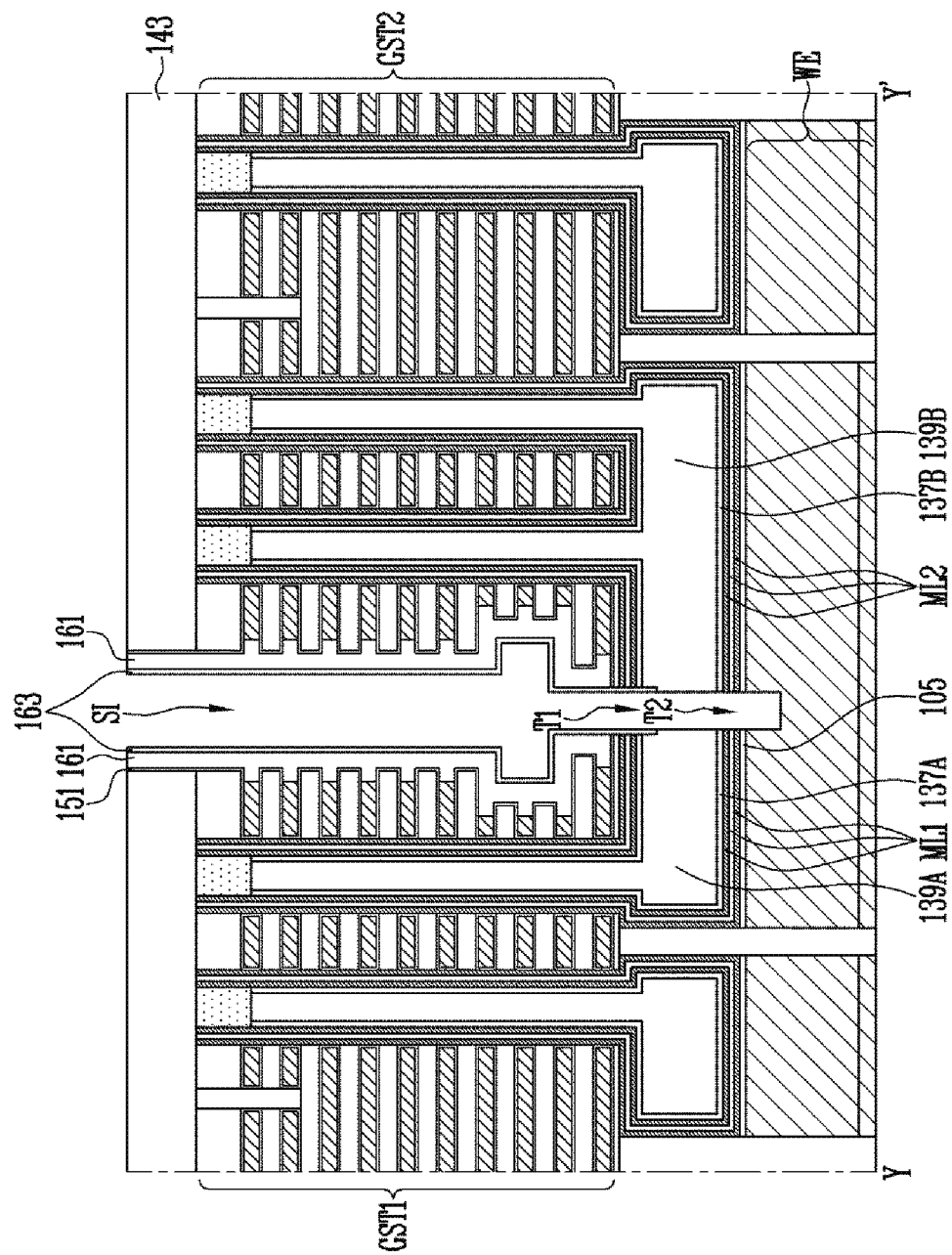

Referring to FIG. 8B, sidewall protective patterns 163 are formed, which extend toward sidewalls of the first trench T1 from the spacer insulating patterns 161. The sidewall protective patterns 163 may be formed of a material layer having an etch rate different from that of the oxide layer. For example, the sidewall protective patterns 163 may be formed of a nitride layer. The process of forming the sidewall protective patterns 163 may include a process of depositing a nitride layer and a process of etching the nitride layer through an etch-back process such that a bottom surface of the first trench T1 can be exposed.

Subsequently, a second trench T2 exposing the well structure WE is formed by etching the insulating layer, the channel layer, the memory layer, and the buffer layer 105, which are exposed between the sidewall protective patterns 163.

By the first trench T1 and the second trench T2, which are connected to the slit SI, the channel layer may be separated into channel patterns 137A and 137B, the memory layer may be separated into memory patterns ML1 and ML2, and the insulating layer may be separated into insulating patterns 139A and 139B. The second trench T2 may extend to the inside of the well structure WE.

Referring to FIG. 8C, a semiconductor layer 171 filling in the second trench T2 shown in FIG. 8B is formed. The semiconductor layer 171 is in contact with an end portion of each of the channel patterns 137A and 137B, which are exposed by the second trench T2 shown in FIG. 8B, and the well structure WE. The semiconductor layer 171 may include a silicon layer.

The semiconductor layer 171 may be formed using a selective growth process. The semiconductor layer 171 may be grown from the well structure WE exposed through the second trench T2 shown in FIG. 8B and the end portion of each of the channel patterns 137A and 137B. Alternatively, the semiconductor layer 171 may be formed using a deposition process such as a chemical vapor deposition process.

According to the present disclosure, although the deposition process is used, the second trench T2 shown in FIG. 8B can be easily filled with the semiconductor layer 171 through the groove GV defined by the undercut region UC described with reference to FIG. 7D. That is, the semiconductor layer 171 formed using the deposition process can be easily deposited in the second trench T2 through the groove GV defined by the undercut region UC. In addition, the groove GV defined by the undercut region UC can prevent a phenomenon in which a central region of an upper end of the slit SI, which is disposed above the groove GV, is completely filled with the semiconductor layer 171 before the second trench T2 is completely filled with the semiconductor layer 171. According to the present disclosure, the central region of the upper end of the slit SI, which is disposed above the groove GV, is not filled with the semiconductor layer 171 but opened. According to the present disclosure, although a deposition process that can reduce cost as compared with the selective growth process is introduced, the semiconductor layer 171 can be stably formed in a desired region, so that the manufacturing cost of the semiconductor device 100 can be reduced.

Figure 8D:
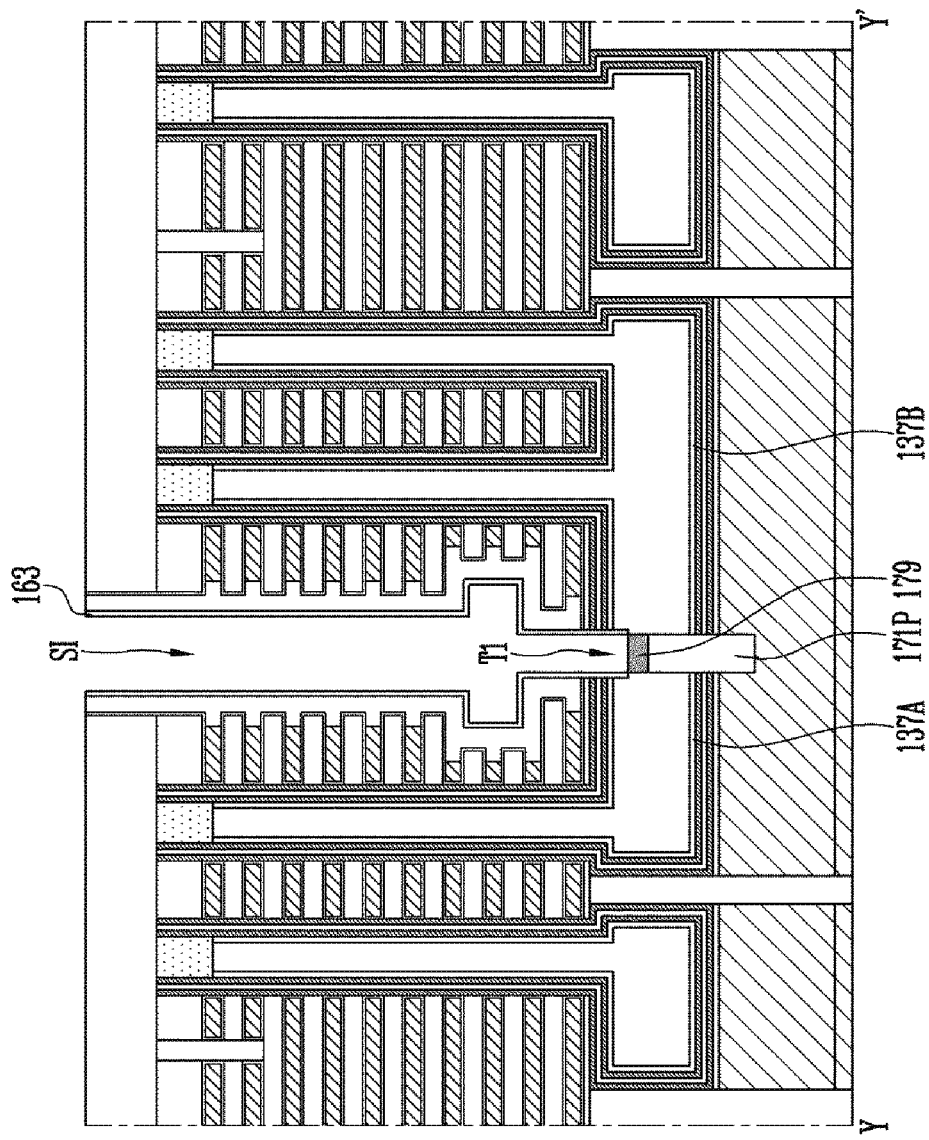

Referring to FIG. 8D, the semiconductor layer opened through the slit SI is etched such that a well contact structure 171P is patterned. The well contact structure 171P remains with a height at which the well structure WE and the channel patterns 137A and 137B can be connected. The well dopant in the well structure WE may be diffused into the well contact structure 171P.

Subsequently, an inter-well-source insulating layer 179 may be formed by oxidizing an upper portion of the well contact structure 171P through the first trench T1. A portion of each of the channel patterns 137A and 137B, which is to be used as a source contact surface in a subsequent process, is not oxidized but may be protected by the sidewall protective patterns 163.

Figure 8E:
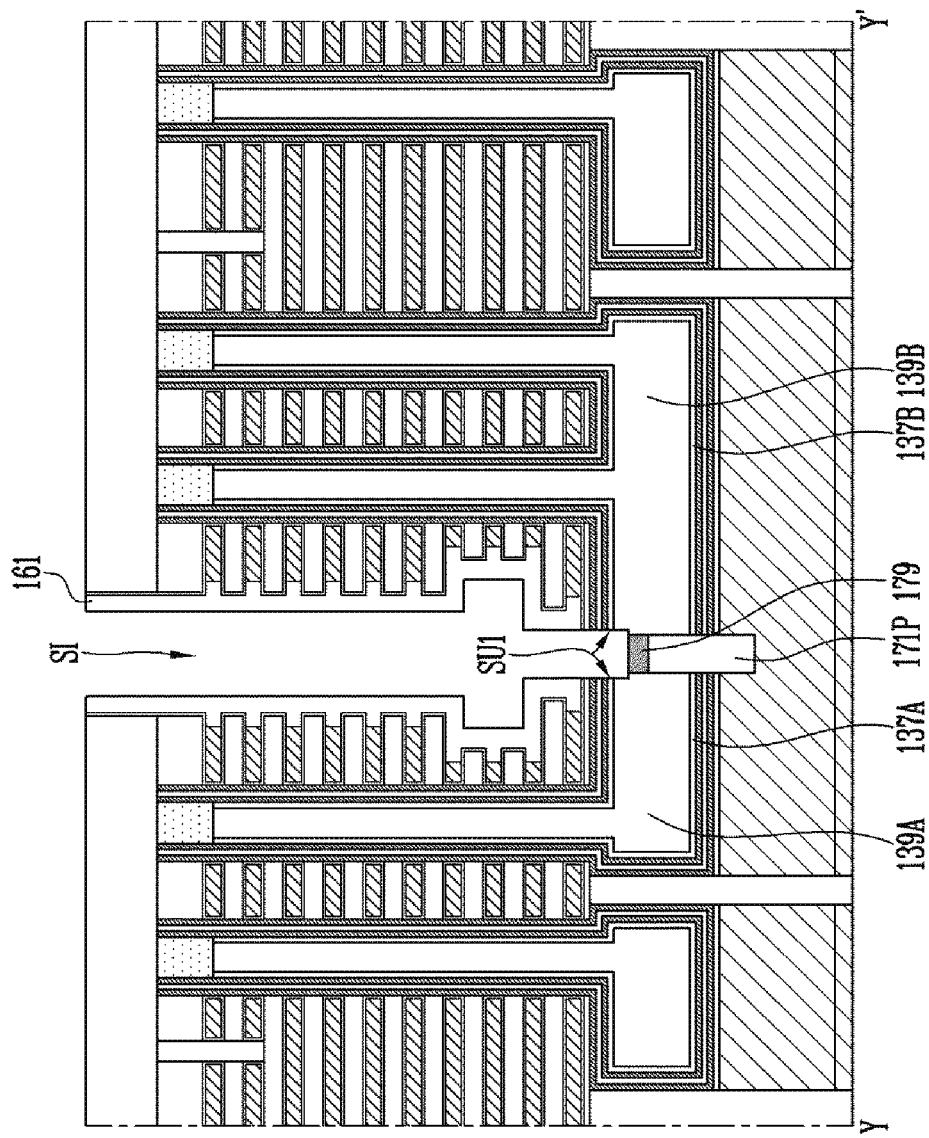

Referring to FIG. 8E, the sidewall protective patterns 163 shown in FIG. 8D are removed. Accordingly, a source contact surface SU1 of each of the channel patterns 137A and 137B and the spacer insulating patterns 161 are exposed.

FIGS. 9A and 9B show sectional views illustrating a process of forming a source contact structure.

Referring to FIG. 9A, a doped semiconductor layer 181 is formed on the inter-well-source insulating layer 179. The doped semiconductor layer 181 may be a doped silicon layer including a source dopant. The source dopant is an n-type dopant. The doped semiconductor layer 181 may be in contact with the source contact surface of each of the channel patterns 137A and 137B, and extend onto the spacer insulating patterns 161.

Referring to FIG. 9B, the doped semiconductor layer may be recessed such that a portion of the slit SI shown in FIG. 8E is opened. After this, a partial thickness of the doped semiconductor layer is silicided through a siliciding process to be changed into a metal silicide layer 183. The portion that is not changed into the metal silicide layer 183 remains as a doped semiconductor pattern 181P. Since the metal silicide layer 183 has a resistance lower than that of the doped semiconductor pattern 181P, the metal silicide layer 183 can lower the resistance of a source contact structure SCL.

The siliciding process may include a process of depositing a metal layer and an annealing process of inducing a reaction between the metal layer and the doped semiconductor layer. The source dopant in the doped semiconductor layer may be diffused into the channel patterns 137A and 137B from the source contact surface SU1 of FIG. 9A of each of the channel patterns 137A and 137B, using the annealing process performed while the siliciding process is being performed. Accordingly, a junction JN may be formed in each of the channel patterns 137A and 137B.

Various metal layers such as nickel and tungsten may be used as the metal layer for the siliciding process. The metal silicide layer 183 formed through the siliciding process may be nickel silicide, tungsten silicide, etc.

Subsequently, a metal barrier layer 185 is formed on surfaces of the spacer insulating patterns 161 and the metal silicide layer 183. After this, a process of forming a metal layer 187 on the metal barrier layer 185 may be further performed such that the slit is completely filled with the metal layer 187. The metal layer 187 may include a low-resistance metal layer such as tungsten so as to achieve a low resistance of the source contact structure SCL. The metal barrier layer 185 may include a titanium nitride layer, a tungsten nitride layer, a tantalum nitride layer, and the like so as to prevent diffusion of metal from the metal layer 187.

Subsequently, subsequent processes for forming the second upper insulating layer UI2 shown in FIG. 1 and the bit line contact plug BCT and the bit line BL, which are shown in FIG. 2A, may be performed.

FIGS. 10A, 10B, 11A, 11B, 12A, 12B, 13A, 13B, 14A, 14B, and 15A to 15C show views illustrating a manufacturing method of a semiconductor device 100 according to a second embodiment of the present disclosure. FIGS. 10A, 10B, 11A, 11B, 12A, 12B, 13A, 13B, 14A, 14B, and 15A to 15C show a modification of the manufacturing process sectional views of the semiconductor device 100 taken along line Y-Y' shown in FIG. 3. FIGS. 11B, 12B, and 14B illustrate plan views taken in the horizontal direction along lines B-B' shown in FIGS. 11A, 12A, and 14A.

Hereinafter, descriptions of repeated manufacturing processes of the present disclosure are omitted, and only modified manufacturing processes is described in detail.

Figure 10A:
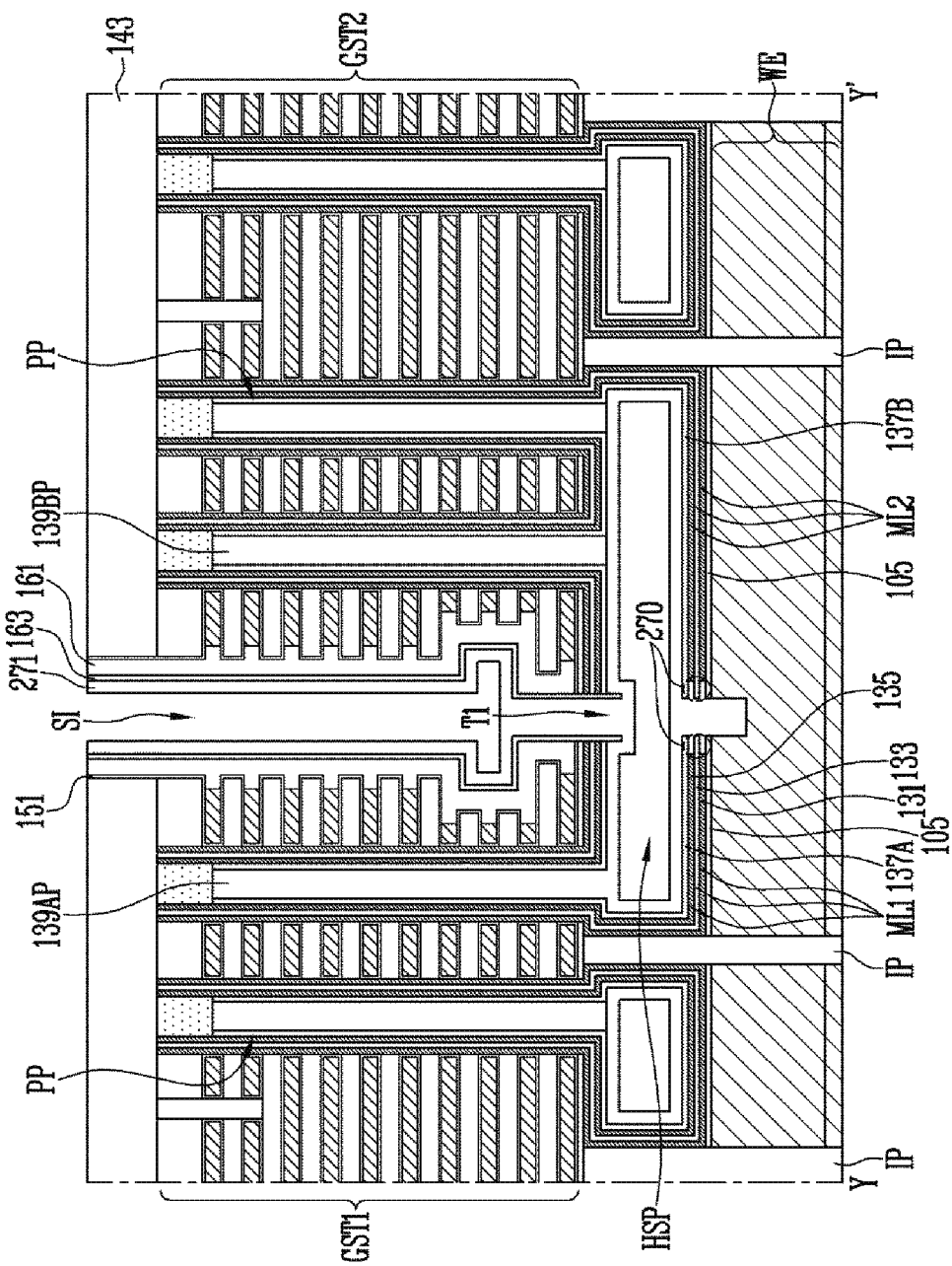

In order to form a structure shown in FIG. 10A, the processes described in FIGS. 5A to 5D, 6A to 6D, 7A to 7G, 8A and 8B may be performed.

Referring to FIG. 8B, the insulating patterns 139A and 139B are exposed by the second trench T2. Subsequently, portions of the insulating patterns 139A and 139B exposed by the second trench T2 shown in FIG. 8B are etched. Accordingly, as shown in FIG. 10A, the horizontal space HSP between the gate stack structures GST1 and GST2 and the well structure WE is opened, and an inner wall of each of the channel patterns 137A and 137B, which faces the horizontal space HSP, is exposed. The insulating patterns surrounded by pillar parts PP of the channel patterns 137A and 137B penetrating the gate stack structures GST1 and GST2 may remain as vertical insulating patterns 139AP and 139BP. A bottom surface of the vertical insulating patterns 139AP and 139BP faces the horizontal space HSP.

Referring to FIG. 10A, the tunnel insulating layer 131 and the first blocking insulating layer 135 of each of the memory patterns ML1 and ML2 and the buffer layer 105 may be etched while the portions of the insulating patterns are being removed. The tunnel insulating layer 131, the first blocking insulating layer 135, and the buffer layer 105 may be etched slower than the insulating patterns. Accordingly, gaps 270 may be defined between the channel patterns 137A and 137B and the data storage layers 133 and between the well structure WE and the data storage layers 133.

After this, a first semiconductor layer 271 is formed to fill in the gaps 270. The first semiconductor layer 271 is in contact with the end portion of each of the channel patterns 137A and 137B and the well structure WE, and extends onto the inner wall of each of the channel patterns 137A and 137B. The first semiconductor layer 271 may include a silicon layer.

The first semiconductor layer 271 may be formed using a deposition process such as a chemical vapor deposition process. A lower end portion of the slit SI may be blocked by the first semiconductor layer 271 in a state in which the central region of the horizontal space HSP and the central region of the slit SI are not completely filled with the first semiconductor layer 271. A lower end portion of the second trench T2 of FIG. 8B, which extends to the inside of the well structure WE, may be completely filled with the first semiconductor layer 271.

Referring to FIG. 10B, the first semiconductor layer 271 shown in FIG. 10A is etched such that a first semiconductor pattern 271P opened toward the slit SI is disposed in the horizontal space HSP. The first semiconductor pattern 271P remains in a state in which it is in contact with the well structure WE and the channel patterns 137A and 137B.

The first semiconductor pattern 271P extends onto bottom surfaces of the vertical insulating patterns 139AP and 139BP and the inner walls of the channel patterns 137A and 137B, which face the central region of the horizontal space HSP.

The first semiconductor pattern 271P may include a well contact structure WCL and first and second auxiliary contact structures AC1 and AC2. The well contact structure WCL is a structure filling in the lower end portion of the second trench T2 shown in FIG. 8B as a portion of the first semiconductor pattern 271P. The first and second auxiliary contact structures AC1 and AC2 are structures filling in the gaps 270 shown in FIG. 10A as portions of the first semiconductor pattern 271P. The first and second auxiliary contact structures AC1 and AC2 protrude in parallel to each other in the second direction II shown in FIG. 1 from a side portion of the well contact structure WCL. The data storage layer 133 of each of the memory patterns ML1 and ML2 has a protrusion part extending between the first and second auxiliary contact structures AC1 and AC2.

The first auxiliary contact structure AC1 extends between each of the channel patterns 137A and 137B and the data storage layer 133, and the second auxiliary contact structure AC2 extends between the well structure WE and the data storage layer 133.

Figure 11A:
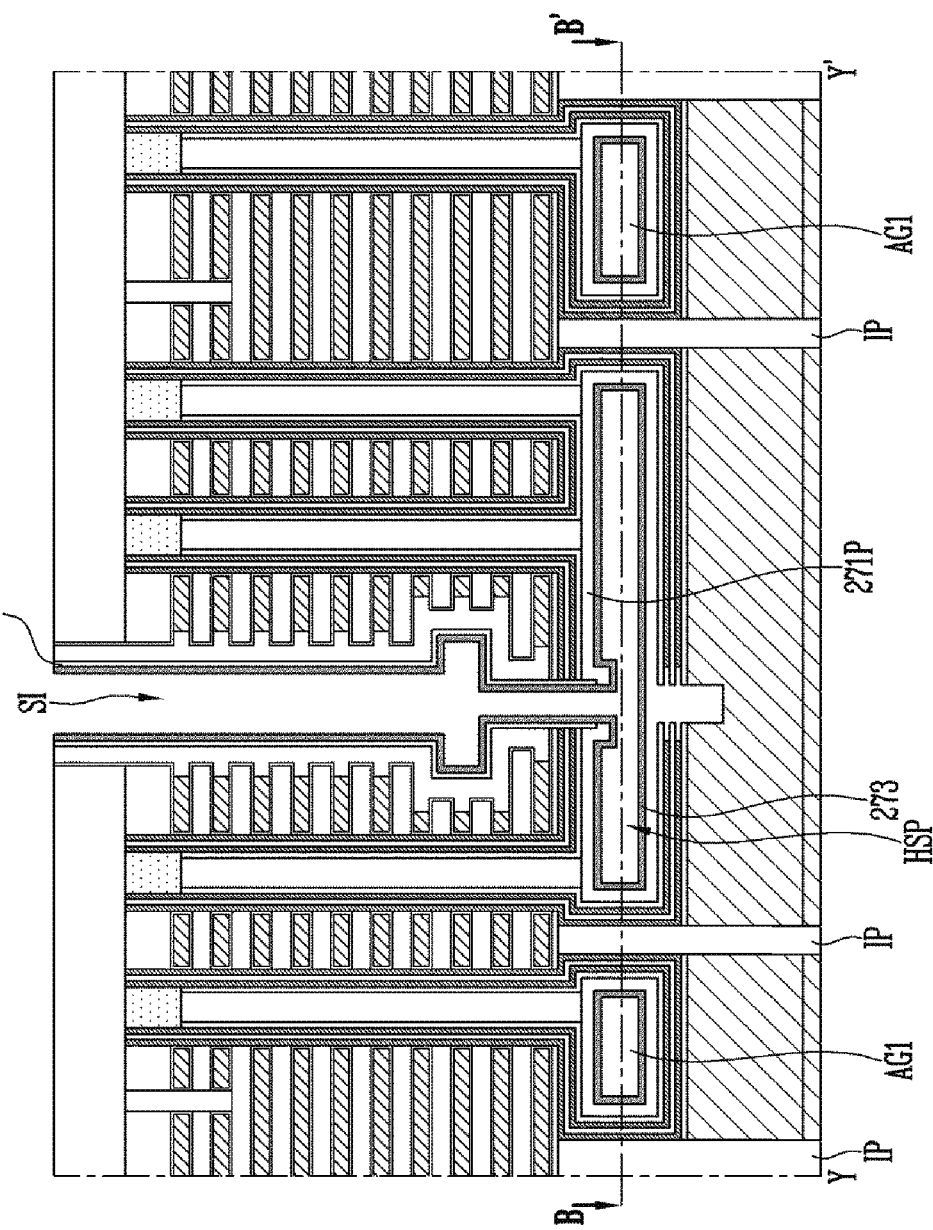
Figure 11B:
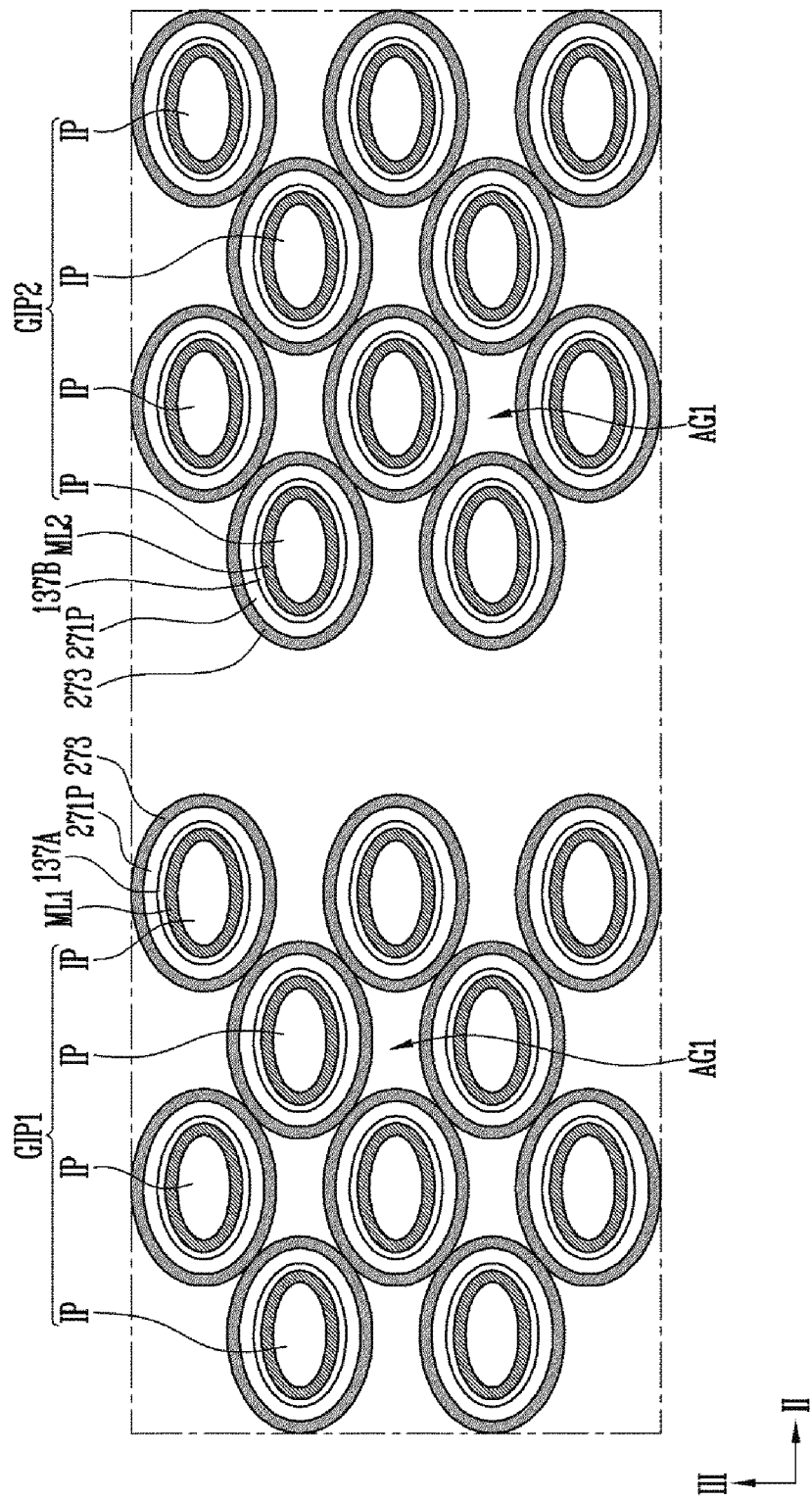

Referring to FIG. 11A, a first lower insulating layer 273 is formed on the first semiconductor pattern 271P along the surface shape of the first semiconductor pattern 271P. The first lower insulating layer 273 may be formed of an oxide layer. The first lower insulating layer 273 may extend onto the sidewall protective patterns 163. The first lower insulating layer 273 is not completely filled in the horizontal space HSP and the slit SI, and an air gap may be formed in the central region of each of the horizontal space HSP and the slit SI.

FIG. 11B illustrates a plan view taken in the horizontal direction along line B-B' shown in FIG. 11A.

Referring to FIG. 11B, each of the sidewalls of the supports IP is surrounded by the first lower insulating layer 273. One of the memory patterns ML1 and ML2, one of the channel patterns 137A and 137B, and the first semiconductor pattern 271P1 are disposed between each of the supports IP and the first lower insulating layer 273.

The supports IP may be divided into a plurality of support groups GIP1 and GIP2 by using the slit SI shown in FIG. 11A as a boundary. Each of the support groups GIP1 and GIP2 is surrounded by the first lower insulating layer 273 corresponding thereto. The first lower insulating layer 273 surrounding each of the support groups GIP1 and GIP2 fills between supports IP adjacent to each other, and may fix the first semiconductor pattern 271P such that the first semiconductor pattern 271P does not move between the supports IP. A first air gap AG1 may be formed between the supports IP constituting each of the support groups GIP1 and GIP2.

Figure 12A:
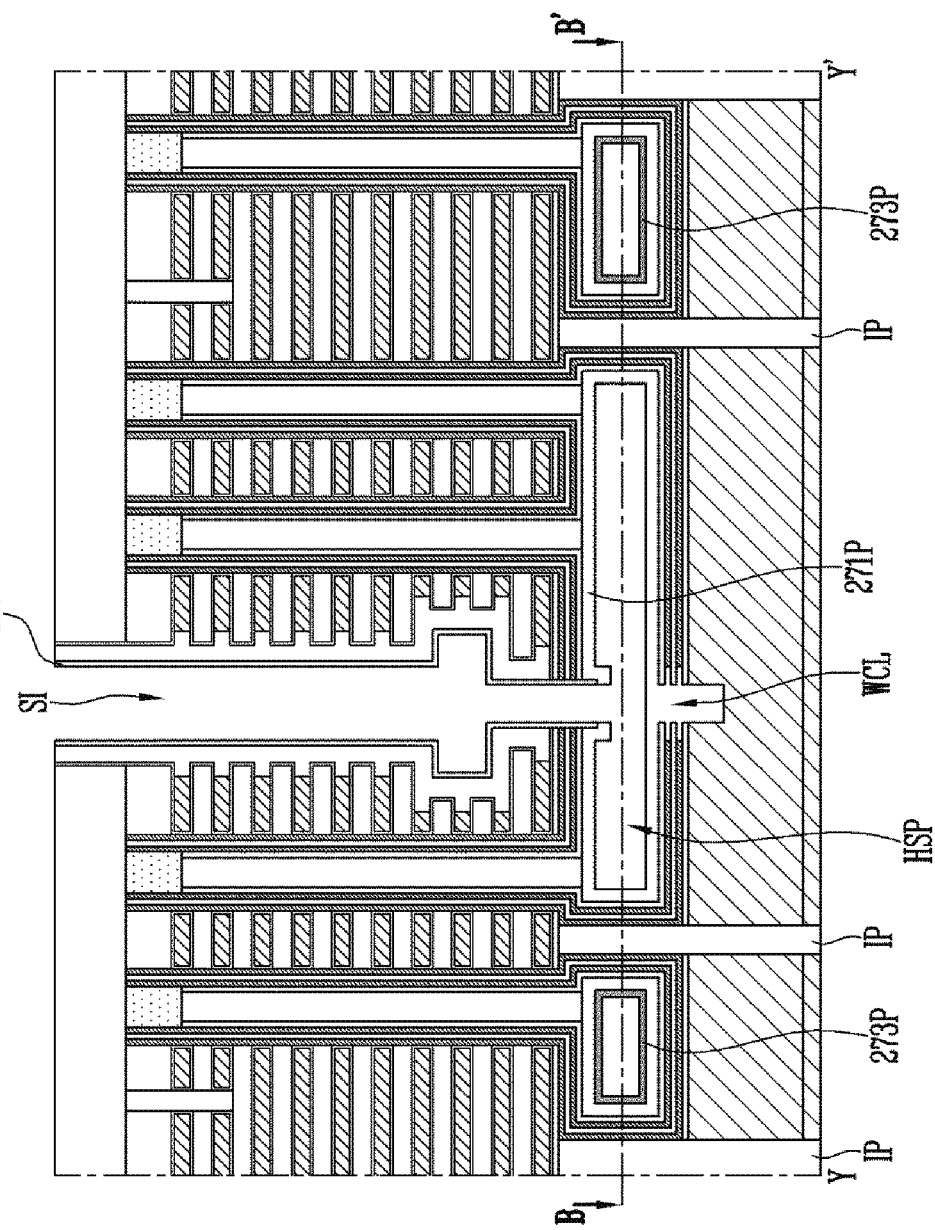
Figure 12B:
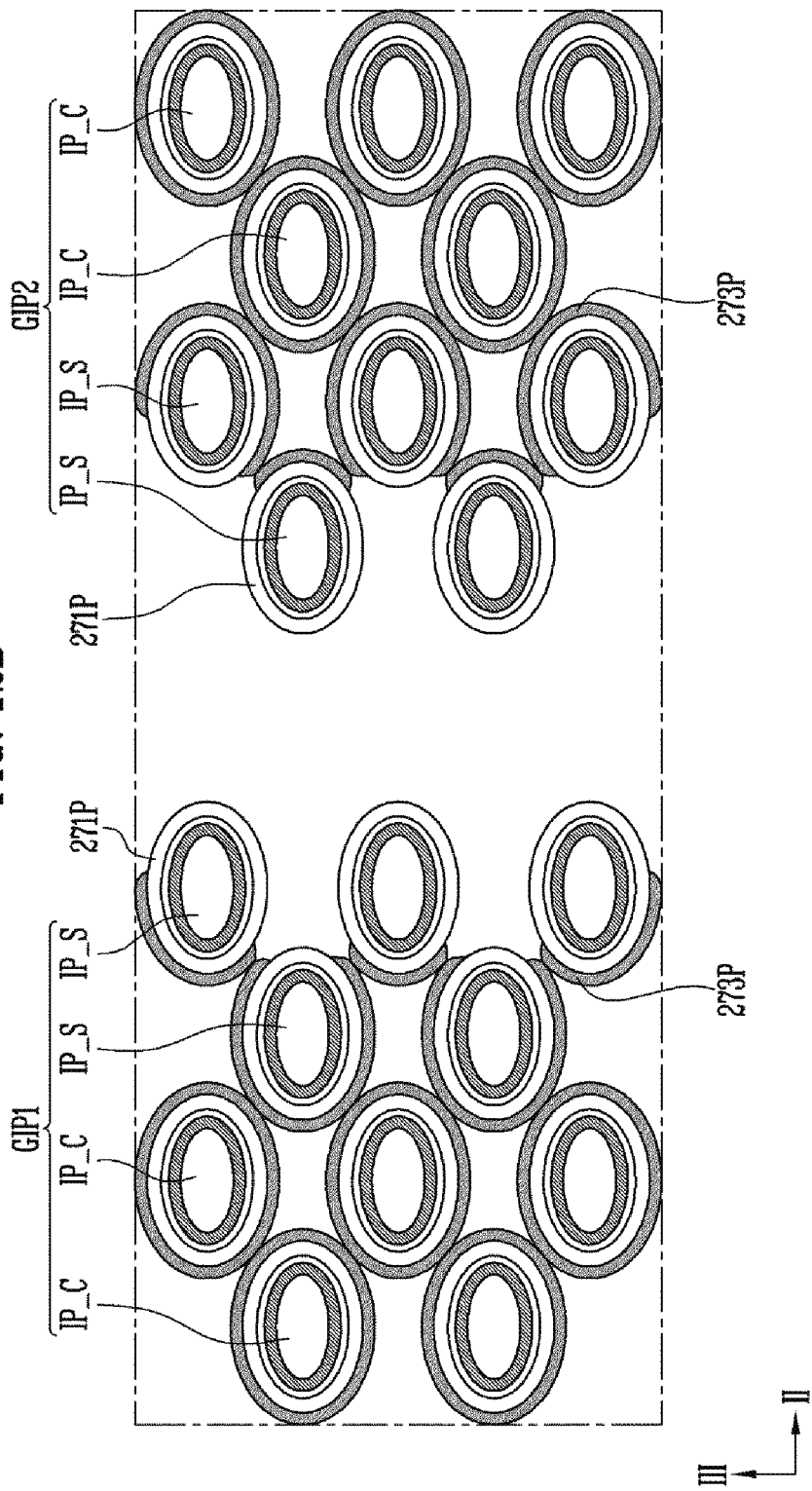

Referring to FIG. 12A, a portion of the first lower insulating layer is etched through the slit SI. Accordingly, the first lower insulating layers between the supports IP adjacent to each other remain as first lower patterns 273P. In addition, a portion of the first semiconductor pattern 271P adjacent to the slit SI is exposed.

FIG. 12B illustrates a plan view taken in the horizontal direction along line B-B' shown in FIG. 12A.

Referring to FIG. 12B, the supports included in each of the support groups GIP1 and GIP2 may be divided into slit-side supports IP_S and the other center supports IP_C. The slit-side supports IP_S are supports adjacent to the slit SI shown in FIG. 12A.

A portion of the first semiconductor pattern 271P surrounding each of the slit-side supports IP_S may be exposed through the process described with reference to FIG. 12A. The first lower pattern 273P may remain on a sidewall of the first semiconductor pattern 271P, which faces each of the center supports IP_C.

Referring to FIG. 13A, after a second semiconductor layer is formed on the exposed partial surface of the first semiconductor pattern 271P. And then a third trench T3 is formed, which exposes the well contact structure WCL of the first semiconductor pattern 271P. The third trench T3 is formed through an etching process of the second semiconductor layer, and the second semiconductor layer may be separated into second semiconductor patterns 275A and 275B by the third trench T3. Each of the second semiconductor patterns 275A and 275B has an opening 276 facing the third trench T3.

The second semiconductor layer may include a silicon layer. The thickness of the second semiconductor patterns 275A and 275B may be controlled such that the second semiconductor patterns 275A and 275B are not completely filled in the central region of the horizontal space HSP.

Figure 13B:
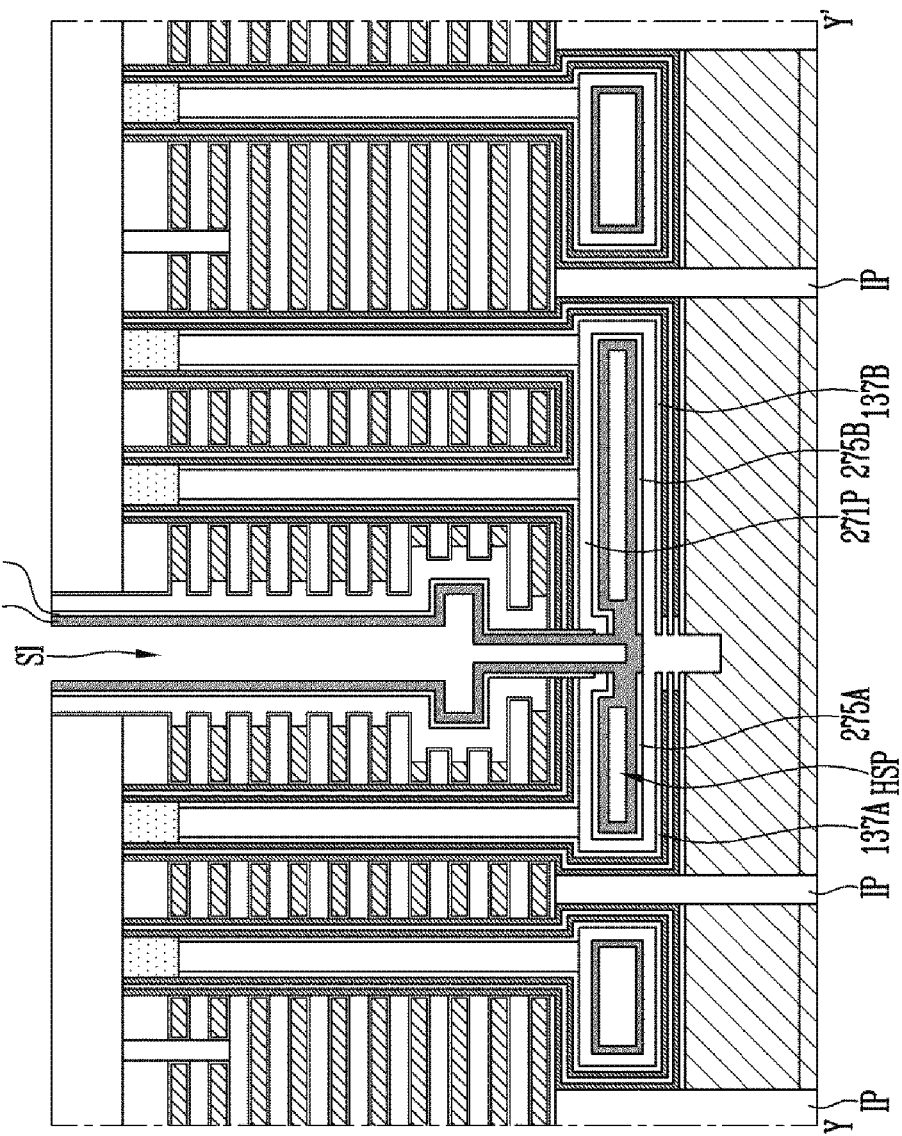
Figure 14B:
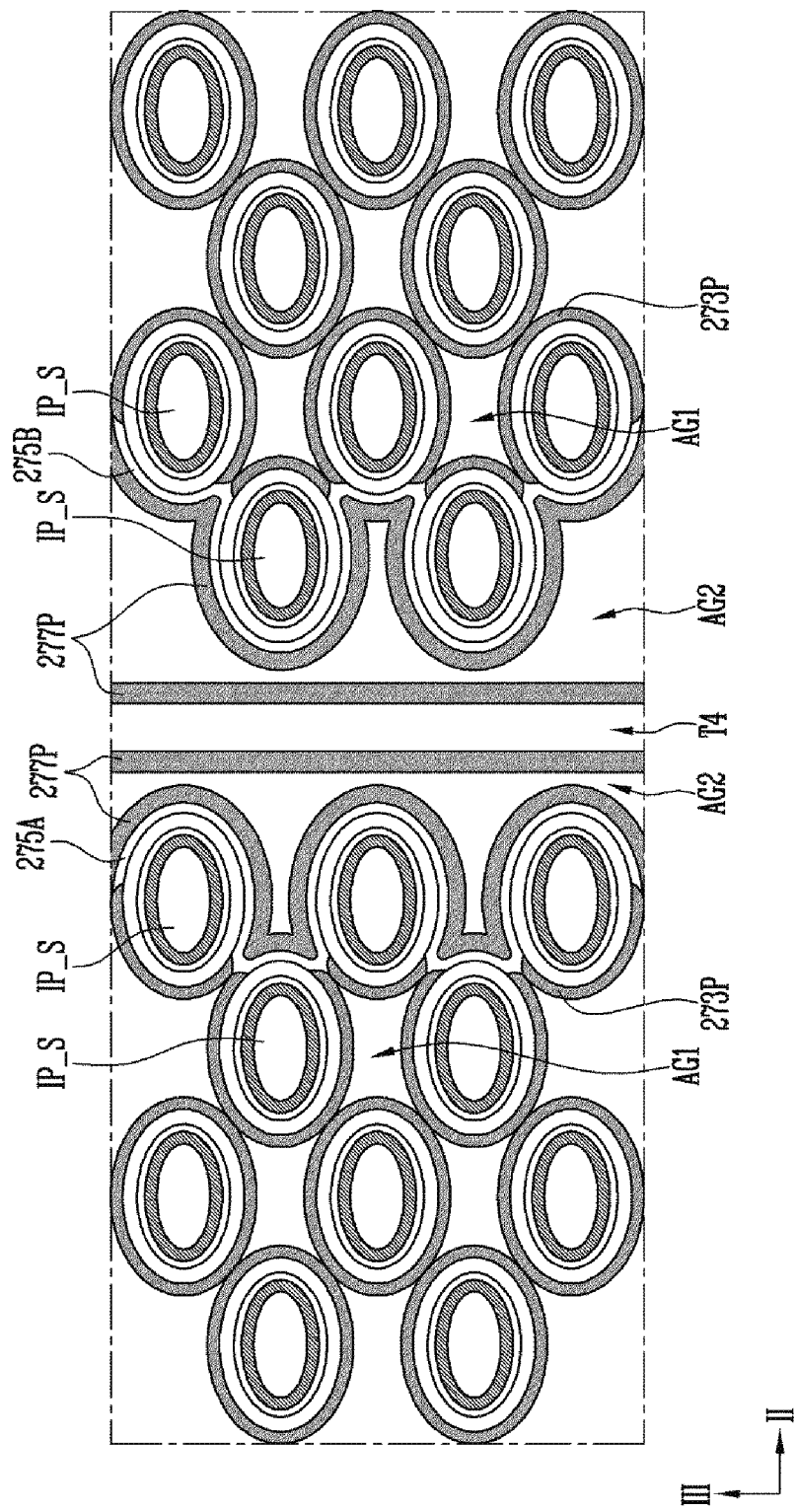

Referring to FIG. 13B, a second lower insulating layer 277 is formed on surfaces of the second semiconductor patterns 275A and 275B through the slit SI. The second lower insulating layer 277 may fill in a space between the second semiconductor patterns 275A and 275B. The second lower insulating layer 277 may extend along the sidewall of the first semiconductor pattern 271P, which is adjacent to the slit SI. The second lower insulating layer 277 may be formed of an oxide layer.

Referring to FIG. 14A, the second lower insulating layer 277 shown in FIG. 13B is etched such that the well contact structure WCL of the first semiconductor pattern 271P is exposed. Accordingly, a separating trench T4 penetrating the second lower insulating layer is formed, and the second lower insulating layer is separated into second lower patterns 277P by the separating trench T4.

The second lower patterns 277P may respectively block the openings of the second semiconductor patterns 275A and 275B shown in FIG. 13A. Accordingly, a second air gap AG2 is defined in each of the second lower patterns 277P, and the second air gap AG2 may be sealed in the horizontal space.

FIG. 14B illustrates a plan view taken in the horizontal direction along line B-B' shown in FIG. 14A.

Referring to FIG. 14B, the second air gap AG2 is defined in each of the second lower patterns 277P opposite to each other with the separating trench T4 interposed therebetween.

Each of the second lower patterns 277P extends onto a sidewall of a second semiconductor pattern corresponding thereto among the second semiconductor patterns 275A and 275B. The second semiconductor patterns 275A and 275B extend along the appearance of the sidewalls of the first semiconductor patterns 271P disposed on the slit-side supports IP_S facing the separating trench T4.

After the first semiconductor pattern 271P, the second semiconductor patterns 275A and 275B, and the first and second lower patterns 273P and 277P are formed using the processes described with reference to FIGS. 10A, 10B, 11A, 12A, 13A, 13B, and 14A, a process of forming an inter-well-source insulating layer may be continuously performed.

Figure 15A:
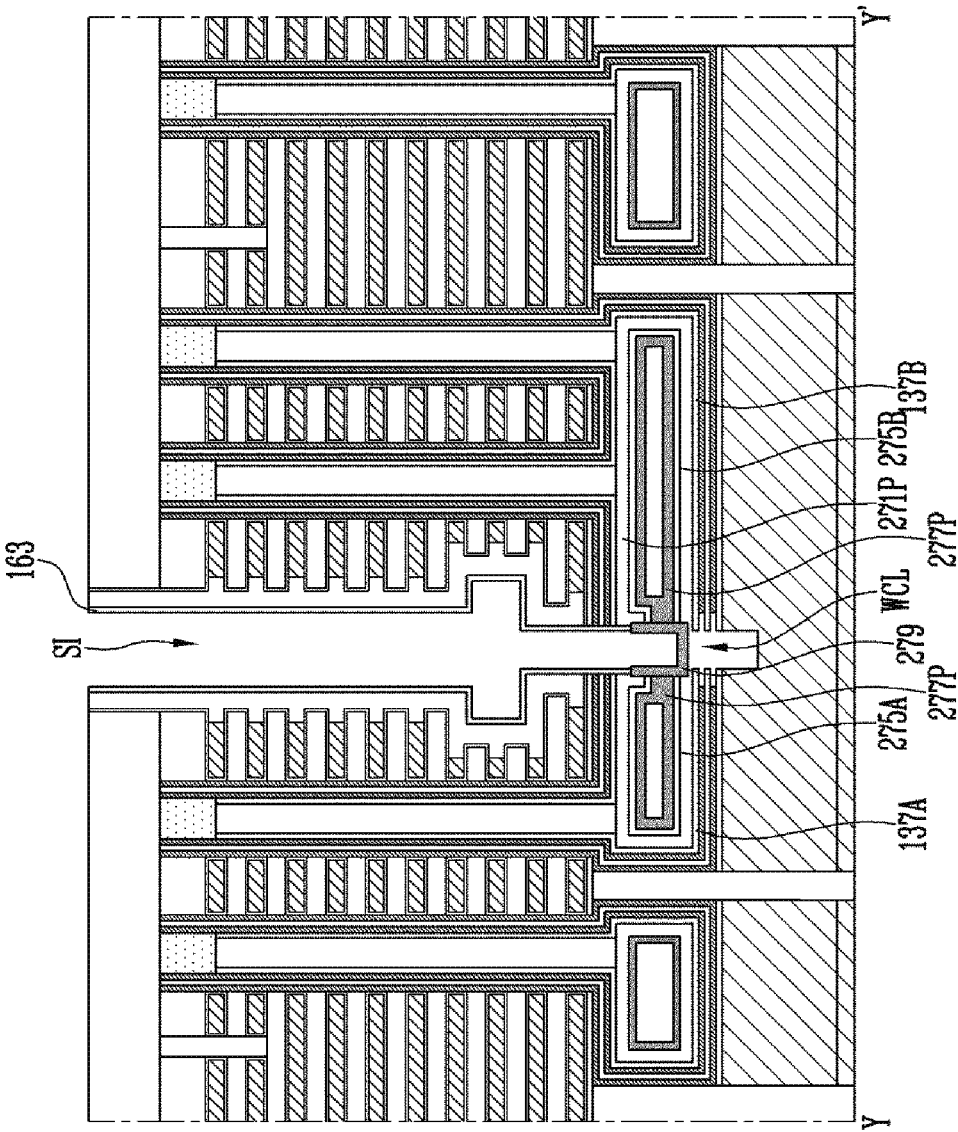

Referring to FIG. 15A, an inter-well-source insulating layer 279 may be formed by oxidizing a portion of each of the first semiconductor pattern 271P and the second semiconductor patterns 275A and 275B. A partial thickness of each of the first semiconductor pattern 271P and the second semiconductor patterns 275A and 275B is oxidized from a surface of each of the first semiconductor pattern 271P and the second semiconductor patterns 275A and 275B, which is exposed by the separating trench T4 shown in FIG. 14A. The inter-well-source insulating layer 279 formed through the above-described process is aligned on the well contact structure WCL of the first semiconductor pattern 271P exposed between the second lower patterns 277P.

Referring to FIG. 15B, the sidewall protective patterns 163 shown in FIG. 15A are removed. Accordingly, a source contact surface SU2 of each of the channel patterns 137A and 137B and the first semiconductor pattern 271P and the spacer insulating patterns 161 are exposed.

A doped semiconductor layer 281 is formed on the inter-well-source insulating layer 279. The doped semiconductor layer 281 may be a doped silicon layer including a source dopant. The source dopant is an n-type dopant. The doped semiconductor layer 281 is in contact with the source contact surface SU2 of each of the channel patterns 137A and 137B and the first semiconductor pattern 271P, and fills in a space between the spacer insulating patterns 161.

Figure 15C:
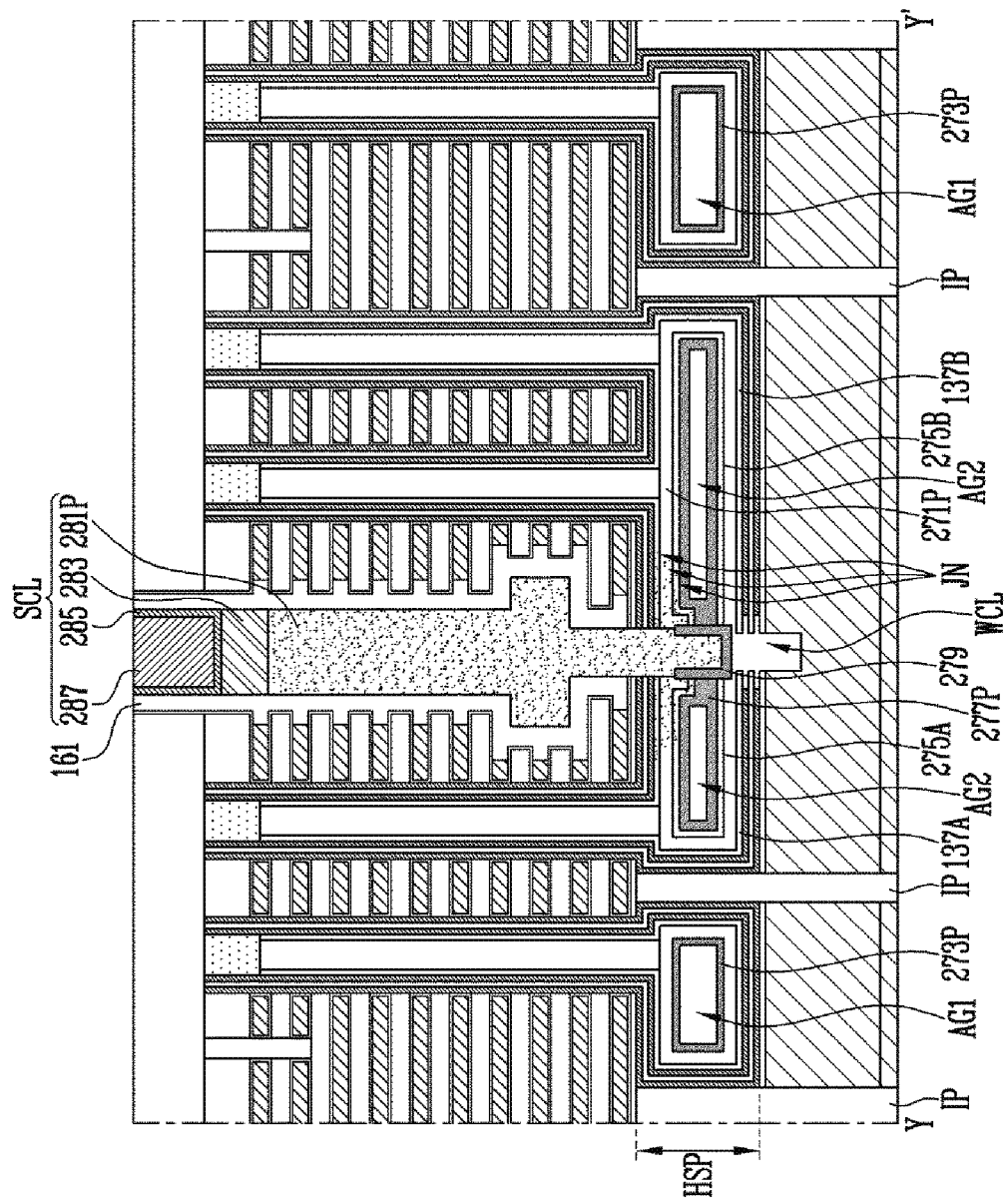

Referring to FIG. 15C, a doped semiconductor pattern 281P, a metal silicide layer 283, a metal barrier layer 285, and a metal layer 287 may be formed by performing the same processes as described in FIG. 9B. Accordingly, a source contact structure SCL is formed.

The source dopant in the doped semiconductor layer may be diffused into the channel patterns 137A and 137B, the first semiconductor pattern 271P, and the second semiconductor patterns 275A and 275B from the source contact surface SU2 of each of the channel patterns 137A and 137B and the first semiconductor pattern 271P, which are shown in FIG. 15B, during an annealing process for forming the metal silicide layer 283 as described in FIG. 9B.

Accordingly, a junction JN may be formed in each of the channel patterns 137A and 137B, the first semiconductor pattern 271P, and the second semiconductor patterns 275A and 275B.

Subsequently, subsequent processes for forming the second upper insulating layer UI2 shown in FIG. 1 and the bit line contact plug BCT and the bit line BL, which are shown in FIG. 2A, may be performed.

Figure 16:
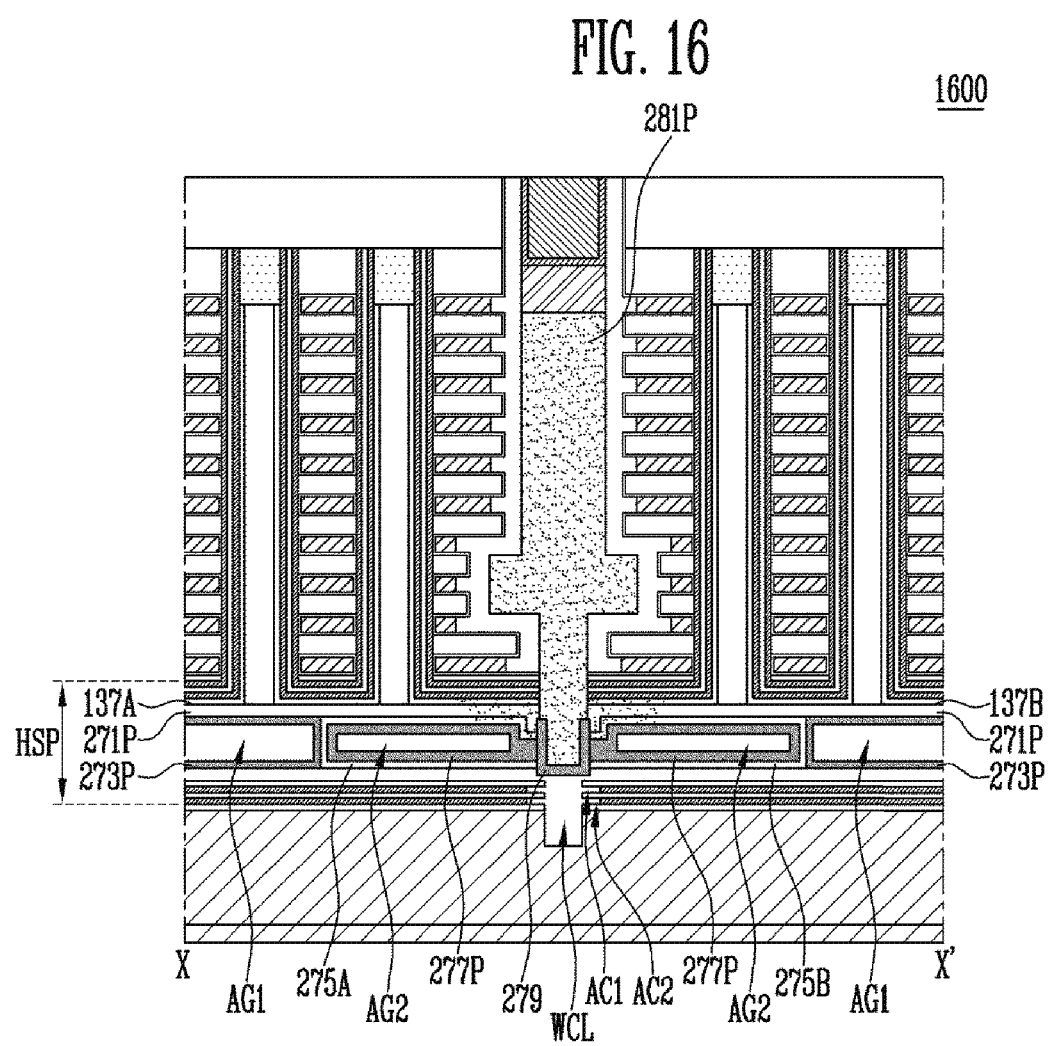
FIG. 16 shows a sectional view illustrating a semiconductor device according to a second embodiment of the present disclosure.

FIG. 16 shows a sectional view illustrating a semiconductor device 1600 according to a second embodiment of the present disclosure. FIG. 16 shows a modification of a section of the semiconductor device 1600, which is taken along the line X-X' shown in FIG. 3.

Hereinafter, characteristic components of the semiconductor device 1600 are described with reference to FIGS. 15C and 16, and descriptions of components redundant with those of the semiconductor device 100 are omitted.

Referring to FIGS. 15C and 16, the semiconductor device 1600 according to the present disclosure may include the first semiconductor pattern 271P disposed on the surface of each of the channel patterns 137A and 137B in the horizontal space HSP. The first semiconductor pattern 271P may include the well contact structure WCL and the first and second auxiliary contact structures AC1 and AC2 as described with reference to FIG. 10B. The first semiconductor pattern 271P may be conformally formed along the surface of the horizontal space HSP to open a central region of the horizontal space HSP. The first semiconductor pattern 271P may extend to be in direct contact with the sidewall of the doped semiconductor pattern 281P.

The well contact structure WCL of the first semiconductor pattern 271P is aligned under the doped semiconductor pattern 281P. The first auxiliary contact structures AC1 protrude between memory patterns ML1 and ML2 and the channel patterns 137A and 137B from the well contact structure WCL. The second auxiliary contact structures AC2 protrude between the memory patterns ML1 and ML2 and the well structure WE. Accordingly, the first semiconductor pattern 271P according to the present disclosure can increase the contact area between the channel patterns 137A and 137B and the well structure WE.

The lower insulating patterns 273P and 277P may be formed on the surface of the first semiconductor pattern 271P. The first air gap AG1 may be formed in the first lower pattern 273P among the lower insulating patterns 237P and 277P. The second air gap AG2 may be formed in the second lower pattern 277P among the lower insulating patterns 237P and 277P. The second lower pattern 277P is disposed between the first lower pattern 273P and the doped semiconductor pattern 281P. By the second lower pattern 277P, the well contact structure WCL of the first semiconductor pattern 271P may be separated from an upper end portion of the first semiconductor pattern 271P, which is in contact with the doped semiconductor pattern 281P.

A corresponding second semiconductor pattern among the second semiconductor patterns 275A and 275B may be formed on an outer wall of the second lower pattern 277P. Each of the second semiconductor patterns 275A and 275B extends between the first semiconductor pattern 271P and a second lower pattern 277P corresponding thereto. Each of the second semiconductor patterns 275A and 275B extends between a second lower pattern 277P corresponding thereto and the first lower pattern 273P facing the second lower pattern 277P.

The inter-well-source insulating layer 279 may have a U-shaped sectional structure surrounding a lower end of the doped semiconductor pattern 281P.

According to the present disclosure, memory cells are formed along the extending direction of a channel pattern penetrating stack structures, so that the degree of integration of the memory cells can be improved.

According to the present disclosure, the loss of cell current flowing through the channel pattern is prevented, so that the operational reliability of the semiconductor device 1600 can be enhanced.

According to the present disclosure, the stability of a process of forming a slit by using an etch stop pattern can be enhanced.

Figure 17:
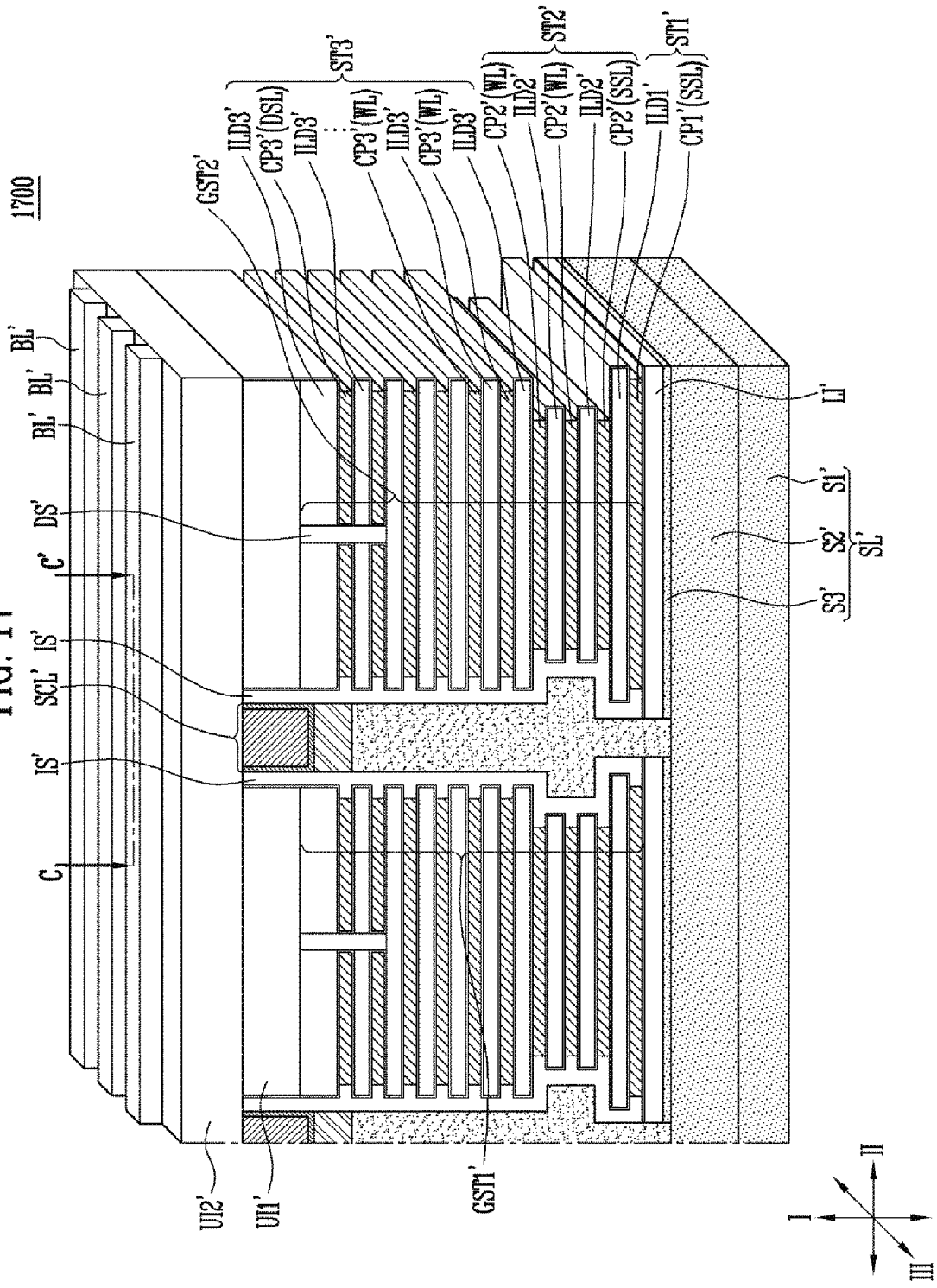
FIG. 17 shows a perspective view illustrating a semiconductor device according to a third embodiment of the present disclosure.

FIG. 17 shows a perspective view illustrating a semiconductor device according to a third embodiment of the present disclosure. For convenience of description, not all components are illustrated.

Referring to FIG. 17, the semiconductor device 1700 may include first and second gate stack structures GST1' and GST2', which face each other, a source contact structure SCL' extending in a first direction I between the first and second gate stack structures GST1' and GST2', spacer insulating patterns IS' disposed between each of the first and second gate stack structures GST1' and GST2' and the source contact structure SCL', and a source structure SL' which is disposed under the source contact structure SCL' and extends to overlap with the first and second gate stack structures GST1' and GST2'.

In an embodiment, the source structure SL' may include a first semiconductor layer S1, a channel connecting pattern S2', and a second semiconductor layer S3'. The channel connection pattern S2' may extend between each of the first and second gate stack structures GST1' and GST2' and the first semiconductor layer S1'. The second semiconductor layer S3' may extend between each of the first and second gate stack structures GST1' and GST2' and the channel connecting pattern S3'. In other words, the channel connecting pattern S2' may be disposed between the first semiconductor layer S1' and the second semiconductor layer S3'. However, the present disclosure is not limited thereto. In an embodiment, the second semiconductor layer S3' may be omitted.

The source structure SL' may be a doped structure in which an n-type dopant or a p-type dopant is doped. The n-type dopant and the p-type dopant may be doped in each of the first semiconductor layer S1', the channel connecting pattern S2, and the second semiconductor layer S3'. In an embodiment, each of the first semiconductor layer S1, the channel connecting pattern S2, and the second semiconductor layer S3' may include an n-type doped silicon layer or a p-type doped silicon layer. Although not shown in the drawing, a substrate including a driving circuit may be disposed under the source structure SL'. The source structure SL' may overlap with the driving circuit.

The first and second gate stack structures GST1' and GST2' may be disposed on the source structure SL'. The first and second gate stack structures GST1' and GST2' may be spaced apart from each other in a second direction II on the source structure SL'. Each of the first and second gate stack structures GST1' and GST2' may include a first stack structure ST1, a second stack structure ST2, and a third stack structure ST3', which are continuously stacked in the first direction I.

The first stack structure ST1' may include at least one pair of a first conductive pattern CP1' and a first interlayer insulating layer ILD1, which are alternately stacked in the first direction I. In an embodiment, the first stack structure ST1' may include a pair of a first conductive pattern CP1' and a first interlayer insulating layer ILD1'. The first conductive pattern CP1' may be disposed in a lowermost layer of the first stack structure ST1'. The semiconductor layer 1700 may include a lower insulating layer LI' disposed between the first stack structure ST1' and the source structure SL'.

The second stack structure ST2' may include at least one pair of a second conductive pattern CP2' and a second interlayer insulating layer ILD2'. In an embodiment, the second stack structure ST2' may include a plurality of second conductive patterns CP2' and a plurality of second interlayer insulating layers ILD2'. A stacked number of the second conductive patterns CP2' and the second interlayer insulating layers ILD2, which constitute the second stack structure ST2, may be variously changed according to a thickness of an etch stop pattern.

The third stack structure ST3' may include a plurality of third conductive patterns CP3' and a plurality of third interlayer insulating layer ILD3, which are alternately stacked in the first direction I. A stacked number of the third conductive patterns CP3' and the third interlayer insulating layers ILD3', which constitute the third stack structure ST3' may be variously changed according to a stacked number of memory cells and select transistors, which constitute the semiconductor device. At least one layer from an uppermost layer among the third conductive patterns CP3' may be penetrated by a select line separating structure DS'.

The first to third conductive patterns CP1' to CP3' may be used as the gate lines SSL, WL, and DSL described with reference to FIG. 1.

The spacer insulating patterns IS' may be formed on sidewalls of the first and second gate stack structures GST1' and GST2'. The spacer insulating patterns IS' may insulate the source contact structure SCL' from the first and second gate stack structures GST1' and GST2'.

The source contact structure SCL' may be formed to fill a space between spacer insulating patterns IS' adjacent to each other between the first and second gate stack structures GST1' and GST2'. The source contact structure SCL' may be formed of various conductive materials to transfer an electrical signal. The source contact structure SCL' may be in contact with the source structure SL', and extend in the first direction I.

The gate stack structures GST1' and GST2' may be covered by upper insulating layers UI1' and UI2'. In an embodiment, the upper insulating layers UI1' and UI2' may include a first upper insulating layer UI1' and a second upper insulating layer UI2' disposed on the first upper insulating layer UI1'. Each of the first upper insulating layer UI1' and the second upper insulating layer UI2' may be formed of an insulating material such as an oxide layer.

A plurality of bit lines BL' may be disposed on the second upper insulating layer UI2'. The bit lines BL' which transfer an electrical signal may be electrically insulated from the source contact structure SCL' by the second upper insulating layer UI2'.

Figure 18:
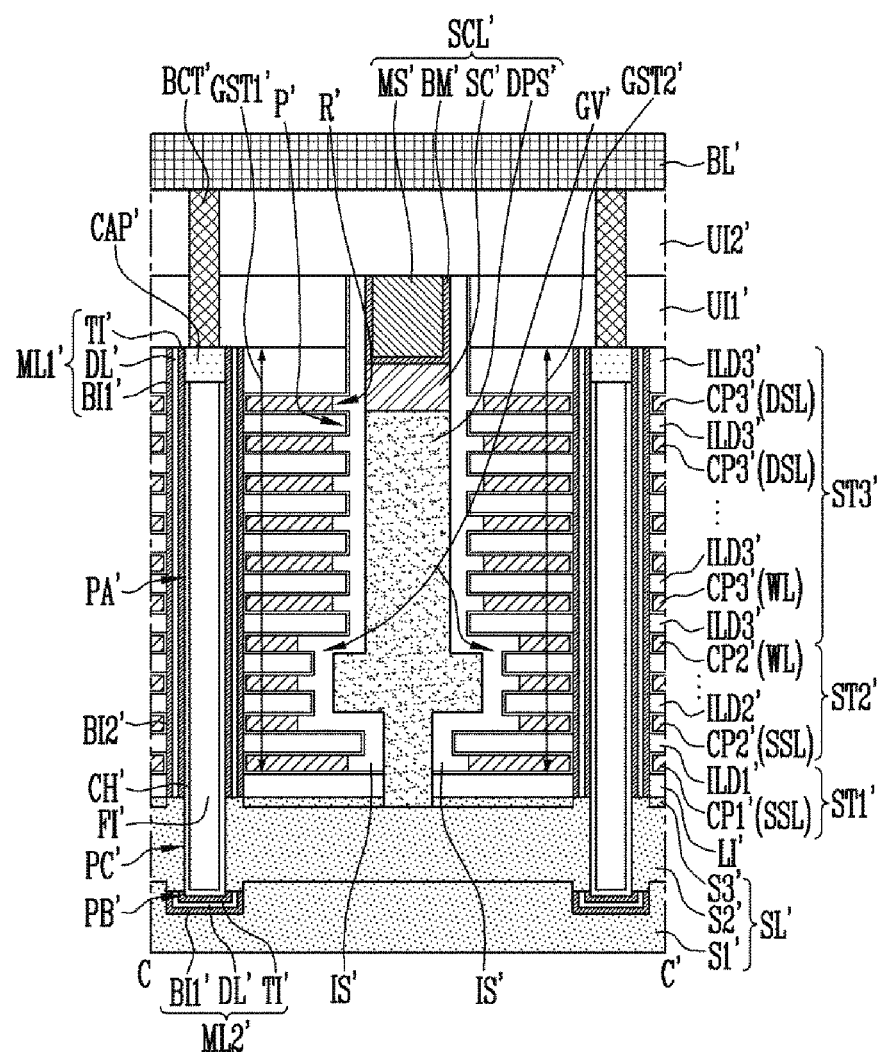
FIG. 18 shows a sectional view of the semiconductor device taken along a line C-C' shown in FIG. 17.

FIG. 18 shows a sectional view of the semiconductor device taken along a line C-C' shown in FIG. 17.

Referring to FIG. 18, the first and second gate stack structures GST1' and GST2' may be penetrated by channel patterns CH' and first memory patterns ML1'. The channel patterns CH' may penetrate the lower insulating layer LI' and extend into the source structure SL'. The first memory patterns ML1' may penetrate the lower insulating layer LI' and be disposed on the source structure SL'.

A central region of each of the channel patterns CH' may be filled with an insulating pattern FI'. In an embodiment, each of the channel patterns CH' may extend along a sidewall and a bottom surface of the insulating pattern FI'. A capping pattern CAP' may be disposed on the insulating pattern FI'. The capping pattern CAP' may be used as a junction. Each of the channel patterns CH' may be configured as a semiconductor layer. In an embodiment, each of the channel patterns CH' may include silicon. The capping pattern CAP' may be configured as a doped semiconductor layer. In an embodiment, the capping pattern CAP' may include an n-type dopant.

Each of the channel patterns CH' may include a first part PA', a second part PB', and a third part PC'. The first part PA' may be surrounded by the first gate stack structure GST1' or the second gate stack structure GST2'. The second part PB' and the third part PC' may be surrounded by the source structure SL'. The third part PC' may be disposed between the first part PA' and the second part PB', and a sidewall of the third part PC' may be in contact with the source structure SL'. The second part PB' may be spaced apart from the source structure SL' by a second memory pattern ML2'. In other words, the second memory pattern ML2' may be disposed between the source structure SL' and the second part PB' of each of the channel patterns CH'.

The first memory pattern ML1' may surround the first part PA' of the channel pattern CH' and a sidewall of the capping pattern CAP'. The second memory pattern ML2' may surround the second part PB' of the channel pattern CH'. The second memory pattern ML2' may be separated from the first memory pattern ML1' by the source structure SL'. Each of the first memory pattern ML1' and the second memory pattern ML2' may include a tunnel insulating layer TI, a data storage layer DL', and a first blocking insulating layer BI1, which are the same materials as the tunnel insulating layer TI, the data storage layer DL, and the first blocking insulating layer BI1, which are described with reference to FIG. 2A.

The first semiconductor layer S1' of the source structure SL' may surround the second memory pattern ML2'. The second semiconductor layer S3' of the source structure SL' may extend along a bottom surface of each of the first and second gate stack structures GST1' and GST2'. The channel connecting pattern S2' of the source structure SL' may include protrusion parts extending between the first semiconductor layer S1' and the channel pattern CH' and between the second semiconductor layer S3' and the channel pattern CH'.

The first stack structure ST1', the second stack structure ST2', and the third stack structure ST3' of each of the first and second gate stack structures GST1' and GST2' may define a groove GV' in a sidewall of each of the first and second gate stack structures GST1' and GST2'. In an embodiment, the first stack structure ST1' and the third stack structure ST3' may protrude farther in the second direction II shown in FIG. 17 than the second stack structure ST2'. Accordingly, the groove GV' may be defined between the first stack structure ST1' and the third stack structure ST3'.

The first to third conductive patterns CP1' to CP3' and the first to third interlayer insulating layers ILD1' to ILD3' may be formed in a structure defining protrusions P' and recesses R' the same as the first to third conductive patterns CP1 to CP3 and the first to third interlayer insulating layers ILD1 to ILD3, which are described with reference to FIG. 4. A second blocking insulating layer BI2' may be disposed between each of the first to third conductive patterns CP1' to CP3' and the first memory pattern ML1'. The second blocking insulating layer BI2' may extend between each of the first to third interlayer insulating layers ILD1' to ILD3' and the spacer insulating pattern IS'.

The spacer insulating pattern IS' may be formed to fill the recesses R'. The source contact structure SCL' may be formed on a sidewall of the spacer insulating pattern IS'. The source contact structure SCL' may include a vertical part and a horizontal protrusion part as described with reference to FIG. 2A. The source contact structure SCL' may be formed of various conductive materials capable of transferring an electrical signal. In an embodiment, the source contact structure SCL' may include a doped semiconductor pattern DPS', a metal silicide layer SC, a metal layer MS, and a metal barrier layer BM'.

The doped semiconductor pattern DPS' of the source contact structure SCL' may be formed on the spacer insulating pattern IS'. The doped semiconductor pattern DPS' may include a vertical part and a horizontal protrusion part as described with reference to FIG. 2A. In an embodiment, the doped semiconductor pattern DPS' may fill a central region of the groove GV' between the first and second gate stack structures GST1' and GST2', and extend to be in contact with the source structure SL'. In an embodiment, the doped semiconductor pattern DPS' may penetrate the lower insulating layer LI, and be in contact with the channel connecting pattern S2'. The second semiconductor layer S3' may be in contact with a sidewall of the doped semiconductor pattern DPS'.

The doped semiconductor pattern DPS' may include a source dopant. In an embodiment, the source dopant may include an n-type dopant.

The metal layer MS' and the metal silicide layer SC' of the source structure SL' may be formed of the same material layers as the metal layer MS and the metal silicide layer SC, which are described with reference to FIG. 4. The metal layer MS' and the metal silicide layer SC' of the source structure SL' may be formed in a structure similar to that of the metal layer MS and the metal silicide layer SC, which are described with reference to FIG. 4.

The bit line BL' may overlap with the first and second gate stack structures GST1' and GST2' with the first and second upper insulating layers UI1' and UI2' interposed therebetween. The bit line BL' may be connected to the capping pattern CAP' via a bit line contact plug BCT' penetrating the first and second upper insulating layers UI1' and UI2'.

FIGS. 19A to 19F show sectional views illustrating a manufacturing method of the semiconductor device according to the third embodiment of the present disclosure.

Figure 19A:
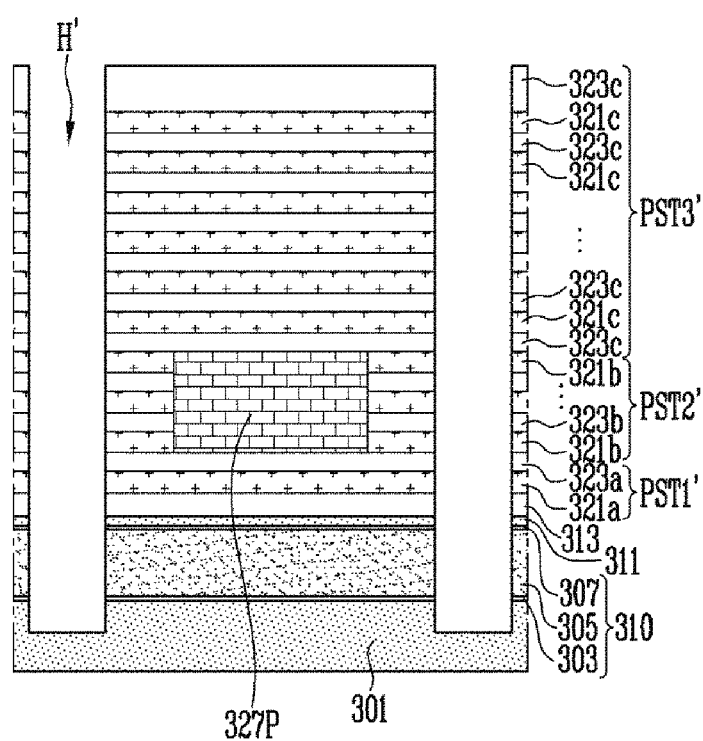
FIGS. 19A to 19F show sectional views illustrating a manufacturing method of the semiconductor device according to the third embodiment of the present disclosure.

Referring to FIG. 19A, a sacrificial structure 310 may be formed on a first semiconductor layer 301. In an embodiment, the sacrificial structure 310 may include a first protective layer 303, a sacrificial source layer 305, and a second protective layer 307, which are sequentially stacked on the first semiconductor layer 301.

The first semiconductor layer 301 may include an n-type dopant or a p-type dopant. The first protective layer 303 and the second protective layer 307 may include a material having an etch selectivity with respect to the first semiconductor layer 301. In an embodiment, the first protective layer 303 and the second protective layer 307 may include an oxide layer. In an embodiment, the first semiconductor layer 301 may include silicon.

Subsequently, a lower insulating layer 313 may be formed on the sacrificial structure 310. In an embodiment, before the lower insulating layer 313 is formed, a second semiconductor layer 311 may be formed on the sacrificial structure 310. In an embodiment, the second semiconductor layer 311 may include silicon, and the lower insulating layer 313 may include an oxide layer.

Subsequently, a first stack structure PST1, a second stack structure PST2, an etch stop pattern 327P, and a third stack structure PST3' on the lower insulating layer 313. The first stack structure PST1' may be formed in a structure in which a first material layer 321a and a second material layer 323a are stacked as described with reference to FIG. 5A. The second stack structure PST2' may include first material layers 321b and second material layers 323b, which are alternately stacked on the first stack structure PST1, as described with reference to FIG. 5B. The etch stop pattern 327P may be formed to penetrate the second stack structure PST2' by using the processes described with reference to FIGS. 5A and 5B. The third stack structure PST3' may include first material layers 321c and second material layers 323c, which are alternately stacked on the second stack structure PST2', as described with reference to FIG. 5D, and extend to cover the etch stop pattern 327P.

Subsequently, holes H' may be formed, which penetrate the first to third stack structures PST1' to PST3' and the lower insulating layer 313. The holes H' may penetrate the second semiconductor layer 311. The holes H' may penetrate the sacrificial structure 310 and extend into the first semiconductor layer 301. The holes H' may be formed while avoiding the etch stop pattern 327P. A bottom surface of each of the holes H' may be defined in the first semiconductor layer 301.

Figure 19B:
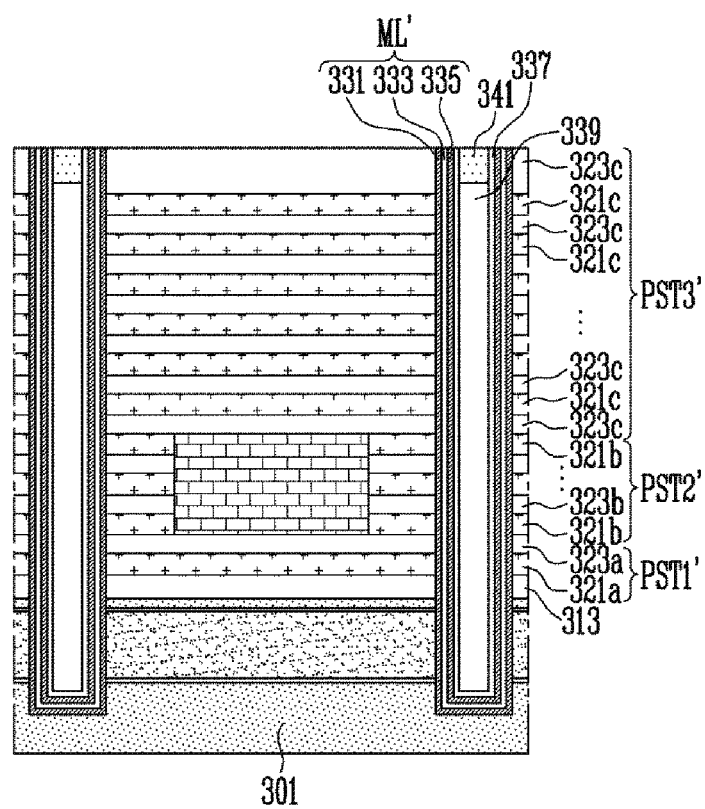

Referring to FIG. 19B, a memory layer ML' is formed on a surface of each of the holes H'. The memory layer ML' may include a first blocking insulating layer 331, a data storage layer 333 on the first blocking insulating layer 331, and a tunnel insulating layer 335 on the data storage layer 333 as described with reference to FIG. 6B. Subsequently, a channel layer 337 may be formed on a surface of the memory layer ML'. In an embodiment, the channel layer 337 may be formed by depositing a silicon layer. Subsequently, a central region of each of the holes H' which is not filled with the channel layer 337 but opened may be filled with an insulating pattern 339 and a doped semiconductor layer 341 as described with reference to FIG. 6D.

Figure 19C:
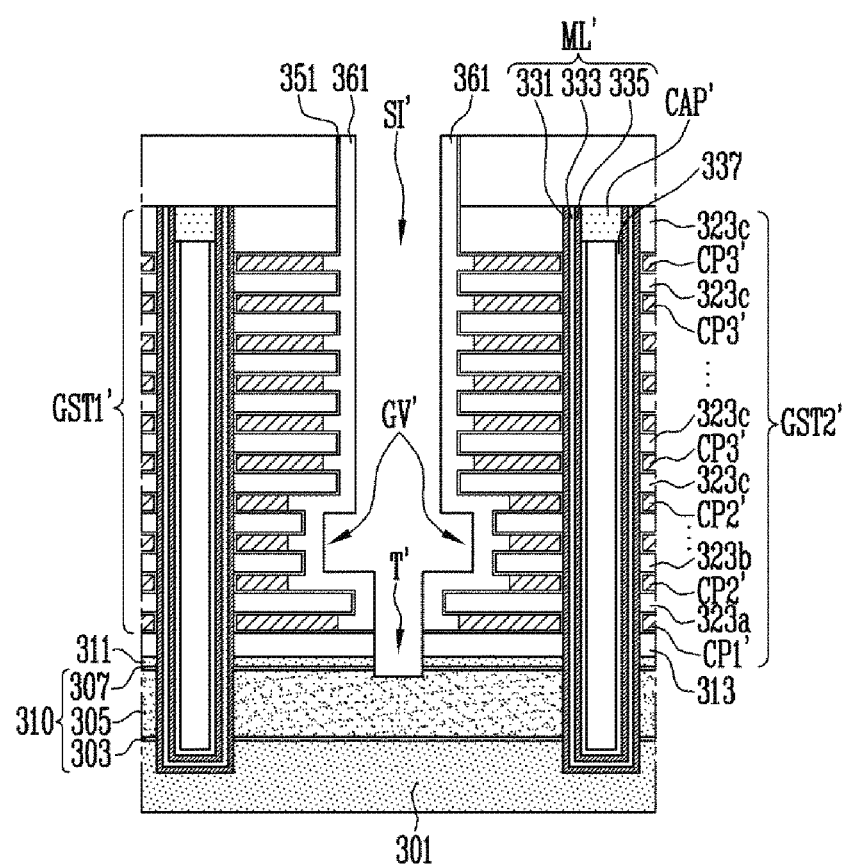

Referring to FIG. 19C, first and second gate stack structures GST1' and GST2' may be formed, which are separated from each other by a slit SI' and include first to third conductive patterns CP1' to CP3'. The slit SI' and the first and second gate stack structures GST1' and GST2' may be formed by using the same processes as those described with reference to FIGS. 7A to 7G.

The first material layers 321a, 321b, and 321c shown in FIG. 19B may be removed so as to form the first to third conductive patterns CP1' to CP3'. Before, the first to third conductive patterns CP1' to CP3' are formed, a second blocking insulating layer 351 may be formed in regions in the first material layers 321a, 321b, and 321c shown in FIG. 19B are removed. The second blocking insulating layer 351 may extend onto a sidewall of the slit SI'. A capping pattern CAP' as a doping region may be defined when a dopant in the doped semiconductor layer 341 shown in FIG. 19B is diffused into the channel layer 337 while the second blocking insulating layer 351 is forming as described with reference to FIG. 7F.

Subsequently, a spacer insulating pattern 361 may be formed on the sidewall of the slit SI' as described with reference to FIG. 8B. A groove GV' defined on a sidewall of each of the first and second gate stack structures GST1' and GST2' is not completely filled with the spacer insulating pattern 361, but a central region of the groove GV' may be opened.

Subsequently, a trench T' may be defined by etching the lower insulating layer 313, the second semiconductor layer 311, and the second protective layer 307 through the slit SI'. The trench T' may be connected to the slit SI' and expose the sacrificial source layer 305.

Figure 19D:
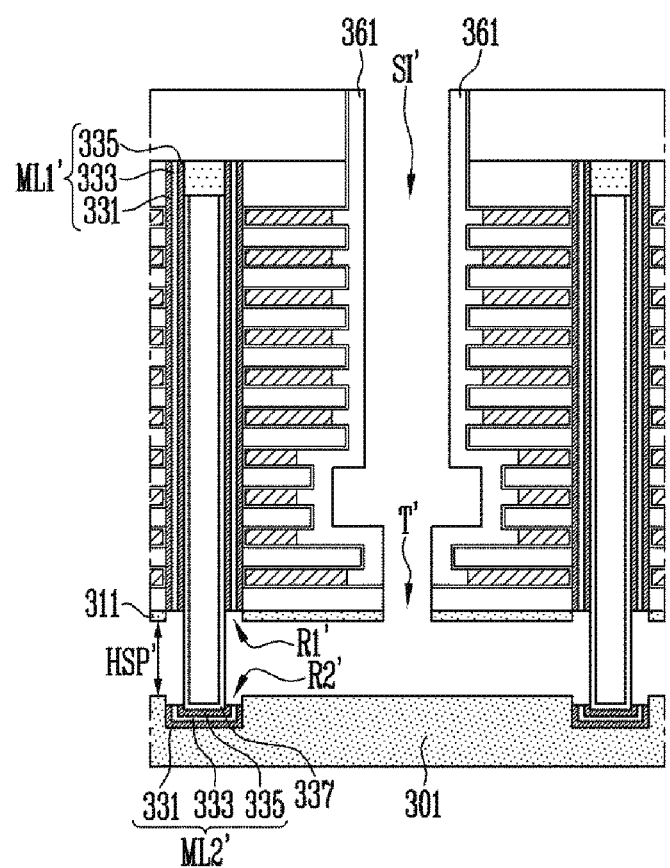

Referring to FIG. 19D, the sacrificial source layer 305 shown in FIG. 19C may be selectively removed through the slit SI' and the trench T'. Thickness loss of the first semiconductor layer 301 and the second semiconductor layer 311 may be prevented by the first protective layer 303 and the second protective layer 307, which are shown in FIG. 19C, while the sacrificial source layer 305 is being removed.

Subsequently, a portion of each of the first blocking insulating layer 331, the data storage layer 333, and the tunnel insulating layer 335 may be removed such that a sidewall of the channel layer 337 is exposed between the first semiconductor layer 301 and the second semiconductor layer 311. The first blocking insulating layer 331, the data storage layer 333, and the tunnel insulating layer 335 may be etched such that a first recess region R1' is defined between the channel layer 337 and the second semiconductor layer 311. A second recess region R2' may be defined between the channel layer 337 and the first semiconductor layer 301 through an etching process for defining the first recess region R1'. The first protective layer 303 and the second protective layer 307, which are shown in FIG. 19C, may be removed while the portion of each of the first blocking insulating layer 331, the data storage layer 333, and the tunnel insulating layer 335 is being removed. Accordingly, a horizontal space HSP' exposing the channel layer 337, the first semiconductor layer 301, and the second semiconductor layer 311 may be defined between the first semiconductor layer 301 and the second semiconductor layer 311.

Figure 19E:
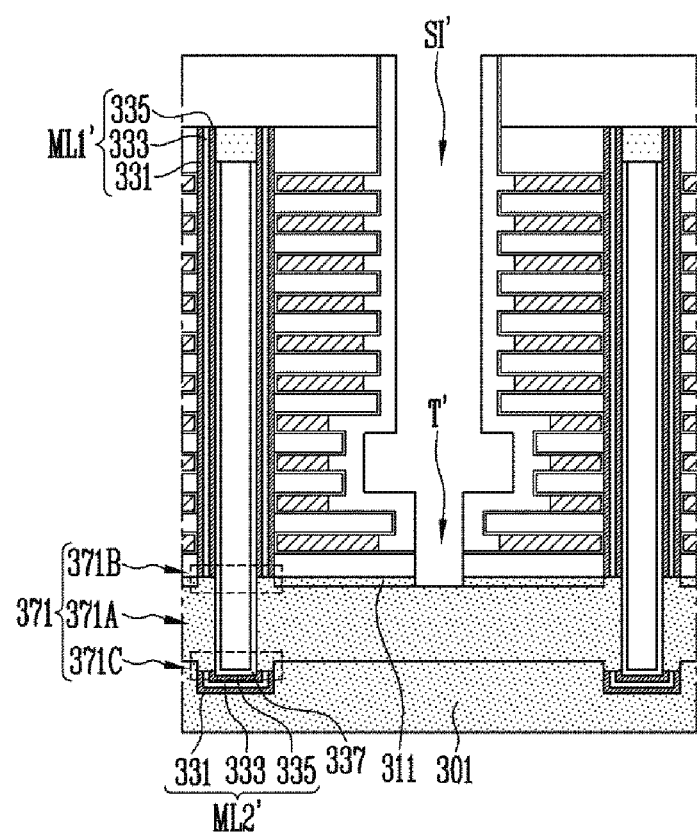

Referring to FIG. 19E, the horizontal space HSP, the first recess region R1, and the second recess region R2', which are shown in FIG. 19D, may be filled with a channel connecting pattern 371. The channel connecting pattern 371 may be formed by using a selective growth process or be formed by using a deposition process such as a chemical vapor deposition process. According to the present disclosure, although the deposition process is used, the horizontal space HSP', the first recess region R1', and the second recess region R2' may be easily filled with the channel connecting pattern 371 through the groove GV' described with reference to FIG. 19C. The channel connecting pattern 371 may be configured as a doped semiconductor layer including a source dopant. In an embodiment, the source dopant may include an n-type dopant.

The channel connecting pattern 371 may include a horizontal part 371A, and a first protrusion part 371B and a second protrusion part 371C, which protrude from the horizontal part 371A. The horizontal part 371A may be in contact with the first semiconductor layer 301 and the second semiconductor layer 311, and fill the horizontal space shown in FIG. 19D. The horizontal part 371A may be in contact with the sidewall of the channel layer 337 between the first semiconductor layer 310 and the second semiconductor layer 311. The first protrusion part 371B may be in contact with the second semiconductor layer 311 and the channel layer 337 between the second semiconductor layer 311 and the channel layer 337. The second protrusion part 371C may be in contact with the first semiconductor layer 301 and the channel layer 337 between the first semiconductor layer 301 and the channel layer 337.

Figure 19F:
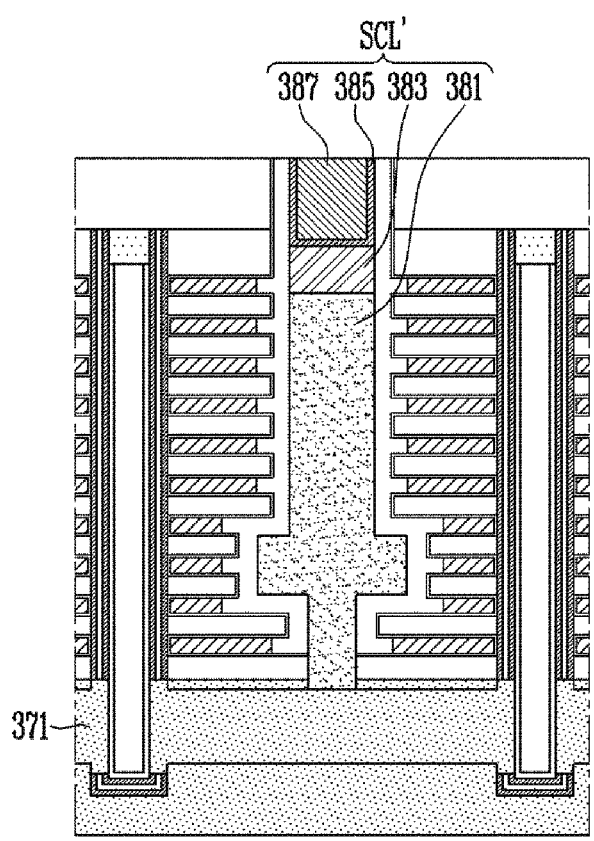

Referring to FIG. 19F, a source contact structure SCL' may be formed, which fills the slit SI' and the trench T, which are shown in FIG. 19E. The source contact structure SCL' may include a doped semiconductor layer 381 in contact with the channel connecting pattern 371. The doped semiconductor layer 381 may include a source dopant. In an embodiment, the doped semiconductor layer 381 may include an n-type doped silicon layer.

The source contact structure SCL' may further include a metal silicide layer 383, a metal barrier layer 385, and a metal layer 387. The metal silicide layer 383, the metal barrier layer 385, and the metal layer 387 may be formed by using the processes described with reference to FIG. 9B.

Figure 20:
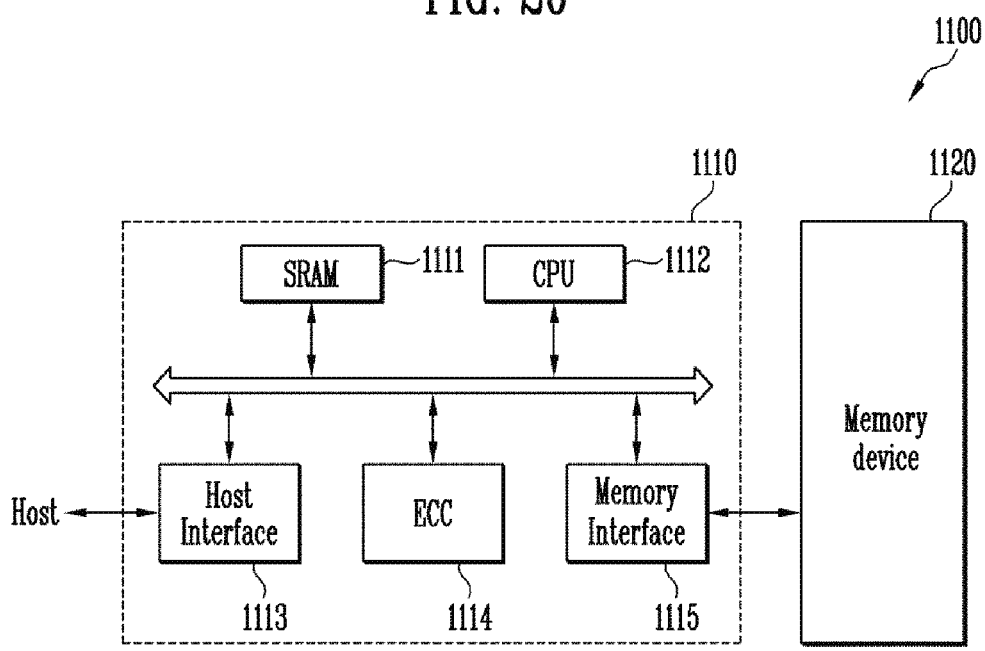
FIG. 20 shows a block diagram illustrating a configuration of a memory system according to an embodiment of the present disclosure.

FIG. 20 shows a block diagram illustrating a configuration of a memory system according to an embodiment of the present disclosure.

Referring to FIG. 20, the memory system 1100 according to the embodiment of the present disclosure includes a memory device 1120 and a memory controller 1110. The memory device 1120 may include at least one of the structures shown in FIGS. 1, 2A, 3, 4, 9B, 15C, 16, 17 and 18.

In an embodiment, the memory device 1120 may include a gate stack structure. The gate stack structure may comprise a first stack structure, a second stack structure, and a third stack structure, which are continuously stacked over a doped structure. The gate stack structure may comprise a groove formed in a sidewall of the gate stack structure. The groove may be defined between the first stack structure and the third stack structure.

In an embodiment, the memory device 1120 may include a first gate stack structure and a second gate stack structure, which face each other, channel patterns extending to penetrate the first gate stack structure and the second gate stack structure, memory patterns extending along outer walls of the channel patterns, and a source contact structure disposed between the first gate stack structure and the second gate stack structure. The source contact structure may include a vertical part extending in a first direction and horizontal protrusion parts protruding toward a sidewall of the first gate stack structure and a sidewall of the second gate stack structure from both sides of the vertical part.

The memory device 1120 may be a multi-chip package configured with a plurality of flash memory chips.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 21:
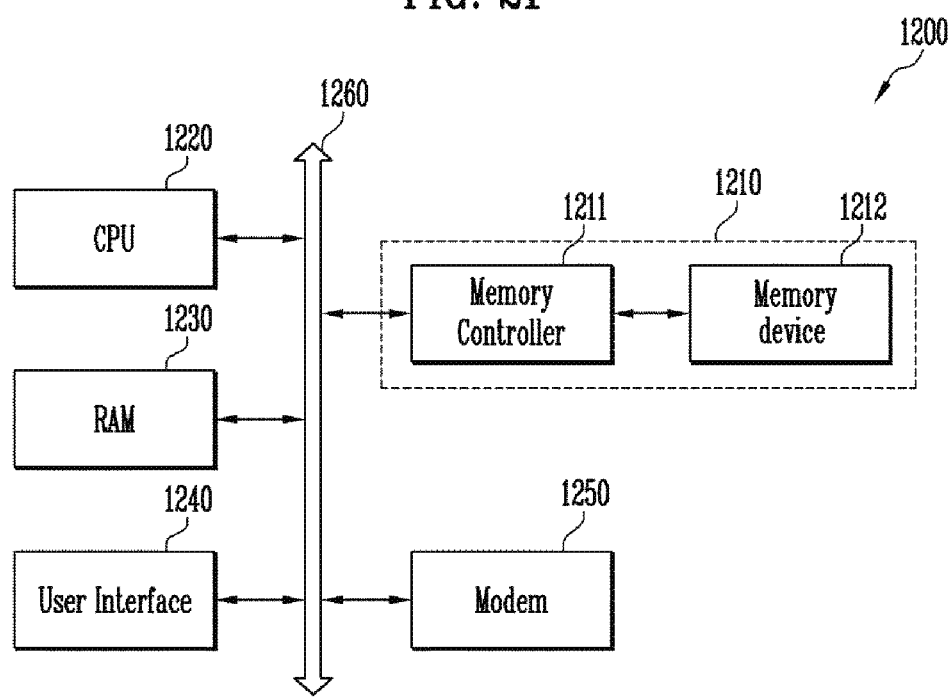
FIG. 21 shows a block diagram illustrating a configuration of a computing system according to an embodiment of the present disclosure.

FIG. 21 shows a block diagram illustrating a configuration of a computing system according to an embodiment of the present disclosure.

Referring to FIG. 21, the computing system 1200 according to the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor, a mobile DRAM, and the like may be further included.

The memory system 1210 may include a memory device 1212 and a memory controller 1211. The memory device 1212 and the memory controller 1211 may be configured in the same manner as those described with reference to FIG. 20.

Example embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with additional features, characteristics, and/or elements described in connection with other embodiments unless otherwise specifically indicated. Accordingly, it will be understood by those of skill in the art that various changes in form and detail may be made without departing from the spirit and scope of the present disclosure as set forth in the following claims.

What is claimed is:

1. A semiconductor device comprising:
   a doped structure;
   a gate stack structure comprising a first stack structure, a second stack structure, and a third stack structure, which are continuously stacked in a first direction over the doped structure, the gate stack structure comprising a groove formed in a sidewall of the gate stack structure, wherein the groove is defined between the first stack structure and the third stack structure, and wherein the first stack structure and the third stack structure protrude farther than the second stack structure in a second direction perpendicular to the first direction;
   a channel pattern penetrating the gate stack structure, wherein the gate stack structure extends from the sidewall of the gate stack structure in which the groove is formed toward the channel pattern; and
   a memory pattern extending along an outer wall of the channel pattern,
   wherein the groove has a first surface defined along the first stack structure and a second surface defined along the third stack structure, the first surface facing the second surface.

2. A semiconductor device comprising:
   a doped structure;
   a gate stack structure comprising a first stack structure, a second stack structure, and a third stack structure, which are continuously stacked in a first direction over the doped structure, the gate stack structure comprising a groove formed in a sidewall of the gate stack structure, wherein the groove is defined between the first stack structure and the third stack structure, and wherein the first stack structure and the third stack structure protrude farther than the second stack structure in a second direction perpendicular to the first direction;
   a channel pattern penetrating the gate stack structure, wherein the gate stack structure extends from the sidewall of the gate stack structure in which the groove is formed toward the channel pattern;
   a memory pattern extending along an outer wall of the channel pattern;
   a spacer insulating pattern formed on the sidewall of the gate stack structure; and
   a doped semiconductor pattern formed on the spacer insulating pattern, the doped semiconductor pattern including a source dopant,
   wherein the doped structure includes an n-type dopant or a p-type dopant.

3. A semiconductor device comprising:
   a source structure including a dopant;
   a gate stack structure comprising a first stack structure, a second stack structure, and a third stack structure, which are continuously stacked in a first direction over the source structure, the gate stack structure comprising a groove formed in a sidewall of the gate stack structure, wherein the groove is defined between the first stack structure and the third stack structure, and wherein the first stack structure and the third stack structure protrude farther than the second stack structure in a second direction perpendicular to the first direction;
   a channel pattern penetrating the gate stack structure, the channel pattern extending into the source structure, wherein the gate stack structure extends from the sidewall of the gate stack structure in which the groove is formed toward the channel pattern;
   a first memory pattern between the channel pattern and the gate stack structure; and
   a second memory pattern between the channel pattern and the source structure,
   wherein the source structure is in contact with a sidewall of the channel pattern between the first memory pattern and the second memory pattern.

4. The semiconductor device of claim 3, wherein the source structure comprises a first semiconductor layer, a second semiconductor layer, and a channel connecting pattern surrounding the sidewall of the channel pattern between the first semiconductor layer and the second semiconductor layer,
   wherein the first semiconductor layer surrounds the second memory pattern,
   wherein the second semiconductor layer extends along a bottom surface of the gate stack structure, and
   the channel connecting pattern extends between the first semiconductor layer and the channel pattern and between the second semiconductor layer and the channel pattern.

* * * * *